(12) United States Patent
Bhargava et al.

(10) Patent No.: US 12,086,453 B2
(45) Date of Patent: Sep. 10, 2024

(54) MEMORY FOR AN ARTIFICIAL NEURAL NETWORK ACCELERATOR

(71) Applicant: Arm Limited, Cambridge (GB)

(72) Inventors: Mudit Bhargava, Austin, TX (US); Paul Nicholas Whatmough, Cambridge, MA (US); Supreet Jeloka, Austin, TX (US); Zhi-Gang Liu, Westford, MA (US)

(73) Assignee: Arm Limited, Cambridge (GB)

( * ) Notice: Subject to any disclaimer, the term of this patent is extended or adjusted under 35 U.S.C. 154(b) by 961 days.

(21) Appl. No.: 17/103,632

(22) Filed: Nov. 24, 2020

(65) Prior Publication Data

US 2022/0164127 A1 May 26, 2022

(51) Int. Cl.
G11C 16/04 (2006.01)
G06F 3/06 (2006.01)
G06N 3/063 (2023.01)
G11C 11/54 (2006.01)

(52) U.S. Cl.
CPC .......... G06F 3/0655 (2013.01); G06F 3/0604 (2013.01); G06F 3/0679 (2013.01); G06N 3/063 (2013.01); G11C 11/54 (2013.01)

(58) Field of Classification Search
CPC ................. G11C 11/54; G06N 3/063
See application file for complete search history.

(56) References Cited

U.S. PATENT DOCUMENTS

| | | | | |
|---|---|---|---|---|
| 6,351,427 B1* | 2/2002 | Brown | ...................... | G11C 8/12 365/230.03 |
| 8,724,414 B2* | 5/2014 | Kim | ...................... | G11C 29/808 365/210.1 |
| 11,335,392 B2* | 5/2022 | Kwon | .................. | G11C 11/4085 |
| 2019/0354508 A1 | 11/2019 | Mahurin et al. | | |
| 2021/0096871 A1 | 4/2021 | Carlson | | |

OTHER PUBLICATIONS

Non-final Office Action for U.S. Appl. No. 17/103,629, mailed Feb. 18, 2022.
Jouppi et al., "In-Datacenter Performance Analysis of a Tensor Processing Unit," 44th International Symposium on Computer Architecture (ISCA), Toronto, Canada, Jun. 24-28, 2017.
Final Office Action for U.S. Appl. No. 17/103,629, mailed Apr. 19, 2022.

* cited by examiner

*Primary Examiner* — Pho M Luu
(74) *Attorney, Agent, or Firm* — Leveque Intellectual Property Law, P.C.

(57) ABSTRACT

A memory for an artificial neural network (ANN) accelerator is provided. The memory includes a first bank, a second bank and a bank selector. Each bank includes at least two word lines and a plurality of write word selectors. Each word line stores a plurality of words, and each word has a plurality of bytes. Each write word selector has an input port and a plurality of output ports, is coupled to a corresponding word in each word line, and is configured to select a byte of the corresponding word of a selected word line based on a byte select signal. The bank selector is coupled to the write word selectors of the first bank and the second bank, and configured to select a combination of write word selectors from at least one of the first bank and the second bank based on a bank select signal.

19 Claims, 17 Drawing Sheets

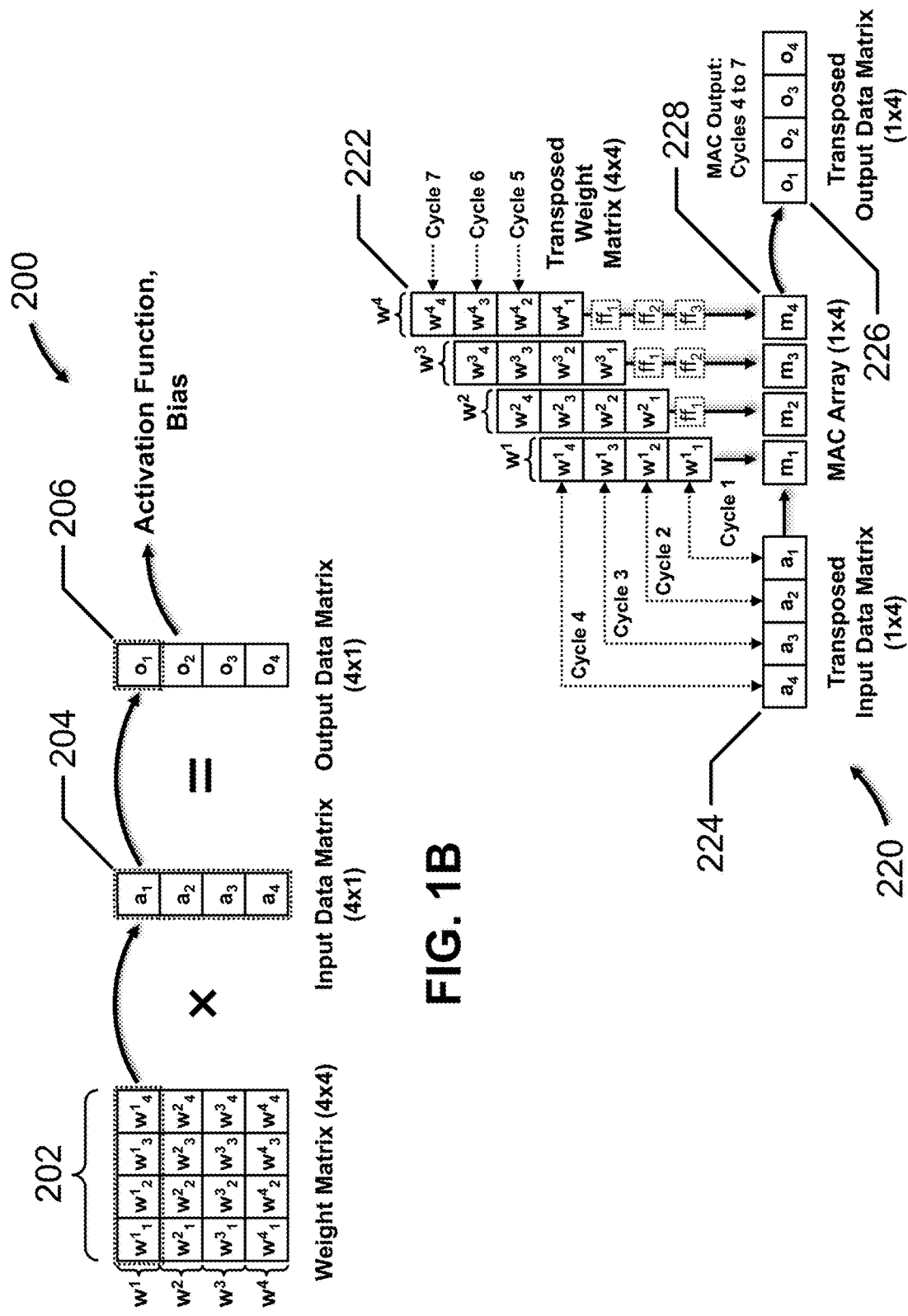

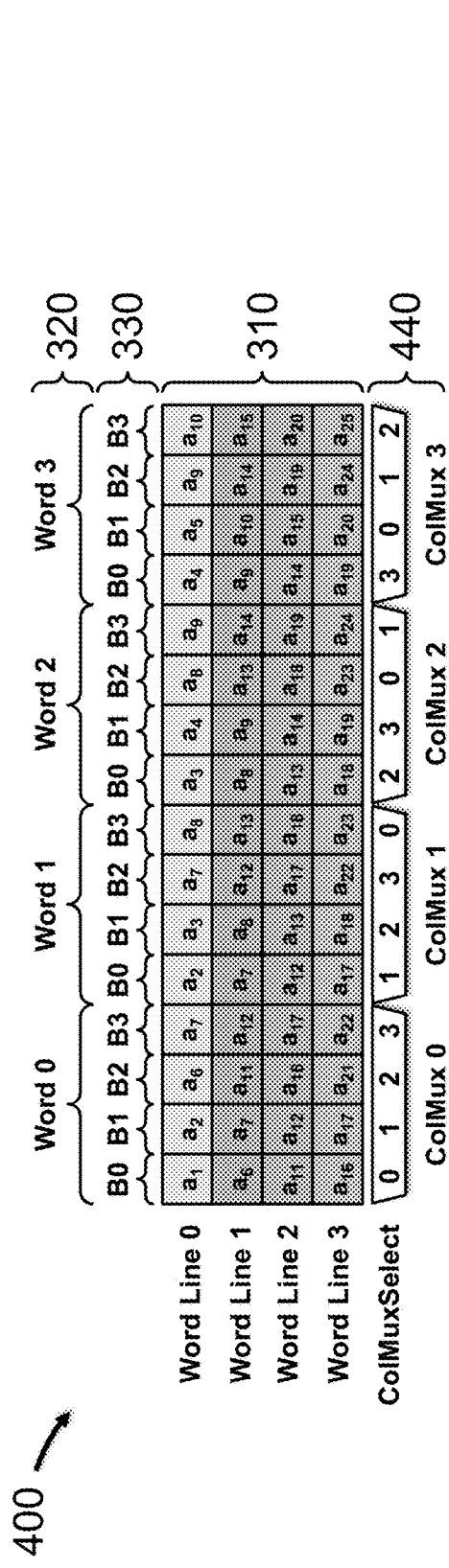
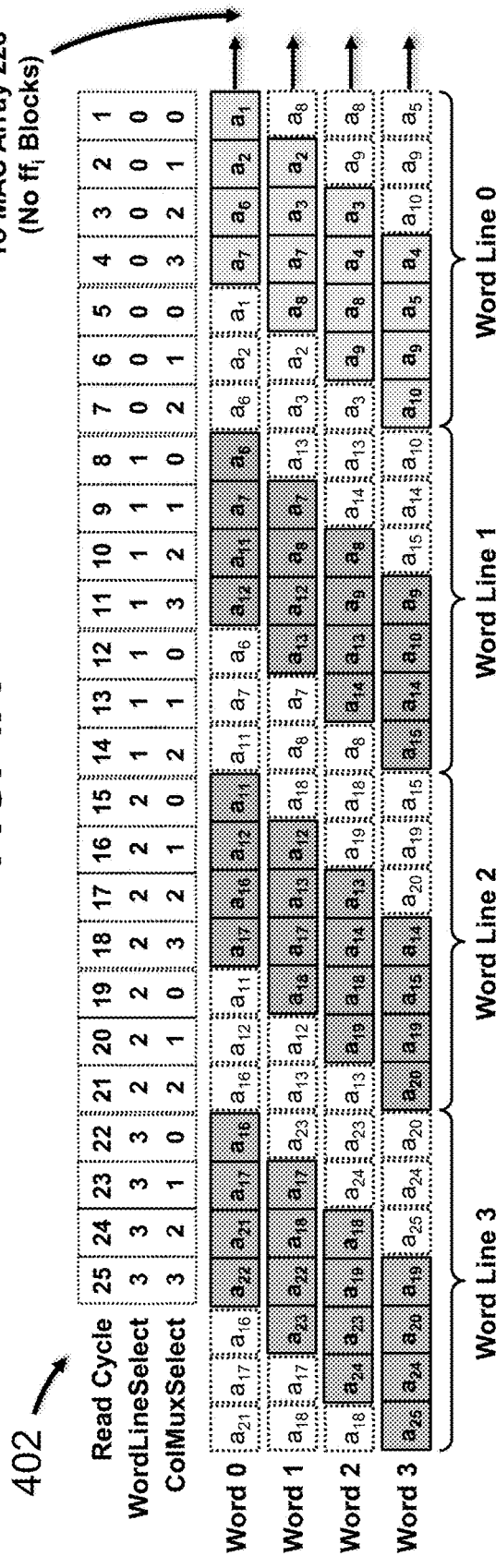
FIG. 4A
FIG. 4B

MEMORY FOR AN ARTIFICIAL NEURAL NETWORK ACCELERATOR

BACKGROUND

The present disclosure relates to computer systems. More particularly, the present disclosure relates to computer systems including artificial neural networks (ANNs).

ANNs, such as deep neural networks (DNNs), convolutional neural networks (CNNs), etc., are a popular solution to a wide array of challenging classification, recognition and regression problems. However, many ANNs require a large number of calculations involving a large number of filter weights and activations, which presents a significant challenge with respect to access, storage and performance, particularly for mobile and other power or storage-constrained devices. An ANN hardware accelerator accelerates these calculations, such as, for example, general matrix multiplication (GEMM) operations performed by DNNs, convolution operations performed by CNNs, etc.

CNNs typically do not perform native convolution operations due to the complicated dataflow and expensive datapaths that are required. Instead, native convolution operations are converted into GEMM operations, which are then executed more efficiently by a central processing unit (CPU), a specialized processor, an ANN accelerator that includes systolic multiply-and-accumulate (MAC) arrays, etc. For example, the filter weights and activations (i.e., input feature maps or IFMs) for a convolution layer of a CNN may be converted into an expanded format (e.g., IM2COL format), and then processed as GEMM operations by an ANN accelerator to generate output feature maps (OFMs). An activation or scaling function and a bias may be applied to the OFMs by the convolution layer or a separate activation layer, and then the OFMs are provided as the activations (i.e., IFMs) for the next layer of the CNN.

For correct data alignment, it is necessary to skew the frontier data vectors provided to the MAC arrays, which ensures that the correct operands coincide inside the pipelined array. This is achieved using a set of delay registers or flip-flop blocks, which cost power and circuit area proportional to the size of the MAC array. The cost of these delays is about $N^2-N$ flops for a square array of dimension N.

BRIEF DESCRIPTION OF THE DRAWINGS

FIG. 1B depicts a fully-connected layer calculation for a hidden layer of an ANN, in accordance with an embodiment of the present disclosure.

FIG. 1C depicts a data flow diagram for a MAC array, in accordance with an embodiment of the present disclosure.

FIG. 4A depicts a memory for an ANN accelerator, in accordance with an embodiment of the present disclosure.

FIG. 4B depicts a data flow diagram for a sequence of read operations from a memory of an ANN accelerator, in accordance with an embodiment of the present disclosure.

DETAILED DESCRIPTION

Figure 1A:
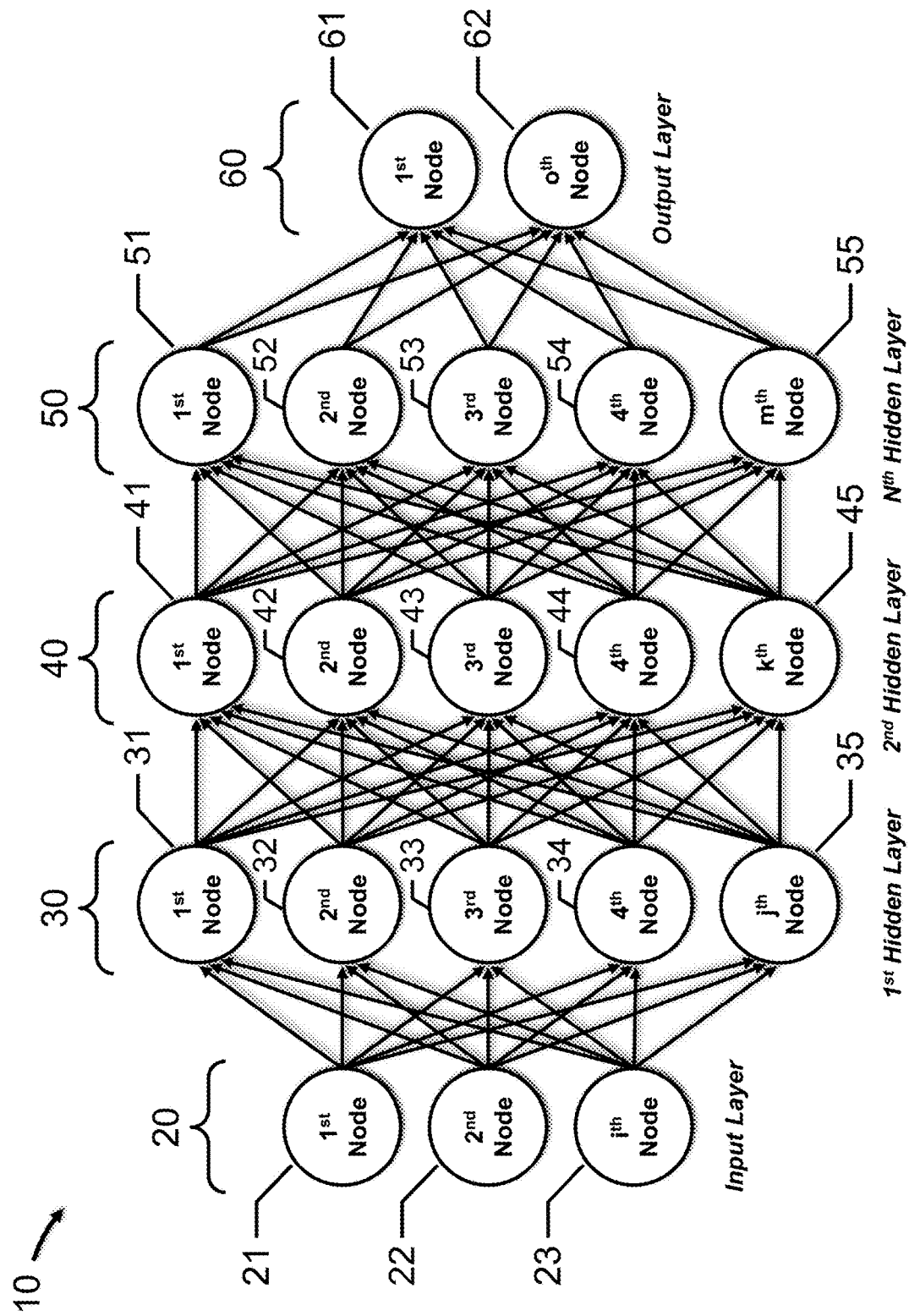
FIG. 1A depicts an ANN, in accordance with an embodiment of the present disclosure.

Embodiments of the present disclosure will now be described with reference to the drawing figures, in which like reference numerals refer to like parts throughout.

Embodiments of the present disclosure advantageously eliminate the delay registers or flip flop blocks in systolic MAC arrays by changing the way data is read from, or written to, the memory without adding complexity and area to SRAM memories.

In one embodiment, a memory for an ANN accelerator includes a first bank, a second bank and a bank selector. The first bank includes at least two word lines and a plurality of write word selectors, each word line stores a plurality of words, each word has a plurality of bytes, each write word selector has an input port and a plurality of output ports, each write word selector is coupled to a corresponding word in each word line, and each write word selector is configured to select a byte of the corresponding word of a selected word line based on a byte select signal. The second bank includes at least two word lines and a plurality of write word selectors, each word line stores a plurality of words, each word has a plurality of bytes, each write word selector has a plurality of input ports and an output port, each write word selector is coupled to a corresponding word in each word line, and each write word selector is configured to select a byte of the corresponding word of a selected word line based on the byte select signal. The bank selector is coupled to the inputs of the write word selectors of the first bank and the inputs of the write word selectors of the second bank, and is configured to select a combination of write word selectors from at least one of the first bank and the second bank based on a bank select signal.

An ANN models the relationships between input data or signals and output data or signals using a network of interconnected nodes that is trained through a learning process. The nodes are arranged into various layers, including, for example, an input layer, one or more hidden layers, and an output layer. The input layer receives input data, such as, for example, image data, and the output layer generates output data, such as, for example, a probability that the image data contains a known object. Each hidden layer provides at least a partial transformation of the input data to the output data. A DNN has multiple hidden layers in order to model complex, nonlinear relationships between input data and output data.

In a fully-connected, feedforward ANN, each node is connected to all of the nodes in the preceding layer, as well as to all of the nodes in the subsequent layer. For example, each input layer node is connected to each hidden layer node, each hidden layer node is connected to each input layer node and each output layer node, and each output layer node is connected to each hidden layer node. Additional hidden layers are similarly interconnected. Each connection has a weight value, and each node has an activation function, such as, for example, a linear function, a step function, a sigmoid function, a tanh function, a rectified linear unit (ReLU) function, etc., that determines the output of the node based on the weighted sum of the inputs to the node. The input data propagates from the input layer nodes, through respective connection weights to the hidden layer nodes, and then through respective connection weights to the output layer nodes.

More particularly, at each input node, input data is provided to the activation function for that node, and the output of the activation function is then provided as an input data value to each hidden layer node. At each hidden layer node, the input data value received from each input layer node is multiplied by a respective connection weight, and the resulting products are summed or accumulated into an activation value that is provided to the activation function for that node. The output of the activation function is then provided as an input data value to each output layer node. At each output layer node, the output data value received from each hidden layer node is multiplied by a respective connection weight, and the resulting products are summed or accumulated into an activation value that is provided to the activation function for that node. The output of the activation function is then provided as output data. Additional hidden layers may be similarly configured to process data.

A multi-layer perceptron (MLP) is an ANN that has an input layer, an output layer and one or more hidden layers. MLPs may be used for natural language processing applications, such as machine translation, speech recognition, etc. Other ANNs include recurrent neural networks (RNNs), long short-term memories (LSTMs), sequence-to-sequence models that include an encoder RNN and a decoder RNN, shallow neural networks, etc.

A CNN is a variation of an MLP that may be used for classification or recognition applications, such as image recognition, speech recognition, etc. A CNN has an input layer, an output layer and multiple hidden layers including convolutional layers, pooling layers, normalization layers, fully-connected layers, etc. Each convolutional layer applies a sliding dot product or cross-correlation to an input volume, applies an activation function to the results, and then provides the activation or output volume to the next layer. Convolutional layers typically use the ReLU function as the activation function. In certain embodiments, the activation function is provided in a separate activation layer, such as, for example, a ReLU layer. A pooling layer reduces the dimensions of the output volume received from the preceding convolutional layer, and may calculate an average or a maximum over small clusters of data, such as, for example, 2×2 matrices. In certain embodiments, a convolutional layer and a pooling layer may form a single layer of a CNN. The fully-connected layers follow the convolutional and pooling layers, and include a flatten layer and a classification layer, followed by a normalization layer that includes a normalization function, such as the SoftMax function. The output layer follows the last fully-connected layer; in certain embodiments, the output layer may include the normalization function.

FIG. 1A depicts ANN 10, in accordance with an embodiment of the present disclosure.

ANN 10 includes input layer 20, one or more hidden layers 30, 40, 50, etc., and output layer 60. Input layer 20 includes one or more input nodes 21, 22, 23, etc. Hidden layer 30 includes one or more hidden nodes 31, 32, 33, 34, 35, etc. Hidden layer 40 includes one or more hidden nodes 41, 42, 43, 44, 45, etc. Hidden layer 50 includes one or more hidden nodes 51, 52, 53, 54, 55, etc. Output layer 60 includes one or more output nodes 61, 62, etc. Generally, ANN 10 includes N hidden layers, input layer 20 includes "i" nodes, hidden layer 30 includes "j" nodes, hidden layer 40 includes "k" nodes, hidden layer 50 includes "m" nodes, and output layer 60 includes "o" nodes. Many variations of input, hidden and output layers are clearly possible, including hidden layers that are locally-connected, rather than fully-connected, to one another.

Training an ANN includes optimizing the connection weights between nodes by minimizing the prediction error of the output data until the ANN achieves a particular level of accuracy. One method is backpropagation, or backward propagation of errors, which iteratively and recursively determines a gradient descent with respect to the connection weights, and then adjusts the connection weights to improve the performance of the network.

FIG. 1B depicts a fully-connected layer calculation 200 for hidden layer 40 of ANN 10, in accordance with an embodiment of the present disclosure.

In this embodiment, ANN 10 includes input layer 20, hidden layers 30, 40 and 50, and output layer 60. Input layer 20 includes two input nodes, input nodes 21 and 22, hidden layer 30 includes four hidden nodes i.e., hidden nodes 31, 32, 33 and 34, hidden layer 40 includes four hidden nodes i.e., hidden nodes 41, 42, 43 and 44, hidden layer 50 includes four hidden nodes i.e., hidden nodes 51, 52, 53 and 54, and output layer 60 includes one output node, i.e., output node 61. Input nodes 21 and 22 are connected to, and send data to, hidden nodes 41, 42, 43 and 44, and output node 61 is connected to, and receives data from, hidden nodes 51, 52, 53 and 54. While the fully-connected layer calculation 200 for hidden layer 40 is discussed below, the same principles apply to the fully-connected layer calculations for hidden layers 30 and 50.

Hidden node 41 is connected to, and receives input data from, hidden nodes 31, 32, 33 and 34 of hidden layer 30, hidden node 42 is connected to, and receives input data from, hidden nodes 31, 32, 33 and 34 of hidden layer 30, hidden node 43 is connected to, and receives input data from, hidden nodes 31, 32, 33 and 34 of hidden layer 30, and hidden node 44 is connected to, and receives input data from, hidden nodes 31, 32, 33 and 34 of hidden layer 30. Hidden node 41 is connected to, and sends output data to, hidden nodes 51, 52, 53 and 54 of hidden layer 50, hidden node 42 is connected to, and sends output data to, hidden nodes 51, 52, 53 and 54 of hidden layer 50, hidden node 43 is connected to, and sends output data to, hidden nodes 51, 52, 53 and 54 of hidden layer 50, and hidden node 44 is connected to, and sends output data to, hidden nodes 51, 52, 53 and 54 of hidden layer 50.

Each hidden node 41, 42, 43 and 44 has a weight associated with each input connection. For hidden node 41, weight $w^1_1$ is associated with the input connection with hidden node 31, weight $w^1_2$ is associated with the input connection with hidden node 32, weight $w^1_3$ is associated with the input connection with hidden node 33, and weight $w^1_4$ is associated with the input connection with hidden node 34. For hidden node 42, weight $w^2_1$ is associated with the input connection with hidden node 31, weight $w^2_2$ is associated with the input connection with hidden node 32, weight $w^2_3$ is associated with the input connection with hidden node 33, and weight $w^2_4$ is associated with the input connection with hidden node 34. For hidden node 43, weight $w^3_1$ is associated with the input connection with hidden node 31, weight $w^3_2$ is associated with the input connection with hidden node 32, weight $w^3_3$ is associated with the input connection with hidden node 33, and weight $w^3_4$ is associated with the input connection with hidden node 34. For hidden node 44, weight $w^4_1$ is associated with the input connection with hidden node 31, weight $w^4_2$ is associated with the input connection with hidden node 32, weight $w^4_3$ is associated with the input connection with hidden node 33, and weight $w^4_4$ is associated with the input connection with hidden node 34. Weights $w^1_1, w^1_2, w^1_3$ and $w^1_4$ form weight set $w_1$, weights $w^2_1, w^2_2, w^2_3$ and $w^2_4$ form weight set $w_2$, weights $w^3_1, w^3_2, w^3_3$ and $w^3_4$ form weight set $w_3$, and weights $w^4_1, w^4_2, w^4_3$ and $w^4_4$ form weight set $w_4$.

Weight sets $w_1, w_2, w_3$ and $w_4$ may be formed into weight matrix 202, input data received from hidden layer 30 may be formed into IFM or converted input data matrix 204, and OFM or converted output data matrix 206 may be sent as output data to hidden layer 50. Fully-connected layer calculation 200 multiplies weight matrix 202 (4×4) by input data matrix 204 (4×1) to generate output data matrix 206 (4×1). An activation function and a bias may be applied to each element of converted output data matrix 206, which are then output to hidden layer 50 as an IFM or input data matrix. An activation function and bias may be applied after each element of output data matrix 206 has been calculated, or, alternatively, after all of the elements of converted output data matrix 206 have been calculated.

To multiply weight matrix 202 and input data matrix 204, a dot product is calculated for each weight matrix 202 row and input data matrix 204 column pair. Weight matrix 202 includes four rows, and input data matrix 204 includes a single column. Generally, for each element $o_i$ of output data matrix 206, a dot product of the $i^{th}$ row of weight matrix 202 and the single column of input data matrix 204 is calculated by multiplying each element $w_{i,j}$ of the $i^{th}$ row of weight matrix 202 with a corresponding element $a_j$ of the single column of input data matrix 204 to generate an intermediate product, and accumulating the intermediate products into element $o_i$ of output data matrix 206.

As depicted in FIG. 1B, the dot product for element $o_1$ of output data matrix 206 is calculated using the first row of weight matrix 202 and the single column of input data matrix 204, i.e., $o_1$ is equal to $w^1_1 \cdot a_1 + w^1_2 \cdot a_2 + w^1_3 \cdot a_3 + w^1_4 \cdot a_4$. Similarly, the dot product for element $o_2$ of output data matrix 206 is calculated using the second row of weight matrix 202 and the single column of input data matrix 204, i.e., $o_2$ is equal to $w^2_1 \cdot a_1 + w^2_2 \cdot a_2 + w^2_3 \cdot a_3 + w^2_4 \cdot a_4$, the dot product for element $o_3$ of output data matrix 206 is calculated using the third row of weight matrix 202 and the single column of input data matrix 204, i.e., $o_3$ is equal to $w^3_1 \cdot a_1 + w^3_2 \cdot a_2 + w^3_3 \cdot a_3 + w^3_4 \cdot a_4$, and the dot product for element $o_4$ of output data matrix 206 is calculated using the fourth row of weight matrix 202 and the single column of input data matrix 204, i.e., $o_4$ is equal to $w^4_1 \cdot a_1 + w^4_2 \cdot a_2 + w^4_3 \cdot a_3 + w^4_4 \cdot a_4$.

In one embodiment, the fully-connected layer calculations for ANNs executing on central processor units (CPUs), graphics processing units (GPUs), etc., may be implemented as generic matrix multiplication (GEMM) operations, which may leverage GEMM-optimized software libraries, or, alternatively, which may be implemented in a dedicated ANN hardware accelerator using an array of MAC units.

FIG. 1C depicts a data flow diagram 220 for MAC array 228, in accordance with an embodiment of the present disclosure.

As noted above, GEMM operations may be implemented in a dedicated ANN hardware accelerator using an array of MAC units. In this embodiment, MAC array 228 is a systolic, output stationary array that implements fully-connected layer calculation 200 using a single row of four MAC units $m_1, m_2, m_3$ and $m_4$. The orientation of transposed weight matrix 222, transposed input data matrix 224, and transposed output data matrix 226 relative to MAC array 228 simplifies illustration; other orientations are also contemplated. Each row of transposed weight matrix 222 corresponds to a column of weight matrix 202, the single row of transposed input data matrix 224 corresponds to the single column of input data matrix 204, and the single row of transposed output data matrix 226 corresponds to the single column of output data matrix 206.

Generally, elements from input data matrix 204 are read from local memory, enter MAC array 228 at left-edge MAC unit $m_1$, and propagate one MAC unit to the right at the beginning of each processing cycle. Similarly, elements from weight matrix 202 are read from local memory, and enter MAC array 228 at MAC units $m_1, m_2, m_3$ and $m_4$.

Each MAC unit calculates a dot product, between a row of weight matrix 202 and the single column of input data matrix 204, to generate an element of output data matrix 206. Generally, a MAC unit includes, inter alia, a multiplier, an adder and a storage register. Each MAC unit is reset by clearing or zeroing its storage register prior to, or at the start of, a new dot product calculation.

MAC unit $m_1$ calculates the dot product of the first row of weight matrix 202 (i.e., weight set $w^1$) and the first (and only) column of input data matrix 204 to generate element $o_1$ of output data matrix 206. During the first processing cycle, MAC unit $m_1$ receives $a_1$ and $w^1_1$ from local memory, multiplies $a_1$ and $w^1_1$ to generate an intermediate product, adds the intermediate product to the value stored in the storage register (i.e., 0), and stores the accumulated result back in the storage register. During the second processing cycle, MAC unit $m_1$ transmits $a_1$ to MAC unit $m_2$, receives $a_2$ and $w^1_2$ from local memory, multiplies $a_2$ and $w^1_2$ to generate an intermediate product, adds the intermediate product to the value stored in the storage register, and stores the accumulated result back in the storage register.

During the third processing cycle, MAC unit $m_1$ transmits $a_2$ to MAC unit $m_2$, receives $a_3$ and $w^1_3$ from local memory, multiplies $a_3$ and $w^1_3$ to generate an intermediate product, adds the intermediate product to the value stored in the storage register, and stores the accumulated result back in the storage register. During the fourth processing cycle, MAC unit $m_1$ transmits $a_3$ to MAC unit $m_2$, receives $a_4$ and $w^1_4$ from the local memory, multiplies $a_4$ and $w^1_4$ to generate an intermediate product, adds the intermediate product to the value stored in the storage register, stores the accumulated result back in the storage register, and then outputs the value stored in the storage register as element $o_1$. During the fifth processing cycle, MAC unit $m_1$ transmits $a_4$ to MAC unit $m_2$, and then waits for the next sequence of operations to begin.

MAC unit $m_2$ calculates the dot product of the second row of weight matrix 202 (i.e., weight set $w^2$) and the first (and only) column of input data matrix 204 to generate element $o_2$ of output data matrix 206. During the first processing cycle, $w^2_1$ is read from local memory and stored in a delay register or flip flop block ("$ff_1$"). MAC unit $m_2$ does not receive any data because $a_1$ is not yet available from MAC unit $m_1$, and $w^2_1$ has been stored in the delay register $ff_1$. During the second processing cycle, MAC unit $m_2$ receives $a_1$ from MAC unit $m_1$ and $w^2_1$ from the delay register $ff_1$; $w^2_2$ is read from local memory and stored in the delay register $ff_1$ after $w^2_1$ has been accessed. MAC unit $m_2$ multiplies $a_1$ and $w^2_1$ to generate an intermediate product, adds the intermediate product to the value stored in the storage register (i.e., 0), and stores the accumulated result back in the storage register. During the third processing cycle, MAC unit $m_2$ transmits $a_1$ to MAC unit $m_3$, receives $a_2$ from MAC unit $m_1$, and receives $w^2_2$ from the delay register $ff_1$; $w^2_3$ is read from local memory and stored in the delay register $ff_1$ after $w^2_2$ has been accessed. MAC unit $m_2$ multiplies $a_2$ and $w^2_2$ to generate an intermediate product, adds the intermediate product to the value stored in the storage register, and stores the accumulated result back in the storage register.

During the fourth processing cycle, MAC unit $m_2$ transmits $a_2$ to MAC unit $m_3$, receives $a_3$ from MAC unit $m_1$, and receives $w^2_3$ from the delay register $ff_1$; $w^2_4$ is read from local memory and stored in the delay register after $w^2_3$ has been accessed. MAC unit $m_2$ multiplies $a_3$ and $w^2_3$ to generate an intermediate product, adds the intermediate product to the value stored in the storage register, and stores the accumulated result back in the storage register. During the fifth processing cycle, MAC unit $m_2$ transmits $a_3$ to MAC unit $m_3$, receives $a_4$ from MAC unit $m_1$, and receives $w^2_4$ from the delay register $ff_1$. MAC unit $m_2$ multiplies $a_4$ and $w^2_4$ to generate an intermediate product, adds the intermediate product to the value stored in the storage register, stores the accumulated result back in the storage register, and then outputs the value stored in the storage register as element $o_2$. During the sixth processing cycle, MAC unit $m_2$ transmits $a_4$ to MAC unit $m_3$, and then waits for the next sequence of operations to begin.

MAC unit $m_3$ calculates the dot product of the third row of weight matrix 202 (i.e., weight set $w^3$) and the first (and only) column of input data matrix 204 to generate element $o_3$ of output data matrix 206. During the first processing cycle, $w^3_1$ is read from local memory and stored in a first delay register $ff_1$. MAC unit $m_3$ does not receive any data because $a_1$ is not yet available from MAC unit $m_2$, and $w^3_1$ has been stored in the first delay register $ff_1$. During the second processing cycle, $w^3_1$ is transferred from the first delay register $ff_1$ to a second delay register $ff_2$, and $w^3_2$ is then read from local memory and stored in the first delay register $ff_1$. MAC unit $m_3$ does not receive any data because $a_1$ is not yet available from MAC unit $m_2$, and $w^3_1$ has been stored in the second delay register $ff_2$. During the third processing cycle, MAC unit $m_3$ receives $a_1$ from MAC unit $m_2$ and $w^3_1$ from the second delay register $ff_2$; $w^3_2$ is transferred from the first delay register $ff_1$ to the second delay register $ff_2$ after $w^3_1$ has been accessed, and $w^3_3$ is then read from local memory and stored in the first delay register $ff_1$. MAC unit $m_3$ multiplies $a_1$ and $w^3_1$ to generate an intermediate product, adds the intermediate product to the value stored in the storage register (i.e., 0), and stores the accumulated result back in the storage register.

During the fourth processing cycle, MAC unit $m_3$ transmits $a_1$ to MAC unit $m_4$, receives $a_2$ from MAC unit $m_2$, and receives $w^3_2$ from the second delay register $ff_2$; $w^3_3$ is transferred to the second delay register $ff_2$ after $w^3_2$ has been accessed, and $w^3_4$ is then read from local memory and stored in the first delay register $ff_1$. MAC unit $m_3$ multiplies $a_2$ and $w^3_2$ to generate an intermediate product, adds the intermediate product to the value stored in the storage register, and stores the accumulated result back in the storage register. During the fifth processing cycle, MAC unit $m_3$ transmits $a_2$ to MAC unit $m_4$, receives $a_3$ from MAC unit $m_2$, and receives $w^3_3$ from the second delay register $ff_2$; $w^3_4$ is transferred to the second delay register $ff_2$ after $w^3_3$ has been accessed. MAC unit $m_3$ multiplies $a_3$ and $w^3_3$ to generate an intermediate product, adds the intermediate product to the value stored in the storage register, and stores the accumulated result back in the storage register. During the sixth processing cycle, MAC unit $m_3$ transmits $a_3$ to MAC unit $m_4$, receives $a_4$ from MAC unit $m_2$, and receives $w^3_4$ from the second delay register $ff_2$. MAC unit $m_3$ multiplies $a_4$ and $w^3_4$ to generate an intermediate product, adds the intermediate product to the value stored in the storage register, stores the accumulated result back in the storage register, and then outputs the value stored in the storage register as element $o_3$. During the seventh processing cycle, MAC unit $m_3$ transmits $a_4$ to MAC unit $m_4$, and then waits for the next sequence of operations to begin.

MAC unit $m_4$ calculates the dot product of the fourth row of weight matrix 202 (i.e., weight set $w^4$) and the first (and only) column of input data matrix 204 to generate element $o_4$ of output data matrix 206. During the first processing cycle, $w^4_1$ is read from local memory and stored in a first delay register $ff_1$, and MAC unit $m_4$ does not receive any data because $a_1$ is not yet available from MAC unit $m_3$, and $w^4_1$ has been stored in the first delay register $ff_1$. During the second processing cycle, $w^4_1$ is transferred from the first delay register $ff_1$ to a second delay register $ff_2$, $w^4_2$ is then read from local memory and stored in the first delay register $ff_1$, and MAC unit $m_4$ does not receive any data because $a_1$ is not yet available from MAC unit $m_3$, and $w^4_1$ has been stored in the second delay register $ff_2$. During the third processing cycle, $w^4_1$ is transferred from the second delay register $ff_2$ to a third delay register $ff_3$, $w^4_2$ is transferred from the first delay register $ff_1$ to the second delay register $ff_2$, $w^4_3$ is then read from local memory and stored in the first delay register $ff_1$, and MAC unit $m_4$ does not receive any data because $a_1$ is not yet available from MAC unit $m_3$, and $w^4_1$ has been stored in the third delay register $ff_3$.

During the fourth processing cycle, MAC unit $m_4$ receives $a_1$ from MAC unit $m_3$ and $w^4_1$ from the third delay register $ff_3$; $w^4_2$ is transferred from the second delay register $ff_2$ to the third delay register $ff_3$ after $w^4_1$ has been accessed, $w^4_3$ is transferred from the first delay register $ff_1$ to the second delay register $ff_2$, and $w^4_4$ is read from local memory and stored in the first delay register $ff_1$. MAC unit $m_4$ multiplies $a_1$ and $w^4_1$ to generate an intermediate product, adds the intermediate product to the value stored in the storage register (i.e., 0), and stores the accumulated result back in the storage register.

During the fifth processing cycle, MAC unit $m_4$ receives $a_2$ from MAC unit $m_3$, and receives $w^4_2$ from the third delay register $ff_3$; $w^4_3$ is transferred from the second delay register $ff_2$ to the third delay register $ff_3$ after $w^4_2$ has been accessed, and $w^4_4$ is transferred from the first delay register $ff_1$ to the second delay register $ff_2$. MAC unit $m_4$ multiplies $a_2$ and $w^4_2$ to generate an intermediate product, adds the intermediate product to the value stored in the storage register, and stores the accumulated result back in the storage register. During the sixth processing cycle, MAC unit $m_4$ receives $a_3$ from MAC unit $m_3$, and receives $w^4_3$ from the third delay register $ff_3$; $w^4_4$ is transferred from the second delay register $ff_2$ to the third delay register $ff_3$ after $w^3_3$ has been accessed. MAC unit $m_4$ multiplies $a_3$ and $w^4_3$ to generate an intermediate product, adds the intermediate product to the value stored in the storage register, and stores the accumulated result back in the storage register. During the seventh processing cycle, MAC unit $m_4$ receives $a_4$ from MAC unit $m_3$, and receives $w^3_4$ from the third delay register $ff_3$. MAC unit $m_4$ multiplies $a_4$ and $w^4_4$ to generate an intermediate product, adds the intermediate product to the value stored in the storage register, stores the accumulated result back in the storage register, and then outputs the value stored in the storage register as element $o_4$. During the eighth processing cycle, MAC unit $m_3$ waits for the next sequence of operations to begin.

Each column of weight matrix 202 (i.e., each row of transposed weight matrix 222) is read during a single processing cycle. The first column of weight matrix 202, i.e., $w^1_1$, $w^2_1$, $w^3_1$ and $w^4_1$, is read during the first processing cycle; $w^1_1$ is provided to MAC unit $m_1$, $w^2_1$ is provided to the first delay register for MAC unit $m_2$, $w^3_1$ is provided to the first delay register for MAC unit $m_3$, and $w^4_1$ is provided to the first delay register for MAC unit $m_4$. Similarly, the second column of weight matrix 202, i.e., $w^1_2$, $w^2_2$, $w^3_2$ and $w^4_2$, is read during the second processing cycle; $w^1_2$ is provided to MAC unit $m_1$, $w^2_2$ is provided to the first delay register for MAC unit $m_2$, $w^3_2$ is provided to the first delay register for MAC unit $m_3$, and $w^4_2$ is provided to the first delay register for MAC unit $m_4$. The third column of weight matrix 202, i.e., $w^1_3$, $w^2_3$, $w^3_3$ and $w^4_3$, is read during the third processing cycle; $w^1_3$ is provided to MAC unit $m_1$, $w^2_3$ is provided to the first delay register for MAC unit $m_2$, $w^3_3$ is provided to the first delay register for MAC unit $m_3$, and $w^4_3$ is provided to the first delay register for MAC unit $m_4$. And, the fourth column of weight matrix 202, i.e., $w^1_4$, $w^2_4$, $w^3_4$ and $w^4_4$, is read during the fourth processing cycle; $w^1_4$ is provided to MAC unit $m_1$, $w^2_4$ is provided to the first delay register for MAC unit $m_2$, $w^3_4$ is provided to the first delay register for MAC unit $m_3$, and $w^4_4$ is provided to the first delay register for MAC unit $m_4$.

Figure 2A:
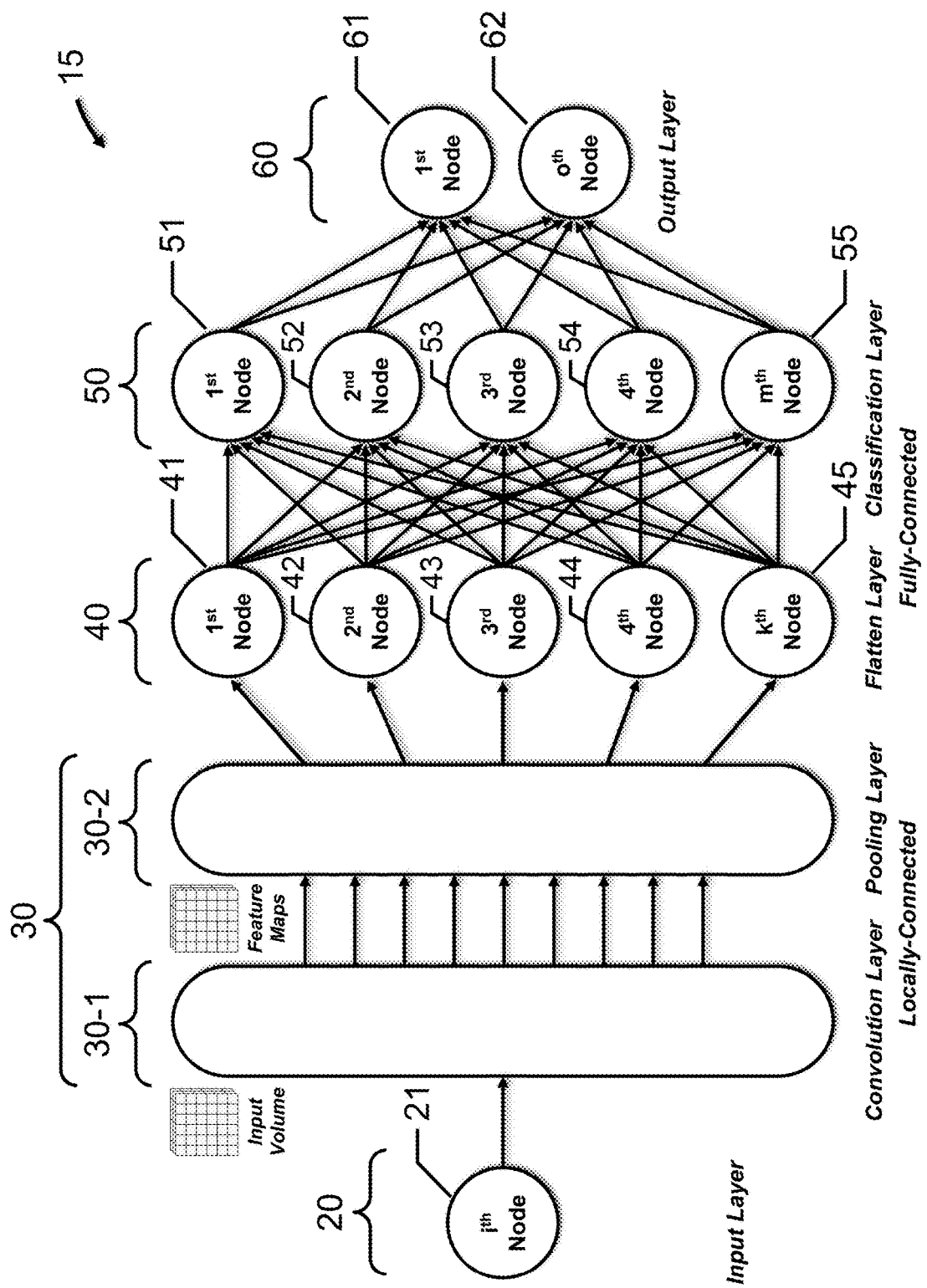
FIG. 2A depicts a CNN, in accordance with an embodiment of the present disclosure.

FIG. 2A depicts CNN 15, in accordance with an embodiment of the present disclosure. CNN 15 includes input layer 20, one or more hidden layers, such as convolutional layer 30-1, pooling layer 30-2, hidden (flatten) layer 40, hidden (classification) layer 50, etc., and output layer 60. Many other variations of input, hidden and output layers are contemplated.

Input layer 20 includes one or more input nodes 21, etc., that present the input data, such as a color image, as an input volume to the first convolutional layer, e.g., convolutional layer 30-1. The input volume is a three-dimensional matrix that has a width, a height and a depth. For example, input data that represent a color image may be presented as an input volume that is 512 pixels×512 pixels×3 channels (red, green, blue); other input volume dimensions may also be used, such as 32×32×3, 64×64×3, 128×128×3, etc., 32×32×1, 64×64×1, 128×128×1, 512×512×1, etc.

Convolutional layer 30-1 is locally-connected to input layer 20, and includes a plurality of nodes that are connected to local regions in the input volume (not depicted for clarity). For a CNN that uses a standard convolution, each node computes a dot product between the node's weights and the respective local region of the input volume to generate one element of an output volume. An activation function and a bias may be applied to each element of the output volume, and the output volume is then provided as the input volume to the next layer. The activation function and bias may be applied by each convolutional layer node or by the nodes of a subsequent locally-connected layer, such as an ReLU layer.

Pooling layer 30-2 is locally-connected to convolutional layer 30-1, and includes a plurality of nodes that are connected to local regions in the input volume (not depicted for clarity). Pooling layer 30-2 also produces an output volume that is provided as the input volume to the subsequent layer, such as, for example, another convolutional layer 30-1, a flatten layer 40, etc. In certain embodiments, convolutional layer 30-1 and pooling layer 30-2 form a single hidden layer 30. Similarly, in certain embodiments, convolutional layer 30-1, a ReLU layer and pooling layer 30-2 form a single hidden layer 30. Generally, the output volumes of the convolutional and pooling layers may be described as output feature maps, and one or more single hidden layers 30 form a feature learning portion of CNN 15.

Hidden layer 40 is a "flatten" layer that is locally-connected to pooling layer 30-2, and includes one or more hidden (flatten) nodes 41, 42, 43, 44, 45, etc. Hidden (flatten) layer 40 "flattens" the output volume produced by the preceding pooling layer 30-2 into a column vector, which is provided to the subsequent, fully-connected hidden layer 50.

Hidden layer 50 is a classification layer that is fully-connected to hidden (flatten) layer 40, and includes one or more hidden (classification) nodes 51, 52, 53, 54, 55, etc.

Output layer 60 includes one or more output nodes 61, 62, etc., and is fully-connected to hidden (classification) layer 50. Fully-connected output layer 60 receives the classification results output by hidden (classification) layer 50, and each node outputs a predicted class score. A normalization function, such as a Softmax function, may be applied to the predicted class scores by output layer 60, or, alternatively, by an additional layer interposed between hidden (classification) layer 50 and output layer 60.

Similar to ANNs, training a CNN includes optimizing the connection weights between nodes by minimizing the prediction error of the output data until the CNN achieves a particular level of accuracy. As noted above, backpropagation may be used to iteratively and recursively determines a gradient descent with respect to the connection weights, and then adjusts the connection weights to improve the performance of the network. Matrix multiplication operations, and, more particularly, MAC operations, are used extensively by CNNs, as well as other ANNs.

Figure 2B:
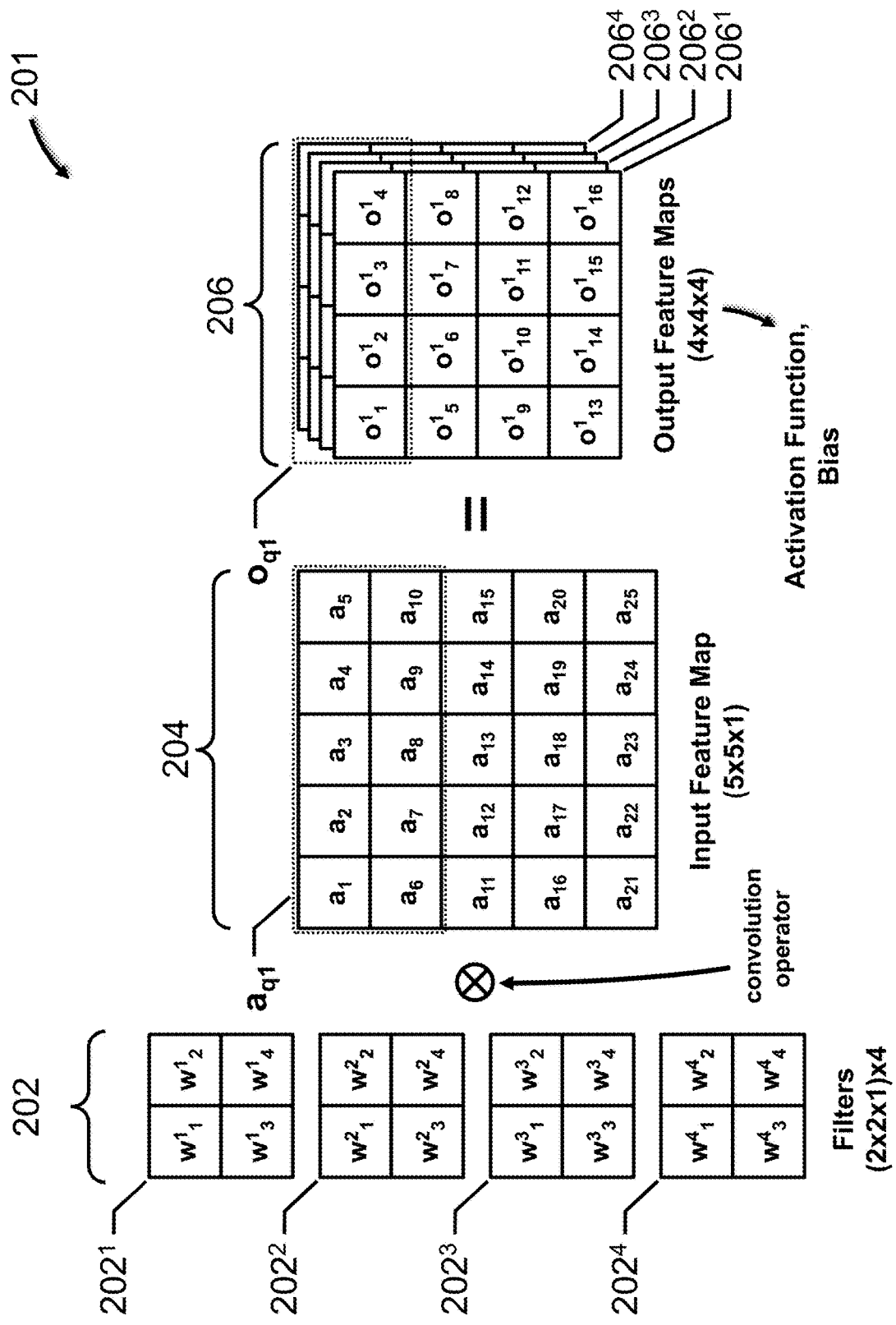
FIG. 2B depicts a convolution operation within a convolutional layer of a CNN, in accordance with an embodiment of the present disclosure.

FIG. 2B depicts convolution layer operation 201 within convolutional layer 30-1 of CNN 15, in accordance with an embodiment of the present disclosure.

A convolutional layer generally includes M filters, C input channels, C input feature maps (i.e., one input feature map for each input channel) and M output feature maps (i.e., one output feature map for each filter). Each filter has C weight sets (i.e., each filter has a weight set for each input channel), and is convolved across the input feature maps to produce an output feature map corresponding to that filter. Convolutional layers generally require the movement of large amounts of data, generate a significant computational load, and require buffers of considerable size to store intermediate values.

In this embodiment, convolutional layer 30-1 includes four weight matrices or filters 202, i.e., filter $202^1$, $202^2$, $202^3$ and $202^4$, one input channel, one input feature map 204 and four output feature maps 206, i.e., $206^1$, $206^2$, $206^3$ and $206^4$. Each filter 202 is convolved across input feature map 204 to produce an output feature map 206 corresponding to that filter, i.e., output feature map $206^1$ corresponds to filter $202^1$, output feature map $206^2$ corresponds to filter $202^2$, output feature map $206^3$ corresponds to filter $202^3$, and output feature map $206^4$ corresponds to filter $202^4$. For illustration purposes, each filter $202^1$, $202^2$, $202^3$ and $202^4$ is a 2×2×1 weight matrix, input feature map 204 is a 5×5×1 input data matrix, and each output feature map $206^1$, $206^2$, $206^3$ and $206^4$ is a 4×4 output data matrix. In this embodiment, with a stride of 1 and no padding, the total number of MAC operations performed by convolution layer operation 201 is (2×2×1)×(4×4)×4 or 256.

For ease of discussion, input feature map 204 may be divided into four overlapping portions or quadrants. The first quadrant (i.e., $a_{q1}$) includes the first and second rows, i.e., $a_1$ to $a_5$ and $a_6$ to $a_{10}$, the second quadrant (not shown for clarity) includes the second and third rows, i.e., $a_6$ to $a_{10}$ and $a_{11}$ to $a_{15}$, the third quadrant (not shown for clarity) includes the third and fourth rows, i.e., $a_{11}$ to $a_{15}$ and $a_{16}$ to $a_{20}$, and the fourth quadrant (not shown for clarity) includes the fourth and fifth rows, i.e., $a_{16}$ to $a_{20}$ and $a_{21}$ to $a_{25}$.

Similarly, output feature maps 206 may be divided into four, three dimensional portions or quadrants. The first quadrant (i.e., $o_{q1}$) includes the first row of each output feature map $206^1$, $206^2$, $206^3$ and $206^4$, i.e., $o^1_1$, $o^1_2$, $o^1_3$, $o^1_4$, $o^2_1$, $o^2_2$, $o^2_3$, $o^2_4$, $o^3_1$, $o^3_2$, $o^3_3$, $o^3_4$, $o^4_1$, $o^4_2$, $o^4_3$ and $o^4_4$. The second quadrant (not shown for clarity) includes the second row of each output feature map $206^1$, $206^2$, $206^3$ and $206^4$, i.e., $o^1_5$, $o^1_6$, $o^1_7$, $o^1_8$, $o^2_5$, $o^2_6$, $o^2_7$, $o^2_8$, $o^3_5$, $o^3_6$, $o^3_7$, $o^3_8$, $o^4_5$, $o^4_6$, $o^4_7$ and $o^4_8$. The third quadrant (not shown for clarity) includes the third row of each output feature map $206^1$, $206^2$, $206^3$ and $206^4$, i.e., $o^1_9$, $o^1_{10}$, $o^1_{11}$, $o^1_{12}$, $o^2_9$, $o^2_{10}$, $o^2_{11}$, $o^2_{12}$, $o^3_9$, $o^3_{10}$, $o^3_{11}$, $o^3_{12}$, $o^4_9$, $o^4_{10}$, $o^4_{11}$, and $o^4_{12}$. The fourth quadrant (not shown for clarity) includes the fourth row of each output feature map $206^1$, $206^2$, $206^3$ and $206^4$, i.e., $o^1_{13}$, $o^1_{14}$, $o^1_{15}$, $o^1_{16}$, $o^2_{13}$, $o^2_{14}$, $o^2_{15}$, $o^2_{16}$, $o^3_{13}$, $o^3_{14}$, $o^3_{15}$, $o^3_{16}$, $o^4_{13}$, $o^4_{14}$, $o^4_{15}$, and $o^4_{16}$.

The convolution operations performed on the first quadrant (i.e., $a_{q1}$) of input feature map 204 are now discussed in detail.

For output feature map $206^1$, element $o^1_1$ is the dot product of filter $202^1$ and the first block (i.e., $a_1$, $a_2$, $a_6$ and $a_7$) of the first quadrant $a_{q1}$ of input feature map 204, element $o^1_2$ is the dot product of filter $202^1$ and the second block (i.e., $a_2$, $a_3$, $a_7$ and $a_8$) of the first quadrant $a_{q1}$ of input feature map 204, element $o^1_3$ is the dot product of filter $202^1$ and the third block (i.e., $a_3$, $a_4$, $a_8$ and $a_9$) of the first quadrant $a_{q1}$ of input feature map 204, and $o^1_4$ is the dot product of filter $202^1$ and the fourth block (i.e., $a_4$, $a_5$, $a_9$ and $a_{10}$) of the first quadrant $a_{q1}$ of input feature map 204.

More particularly, the dot product of filter $202^1$ and the first block of the first quadrant $a_{q1}$ is equal to $w^1_1 \cdot a_1 + w^1_2 \cdot a_2 + w^1_3 \cdot a_6 + w^1_4 \cdot a_7$. The dot product of filter $202^1$ and the second block of the first quadrant $a_{q1}$ is equal to $w^1_1 \cdot a_2 + w^1_2 \cdot a_3 + w^1_3 \cdot a_7 + w^1_4 \cdot a_8$. The dot product of filter $202^1$ and the third block of the first quadrant $a_{q1}$ is equal to $w^1_1 \cdot a_3 + w^1_2 \cdot a_4 + w^1_3 \cdot a_8 + w^1_4 \cdot a_9$. The dot product of filter $202^1$ and the fourth block of the first quadrant $a_{q1}$ is equal to $w^1_1 \cdot a_4 + w^1_2 \cdot a_5 + w^1_3 \cdot a_9 + w^1_4 \cdot a_{10}$.

For output feature map $206^2$, element $o^2_1$ is the dot product of filter $202^2$ and the first block (i.e., $a_1$, $a_2$, $a_6$ and $a_7$) of the first quadrant $a_{q1}$ of input feature map 204, output feature map element $o^2_2$ is the dot product of filter $202^2$ and the second block (i.e., $a_2$, $a_3$, $a_7$ and $a_8$) of the first quadrant $a_{q1}$ of input feature map 204, output feature map element $o^2_3$ is the dot product of filter $202^2$ and the third block (i.e., $a_3$, $a_4$, $a_8$ and $a_9$) of the first quadrant $a_{q1}$ of input feature map 204, and output feature map element $o^2_4$ is the dot product of filter $202^2$ and the fourth block (i.e., $a_4$, $a_5$, $a_9$ and $a_{10}$) of the first quadrant $a_{q1}$ of input feature map 204.

More particularly, the dot product of filter $202^2$ and the first block of the first quadrant $a_{q1}$ is equal to $w^2_1 \cdot a_1 + w^2_2 \cdot a_2 + w^2_3 \cdot a_6 + w^2_4 \cdot a_7$. The dot product of filter $202^2$ and the second block of the first quadrant $a_{q1}$ is equal to $w^2_1 \cdot a_2 + w^2_2 \cdot a_3 + w^2_3 \cdot a_7 + w^2_4 \cdot a_8$. The dot product of filter $202^2$ and the third block of the first quadrant $a_{q1}$ is equal to $w^2_1 \cdot a_3 + w^2_2 \cdot a_4 + w^2_3 \cdot a_8 + w^2_4 \cdot a_9$. The dot product of filter $202^2$ and the fourth block of the first quadrant $a_{q1}$ is equal to $w^2_1 \cdot a_4 + w^2_2 \cdot a_5 + w^2_3 \cdot a_9 + w^2_4 \cdot a_{10}$.

For output feature map $206^3$, element $o^3_1$ is the dot product of filter $202^3$ and the first block (i.e., $a_1$, $a_2$, $a_6$ and $a_7$) of the first quadrant $a_{q1}$ of input feature map 204, output feature map element $o^3_2$ is the dot product of filter $202^3$ and the second block (i.e., $a_2$, $a_3$, $a_7$ and $a_8$) of the first quadrant $a_{q1}$ of input feature map 204, output feature map element $o^3_3$ is the dot product of filter $202^3$ and the third block (i.e., $a_3$, $a_4$, $a_8$ and $a_9$) of the first quadrant $a_{q1}$ of input feature map 204, and output feature map element $o^3_4$ is the dot product of filter $202^3$ and the fourth block (i.e., $a_4$, $a_5$, $a_9$ and $a_{10}$) of the first quadrant $a_{q1}$ of input feature map 204.

More particularly, the dot product of filter $202^3$ and the first block of the first quadrant $a_{q1}$ is equal to $w^3_1 \cdot a_1 + w^3_2 \cdot a_2 + w^3_3 \cdot a_6 + w^3_4 \cdot a_7$. The dot product of filter $202^3$ and the second block of the first quadrant $a_{q1}$ is equal to $w^3_1 \cdot a_2 + w^3_2 \cdot a_3 + w^3_3 \cdot a_7 + w^3_4 \cdot a_8$. The dot product of filter $202^3$ and the third block of the first quadrant $a_{q1}$ is equal to $w^3_1 \cdot a_3 + w^3_2 \cdot a_4 + w^3_3 \cdot a_8 + w^3_4 \cdot a_9$. The dot product of filter $202^3$ and the fourth block of the first quadrant $a_{q1}$ is equal to $w^3_1 \cdot a_4 + w^3_2 \cdot a_5 + w^3_3 \cdot a_9 + w^3_4 \cdot a_{10}$.

For output feature map $206^4$, element $o^4_1$ is the dot product of filter $202^4$ and the first block (i.e., $a_1$, $a_2$, $a_6$ and $a_7$) of the first quadrant $a_{q1}$ of input feature map 204, output feature map element $o^4_2$ is the dot product of filter $202^4$ and the second block (i.e., $a_2$, $a_3$, $a_7$ and $a_8$) of the first quadrant $a_{q1}$ of input feature map 204, output feature map element $o^4_3$ is the dot product of filter $202^4$ and the third block (i.e., $a_3$, $a_4$, $a_8$ and $a_9$) of the first quadrant $a_{q1}$ of input feature map 204, and output feature map element $o^4_4$ is the dot product of filter $202^4$ and the fourth block (i.e., $a_4$, $a_5$, $a_9$ and $a_{10}$) of the first quadrant $a_{q1}$ of input feature map 204.

More particularly, the dot product of filter $202^4$ and the first block of the first quadrant $a_{q1}$ is equal to $w^4_1 \cdot a_1 + w^4_2 \cdot a_2 + w^4_3 \cdot a_6 + w^4_4 \cdot a_7$. The dot product of filter $202^4$ and the second block of the first quadrant $a_{q1}$ is equal to $w^4_1 \cdot a_2 + w^4_2 \cdot a_3 + w^4_3 \cdot a_7 + w^4_4 \cdot a_8$. The dot product of filter $202^4$ and the third block of the first quadrant $a_{q1}$ is equal to $w^4_1 \cdot a_3 + w^4_2 \cdot a_4 + w^4_3 \cdot a_8 + w^4_4 \cdot a_9$. The dot product of filter $202^4$ and the fourth block of the first quadrant $a_{q1}$ is equal to $w^4_1 \cdot a_4 + w^4_2 \cdot a_5 + w^4_3 \cdot a_9 + w^4_4 \cdot a_{10}$.

The convolution operations performed on the remaining three quadrants of input feature map 204 are done in the same manner. The second quadrant of input feature map 204 also includes four blocks, i.e., the first block of includes $a_6$, $a_7$, $a_{11}$ and $a_{12}$, the second block includes $a_7$, $a_8$, $a_{12}$ and $a_{13}$, the third block includes $a_8$, $a_9$, $a_{13}$ and $a_{14}$, and the fourth block includes $a_9$, $a_{10}$, $a_{14}$ and $a_{15}$. The third quadrant of input feature map 204 also includes four blocks, i.e., the first block of includes $a_{11}$, $a_{12}$, $a_{16}$ and $a_{17}$, the second block includes $a_{12}$, $a_{13}$, $a_{17}$ and $a_{18}$, the third block includes $a_{13}$, $a_{14}$, $a_{18}$ and $a_{19}$, and the fourth block includes $a_{14}$, $a_{15}$, $a_{19}$ and $a_{20}$. The fourth quadrant of input feature map 204 also includes four blocks, i.e., the first block of includes $a_{16}$, $a_{17}$, $a_{21}$ and $a_{22}$, the second block includes $a_{17}$, $a_{18}$, $a_{22}$ and $a_{23}$, the third block includes $a_{18}$, $a_{19}$, $a_{23}$ and $a_{24}$, and the fourth block includes $a_{19}$, $a_{20}$, $a_{24}$ and $a_{25}$.

For the second quadrant of output feature map $206^1$, element $o^1_5$ is the dot product of filter $202^1$ and the first block of the second quadrant of input feature map 204, element $o^1_6$ is the dot product of filter $202^1$ and the second block of the second quadrant of input feature map 204, element $o^1_7$ is the dot product of filter $202^1$ and the third block of the second quadrant of input feature map 204, and element $o^1_8$ is the dot product of filter $202^1$ and the fourth block of the second quadrant of input feature map 204. For the second quadrant of output feature map $206^2$, elements $o^2_5$, $o^2_6$, $o^2_7$, and $o^2_8$ are calculated in the same manner using filter $202^2$. For the second quadrant of output feature map $206^3$, elements $o^3_5$, $o^3_6$, $o^3_7$, and $o^3_8$ are calculated in the same manner using filter $202^3$. For the second quadrant of output feature map $206^4$, elements $o^4_5$, $o^4_6$, $o^4_7$, and $o^4_8$ are calculated in the same manner using filter $202^4$.

For the third quadrant of output feature map $206^1$, element $o^1_9$ is the dot product of filter $202^1$ and the first block of the third quadrant of input feature map 204, element $o^1_{10}$ is the dot product of filter $202^1$ and the second block of the third quadrant of input feature map 204, element $o^1_{11}$ is the dot product of filter $202^1$ and the third block of the third quadrant of input feature map 204, and element $o^1_{12}$ is the dot product of filter $202^1$ and the fourth block of the third quadrant of input feature map 204. For the third quadrant of output feature map $206^2$, elements $o^2_9$, $o^2_{10}$, $o^2_{11}$, and $o^2_{12}$ are calculated in the same manner using filter $202^2$. For the third quadrant of output feature map $206^3$, elements $o^3_9$, $o^3_{10}$, $o^3_{11}$, and $o^3_{12}$ are calculated in the same manner using filter $202^3$. For the third quadrant of output feature map $206^4$, elements $o^4_9$, $o^4_{10}$, $o^4_{11}$, and $o^4_{12}$ are calculated in the same manner using filter $202^4$.

For the fourth quadrant of output feature map $206^1$, element $o^1_{13}$ is the dot product of filter $202^1$ and the first block of the fourth quadrant of input feature map 204, element $o^1_{14}$ is the dot product of filter $202^1$ and the second block of the fourth quadrant of input feature map 204, element $o^1_{15}$ is the dot product of filter $202^1$ and the third block of the fourth quadrant of input feature map 204, and element $o^1_{16}$ is the dot product of filter $202^1$ and the fourth block of the fourth quadrant of input feature map 204. For the fourth quadrant of output feature map $206^2$, elements $o^2_{13}$, $o^2_{14}$, $o^2_{15}$, and $o^2_{16}$ are calculated in the same manner using filter $202^2$. For the fourth quadrant of output feature map $206^3$, elements $o^3_{13}$, $o^3_{14}$, $o^3_{15}$, and $o^3_{16}$ are calculated in the same manner using filter $202^3$. For the fourth quadrant of output feature map $206^4$, elements $o^4_{13}$, $o^4_{14}$, $o^4_{15}$, and $o^4_{16}$ are calculated in the same manner using filter $202^4$.

An activation function and a bias may be applied to each element of output feature maps 206, which are then provided as the input feature maps 204 to the next layer. An activation function and bias may be applied after each element of output feature maps 206 is calculated, after all of the elements of output feature maps 206 are calculated, or by a subsequent locally-connected layer, such as an ReLU layer.

Similar to the fully-connected layer calculations for ANNs, convolution operations may be recast as generic matrix multiplication (GEMM) operations, and implemented in an ANN hardware accelerator using an array of MAC units. The filter weights and activations (i.e., input feature maps or IFMs) for the convolution operation are converted into an expanded format (e.g., IM2COL format), and then processed as GEMM operations by the ANN hardware accelerator to generate output feature maps (OFMs).

Figure 2C:
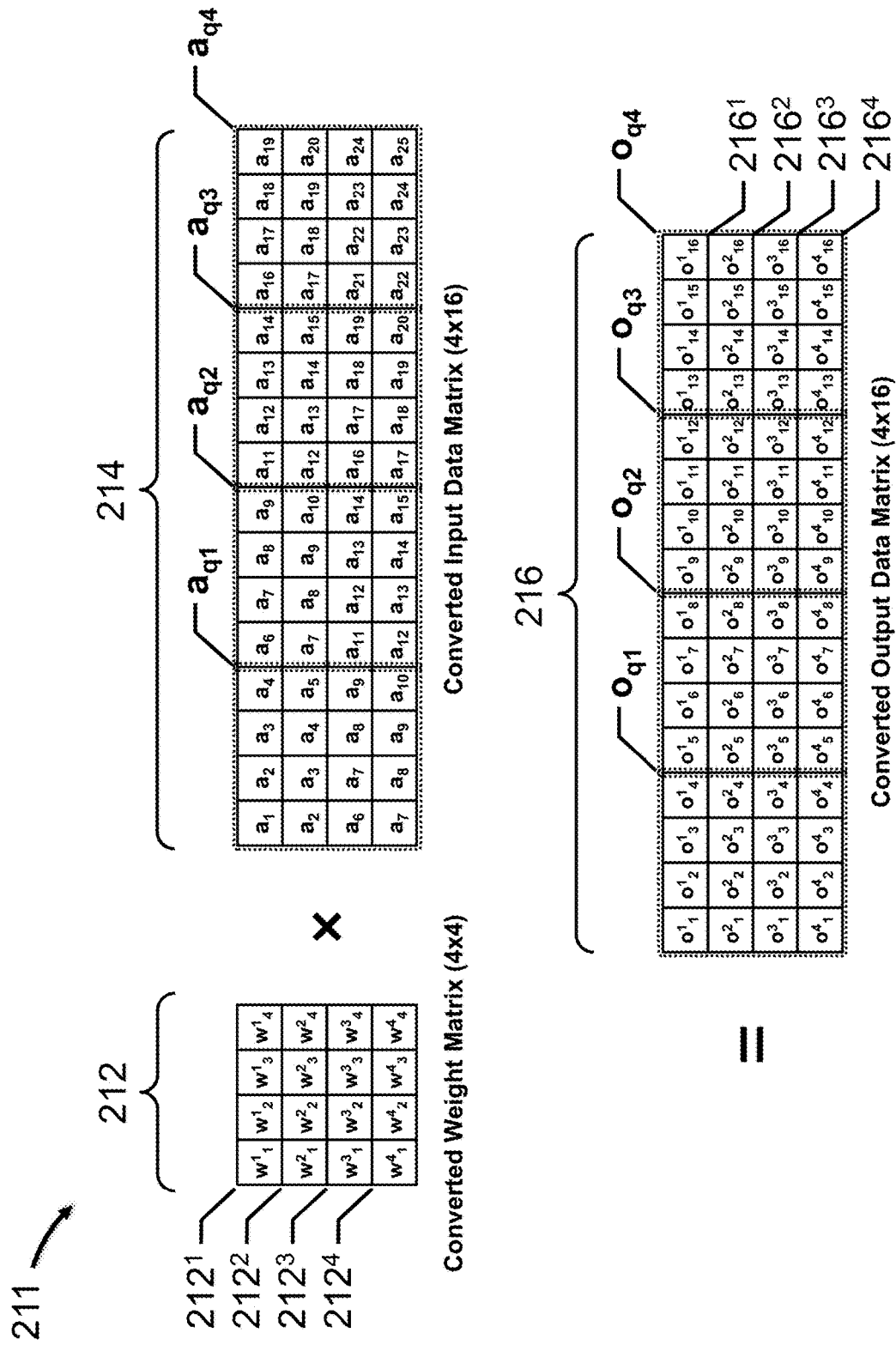
FIG. 2C depicts a converted convolutional operation for a CNN, in accordance with an embodiment of the present disclosure.

FIG. 2C depicts a converted convolutional operation 211 within convolutional layer 30-1 of CNN 15, in accordance with an embodiment of the present disclosure.

In this embodiment, convolution layer operation 201 has been converted into a simple matrix multiplication operation by converting filter 202 into converted weight matrix 212, input feature map 204 into converted input data matrix 214, and output feature maps 206 into converted output data matrix 216. Converted weight matrix 212 (4×4) and converted input data matrix 214 (4×16) are multiplied to generate converted output data matrix 216 (4×16), which includes output data sets $216^1$, $216^2$, $216^3$ and $216^4$ (each 1×16). Output data sets $216^1$, $216^2$, $216^3$ and $216^4$ are then reformed into output feature maps $206^1$, $206^2$, $206^3$ and $206^4$ (each 4×4), respectively.

Converted weight matrix 212 includes converted weight sets $212^1$, $212^2$, $212^3$ and $212^4$. Converted weight set $212^1$ includes the elements of filter $202^1$, i.e., $w^1_1$, $w^1_2$, $w^1_3$ and $w^1_4$ arranged in a single (first) row. Converted weight set $212^2$ includes the elements of filter $202^2$, i.e., $w^2_1$, $w^2_2$, $w^2_3$ and $w^2_4$ arranged in a single (second) row. Converted weight set $212^3$ includes the elements of filter $202^3$, i.e., $w^3_1$, $w^3_2$, $w^3_3$ and $w^3_4$ arranged in a single (third) row. Converted weight set $212^4$ includes the elements of filter $202^4$, i.e., $w^4_1$, $w^4_2$, $w^4_3$ and $w^4_4$ arranged in a single (fourth) row.

Converted input data matrix 214 includes the elements of input feature map 204 recast as a larger matrix that implements the convolution operation as a simple matrix multiplication operation. Due to the mechanics of the convolution operation (discussed above), certain elements of input feature map 204 are duplicated once, twice or three times to generate converted output data matrix 216. Generally, each row of converted weight matrix 212 is a filter, each column of converted input data matrix 214 is a block of input data upon which each filter operates, and each dot product calculation, i.e., the multiplication of each row by each column, generates a different element of converted output data matrix 216.

For ease of discussion, converted input data matrix 214 may be divided into four portions or quadrants, i.e., $a_{q1}$, $a_{q2}$, $a_{q3}$ and $a_{q4}$, and converted output data matrix 216 may be divided into four portions or quadrants, i.e., $o_{q1}$, $o_{q2}$, $o_{q3}$ and $o_{q4}$.

The first quadrant $a_{q1}$ of converted input data matrix 214 includes the four blocks of the first quadrant of input feature map 204, each block arranged as a column. Similarly, the second quadrant $a_{q2}$ of converted input data matrix 214 includes the four blocks of the second quadrant of input feature map 204, each block arranged as a column. The third quadrant $a_{q3}$ of converted input data matrix 214 includes the four blocks of the third quadrant of input feature map 204, each block arranged as a column. And, the fourth quadrant $a_{q4}$ of converted input data matrix 214 includes the four blocks of the fourth quadrant of input feature map 204, each block arranged as a column.

More particularly, the first column of the first quadrant $a_{q1}$ of converted input data matrix 214 includes elements $a_1$, $a_2$, $a_6$ and $a_7$, which are the same elements in the same sequence (i.e., row-major order) as the first block of the first quadrant of input feature map 204. The second column of the first quadrant $a_{q1}$ of converted input data matrix 214 includes elements $a_2$, $a_3$, $a_7$ and $a_8$, which are the same elements in the same sequence (i.e., row-major order) as the second block of the first quadrant of input feature map 204. The third column of the first quadrant $a_{q1}$ of converted input data matrix 214 includes elements $a_3$, $a_4$, $a_8$ and $a_9$, which are the same elements in the same sequence (i.e., row-major order) as the third block of the first quadrant of input feature map 204. The fourth column of the first quadrant $a_{q1}$ of converted input data matrix 214 includes elements $a_4$, $a_5$, $a_9$ and $a_{10}$, which are the same elements in the same sequence (i.e., row-major order) as the fourth block of the first quadrant of input feature map 204. And so on for quadrants $a_{q2}$, $a_{q3}$ and $a_{q4}$ of converted input data matrix 214.

The first row of the first quadrant $o_{q1}$ of converted output data matrix 216 includes elements $o^1_1$, $o^1_2$, $o^1_3$ and $o^1_4$, which are the same elements in the same sequence as the first row of the first quadrant of output feature map $206^1$. The second row of the first quadrant ow of converted output data matrix 216 includes elements $o^2_1$, $o^2_2$, $o^2_3$ and $o^2_4$, which are the same elements in the same sequence as the first row of the first quadrant of output feature map $206^2$. The third row of the first quadrant ow of converted output data matrix 216 includes elements $o^3_1$, $o^3_2$, $o^3_3$ and $o^3_4$, which are the same elements in the same sequence as the first row of the first quadrant of output feature map $206^3$. The fourth row of the first quadrant $o_{q1}$ of converted output data matrix 216 includes elements $o^4_1$, $o^4_2$, $o^4_3$ and $o^4_4$, which are the same elements in the same sequence as the first row of the first quadrant of output feature map $206^4$. And so on for quadrants $o_{q2}$, $o_{q3}$ and $o_{q4}$ of converted output data matrix 216.

To generate the first quadrant $o_{q1}$ of converted output data matrix 216, converted weight matrix 212 is multiplied by the first quadrant $a_{q1}$ of converted input data matrix 214. For the first row of the first quadrant $o_{q1}$, element $o^1_1$ is the dot product of the first row of converted weight matrix 212 and the first column of converted input data matrix 214, i.e., $o^1_1$ is equal to $w^1_1 \cdot a_1 + w^1_2 \cdot a_2 + w^1_3 \cdot a_6 + w^1_4 \cdot a_7$. Element $o^1_2$ is the dot product of the first row of converted weight matrix 212 and the second column of converted input data matrix 214, i.e., $o^1_2$ is equal to $w^1_1 \cdot a_2 + w^1_2 \cdot a_3 + w^1_3 \cdot a_7 + w^1_4 \cdot a_8$. Element $o^1_3$ is the dot product of the first row of converted weight matrix 212 and the third column of converted input data matrix 214, i.e., $o^1_3$ is equal to $w^1_1 \cdot a_3 + w^1_2 \cdot a_4 + w^1_3 \cdot a_8 + w^1_4 \cdot a_9$. Element $o^1_4$ is the dot product of the first row of converted weight matrix 212 and the fourth column of converted input data matrix 214, i.e., $o^1_4$ is equal to $w^1_1 \cdot a_4 + w^1_2 \cdot a_5 + w^1_3 \cdot a_9 + w^1_4 \cdot a_{10}$. The elements of the second, third and fourth rows the first quadrant ow of converted output data matrix 216, i.e., elements $o^2_1$, $o^2_2$, $o^2_3$, $o^2_4$, $o^3_1$, $o^3_2$, $o^3_3$, $o^3_4$, $o^4_1$, $o^4_2$, $o^4_3$ and $o^4_4$, are calculated in the same manner using the second, third and fourth rows of converted weight matrix 212, respectively.

To generate the second quadrant $o_{q2}$ of converted output data matrix 216, converted weight matrix 212 is multiplied by the second quadrant $a_{q2}$ of converted input data matrix 214. For the first row of the second quadrant $o_{q2}$, element $o^1_5$ is the dot product of the first row of converted weight matrix 212 and the fifth column of converted input data matrix 214, i.e., $o^1_5$ is equal to $w^1_1 \cdot a_6 + w^1_2 \cdot a_7 + w^1_3 \cdot a_{11} + w^1_4 \cdot a_{12}$. Element $o^1_6$ is the dot product of the first row of converted weight matrix 212 and the sixth column of converted input data matrix 214, i.e., $o^1_6$ is equal to $w^1_1 \cdot a_7 + w^1_2 \cdot a_8 + w^1_3 \cdot a_{12} + w^1_4 \cdot a_{13}$. Element $o^1_7$ is the dot product of the first row of converted weight matrix 212 and the seventh column of converted input data matrix 214, i.e., $o^1_7$ is equal to $w^1_1 \cdot a_8 + w^1_2 \cdot a_9 + w^1_3 \cdot a_{13} + w^1_4 \cdot a_{14}$. Element $o^1_8$ is the dot product of the first row of converted weight matrix 212 and the eighth column of converted input data matrix 214, i.e., $o^1_8$ is equal to $w^1_1 \cdot a_9 + w^1_2 \cdot a_{10} + w^1_3 \cdot a_{14} + w^1_4 \cdot a_{15}$. The elements of the second, third and fourth rows the second quadrant $o_{q2}$ of converted output data matrix 216, i.e., elements $o^2_5$, $o^2_6$, $o^2_7$, $o^2_8$, $o^3_5$, $o^3_6$, $o^3_7$, $o^3_8$, $o^4_5$, $o^4_6$, $o^4_7$ and $o^4_8$, are calculated in the same manner using the second, third and fourth rows of converted weight matrix 212, respectively.

To generate the third quadrant $o_{q3}$ of converted output data matrix 216, converted weight matrix 212 is multiplied by the third quadrant $a_{q3}$ of converted input data matrix 214. For the first row of the third quadrant $o_{q3}$, element $o^1_9$ is the dot product of the first row of converted weight matrix 212 and the ninth column of converted input data matrix 214, i.e., $o^1_9$ is equal to $w^1_1 \cdot a_{11} + w^1_2 \cdot a_{12} + w^1_3 \cdot a_{16} + w^1_4 \cdot a_{17}$. Element $o^1_{10}$ is the dot product of the first row of converted weight matrix 212 and the 10th column of converted input data matrix 214, i.e., $o^1_{10}$ is equal to $w^1_1 \cdot a_{12} + w^1_2 \cdot a_{13} + w^1_3 \cdot a_{17} + w^1_4 \cdot a_{18}$. Element $o^1_{11}$ is the dot product of the first row of converted weight matrix 212 and the 11th column of converted input data matrix 214, i.e., $o^1_{11}$ is equal to $w^1_1 \cdot a_{13} + w^1_2 \cdot a_{14} + w^1_3 \cdot a_{18} + w^1_4 \cdot a_{19}$. Element $o^1_{12}$ is the dot product of the first row of converted weight matrix 212 and the $12^{th}$ column of converted input data matrix 214, i.e., $o^1_{12}$ is equal to $w^1_1 \cdot a_{14} + w^1_2 \cdot a_{15} + w^1_3 \cdot a_{19} + w^1_4 \cdot a_{20}$. The elements of the second, third and fourth rows the third quadrant $o_{q3}$ of converted output data matrix 216, i.e., elements $o^2_9$, $o^2_{10}$, $o^2_{11}$, $o^2_{12}$, $o^3_9$, $o^3_{10}$, $o^3_{11}$, $o^3_{12}$, $o^4_9$, $o^4_{10}$, $o^4_{11}$ and $o^4_{12}$, are calculated in the same manner using the second, third and fourth rows of converted weight matrix 212, respectively.

To generate the fourth quadrant $o_{q4}$ of converted output data matrix 216, converted weight matrix 212 is multiplied by the fourth quadrant $a_{q4}$ of converted input data matrix 214. For the first row of the fourth quadrant $o_{q4}$, element $o^1_{13}$ is the dot product of the first row of converted weight matrix 212, and the $13^{th}$ column of converted input data matrix 214, i.e., $o^1_{13}$ is equal to $w^1_1 \cdot a_{16} + w^1_2 \cdot a_{17} + w^1_3 \cdot a_{21} + w^1_4 \cdot a_{22}$. Element $o^1_{14}$ is the dot product of the first row of converted weight matrix 212 and the $14^{th}$ column of converted input data matrix 214, i.e., $o^1_{14}$ is equal to $w^1_1 \cdot a_{17} + w^1_2 \cdot a_{18} + w^1_3 \cdot a_{22} + w^1_4 \cdot a_{23}$. Element $o^1_{15}$ is the dot product of the first row of converted weight matrix 212 and the $15^{th}$ column of converted input data matrix 214, i.e., $o^1_{15}$ is equal to $w^1_1 \cdot a_{18} + w^1_2 \cdot a_{19} + w^1_3 \cdot a_{23} + w^1_4 \cdot a_{24}$. Element $o^1_{16}$ is the dot product of the first row of converted weight matrix 212 and the $16^{th}$ column of converted input data matrix 214, i.e., $o^1_{16}$ is equal to $w^1_1 \cdot a_{19} + w^1_2 \cdot a_{20} + w^1_3 \cdot a_{24}\, w^1_4 \cdot a_{25}$. The elements of the second, third and fourth rows the fourth quadrant $o_{q4}$ of converted output data matrix 216, i.e., elements $o^2_{13}$, $o^2_{14}$, $o^2_{15}$, $o^2_{16}$, $o^3_{13}$, $o^3_{14}$, $o^3_{15}$, $o^3_{16}$, $o^4_{13}$, $o^4_{14}$, $o^4_{15}$ and $o^4_{16}$, are calculated in the same manner using the second, third and fourth rows of converted weight matrix 212, respectively.

Figure 2D:
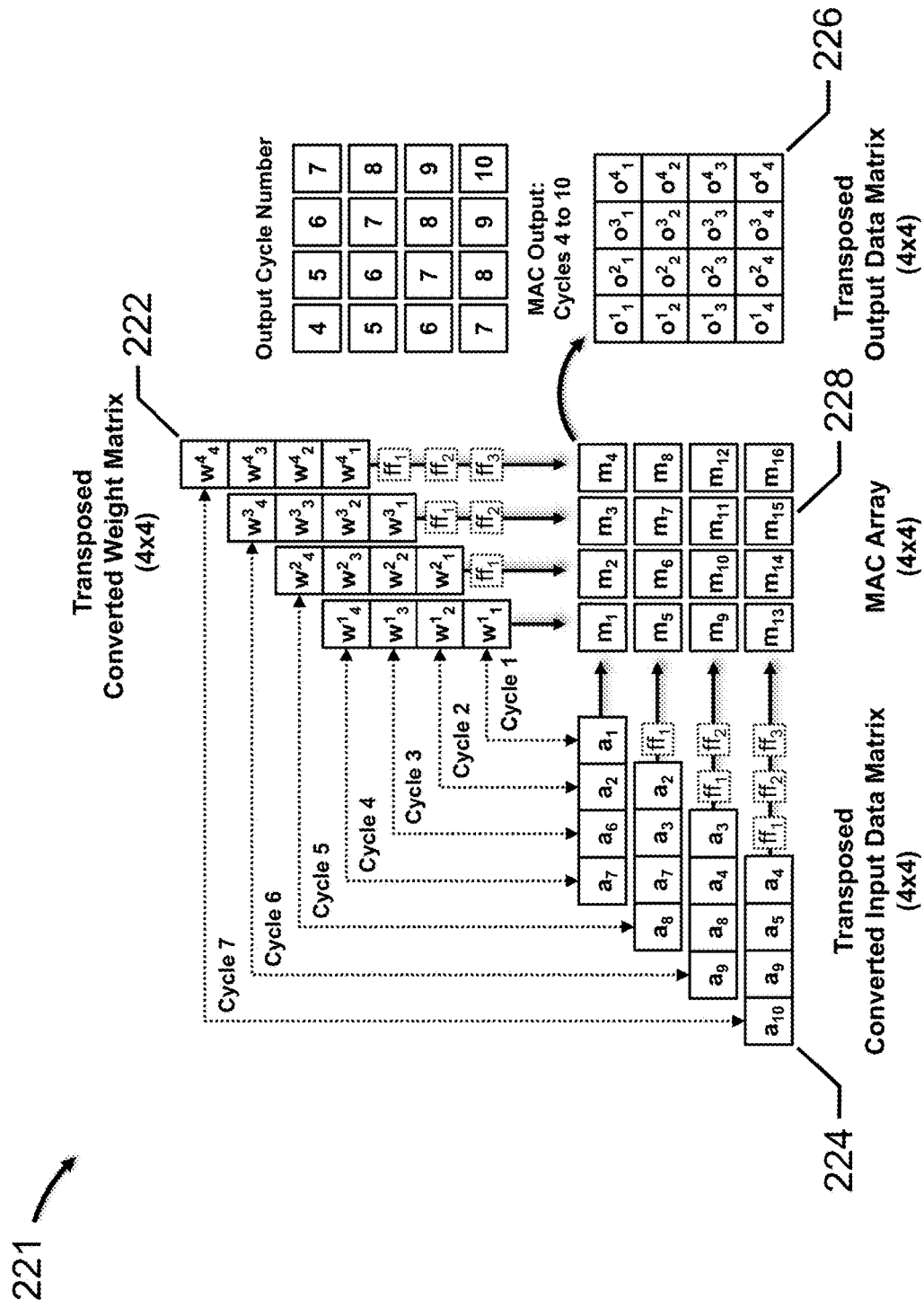
FIG. 2D depicts a data flow diagram for a MAC array, in accordance with an embodiment of the present disclosure.

FIG. 2D depicts a data flow diagram 221 for MAC array 228, in accordance with an embodiment of the present disclosure.

As noted above, GEMM operations may be implemented in a dedicated ANN hardware accelerator using an array of MAC units. In this embodiment, MAC array 228 is a systolic, output stationary array that implements converted convolution operation 211 using a 4×4 array of MAC units $m_1, \ldots, m_{16}$. The orientation of transposed weight matrix 222, transposed input data matrix 224, and transposed output data matrix 226 relative to MAC array 228 simplifies illustration; other orientations are also contemplated.

As discussed above, each MAC unit calculates a dot product, between a row of converted weight matrix 212 and a column of converted input data matrix 214, to generate an element of converted output data matrix 216. Generally, a MAC unit includes, inter alia, a multiplier, an adder and a storage register. Each MAC unit is reset by clearing or zeroing its storage register prior to, or at the start of, a new dot product calculation.

Generally, elements from converted weight matrix 212 are read from local memory, enter MAC array 228 at the first row of MAC units $m_1$, $m_2$, $m_3$ and $m_4$, and propagate one MAC unit down at the beginning of each processing cycle. Similarly, elements from converted input data matrix 214 are read from local memory, enter MAC array 228 at the first column of MAC units $m_1$, $m_5$, $m_9$ and $m_{13}$, and propagate one MAC unit to the right at the beginning of each processing cycle. The dot product calculations performed by these edge MAC units are discussed in detail below, while the dot product calculations performed by the remaining MAC units in the second, third and fourth rows of MAC array 228 are summarized below.

MAC unit $m_1$ calculates the dot product of the first row of converted weight matrix 212 (i.e., converted weight set $212^1$) and the first column of converted input data matrix 214 to generate element $o^1{}_1$ of converted output data matrix 216. During the first processing cycle, MAC unit $m_1$ receives $a_1$ and $w^1{}_1$ from local memory, multiplies $a_1$ and $w^1{}_1$ to generate an intermediate product, adds the intermediate product to the value stored in the storage register (i.e., 0), and stores the accumulated result back in the storage register. During the second processing cycle, MAC unit $m_1$ transmits $a_1$ to MAC unit $m_2$ and $w^1{}_1$ to MAC unit $m_5$, receives $a_2$ and $w^1{}_2$ from local memory, multiplies $a_2$ and $w^1{}_2$ to generate an intermediate product, adds the intermediate product to the value stored in the storage register, and stores the accumulated result back in the storage register.

During the third processing cycle, MAC unit $m_1$ transmits $a_2$ to MAC unit $m_2$ and $w^1{}_2$ to MAC unit $m_5$, receives $a_3$ and $w^1{}_3$ from local memory, multiplies $a_3$ and $w^1{}_3$ to generate an intermediate product, adds the intermediate product to the value stored in the storage register, and stores the accumulated result back in the storage register. During the fourth processing cycle, MAC unit $m_1$ transmits $a_3$ to MAC unit $m_2$ and $w^1{}_3$ to MAC unit $m_5$, receives $a_4$ and $w^1{}_4$ from the local memory, multiplies $a_4$ and $w^1{}_4$ to generate an intermediate product, adds the intermediate product to the value stored in the storage register, stores the accumulated result back in the storage register, and then outputs the value stored in the storage register as element $o_1$. During the fifth processing cycle, MAC unit $m_1$ transmits $a_4$ to MAC unit $m_2$ and $w^1{}_4$ to MAC unit $m_5$, and then waits for the next sequence of operations to begin.

MAC unit $m_2$ calculates the dot product of the second row of converted weight matrix 212 (i.e., converted weight set $212^2$) and the first column of converted input data matrix 214 to generate element $o^2{}_1$ of converted output data matrix 216. During the first processing cycle, $w^2{}_1$ is read from local memory and stored in delay register $ff_1$. MAC unit $m_2$ does not receive any data from MAC unit $m_1$ because $a_1$ is not yet available, and does not transmit any data to MAC unit $m_6$ because $w^2{}_1$ has been stored in the delay register $ff_1$. During the second processing cycle, MAC unit $m_2$ receives $a_1$ from MAC unit $m_1$ and $w^2{}_1$ from the delay register $ff_1$; $w^2{}_2$ is read from local memory and stored in the delay register $ff_1$ after $w^2{}_1$ has been accessed. MAC unit $m_2$ multiplies $a_1$ and $w^2{}_1$ to generate an intermediate product, adds the intermediate product to the value stored in the storage register (i.e., 0), and stores the accumulated result back in the storage register. During the third processing cycle, MAC unit $m_2$ transmits $a_1$ to MAC unit $m_3$ and $w^2{}_1$ to MAC unit $m_6$, receives $a_2$ from MAC unit $m_1$, and receives $w^2{}_2$ from the delay register $ff_1$; $w^2{}_3$ is read from local memory and stored in the delay register $ff_1$ after $w^2{}_2$ has been accessed. MAC unit $m_2$ multiplies $a_2$ and $w^2{}_2$ to generate an intermediate product, adds the intermediate product to the value stored in the storage register, and stores the accumulated result back in the storage register.

During the fourth processing cycle, MAC unit $m_2$ transmits $a_2$ to MAC unit $m_3$ and $w^2{}_2$ to MAC unit $m_6$, receives $a_3$ from MAC unit $m_1$, and receives $w^2{}_3$ from the delay register $ff_1$; $w^2{}_4$ is read from local memory and stored in the delay register $ff_1$ after $w^2{}_3$ has been accessed. MAC unit $m_2$ multiplies $a_3$ and $w^2{}_3$ to generate an intermediate product, adds the intermediate product to the value stored in the storage register, and stores the accumulated result back in the storage register. During the fifth processing cycle, MAC unit $m_2$ transmits $a_3$ to MAC unit $m_3$ and $w^2{}_3$ to MAC unit $m_6$, receives $a_4$ from MAC unit $m_1$, and receives $w^2{}_4$ from the delay register $ff_1$. MAC unit $m_2$ multiplies $a_4$ and $w^2{}_4$ to generate an intermediate product, adds the intermediate product to the value stored in the storage register, stores the accumulated result back in the storage register, and then outputs the value stored in the storage register as element $o_2$. During the sixth processing cycle, MAC unit $m_2$ transmits $a_4$ to MAC unit $m_3$ and $w^2{}_4$ to MAC unit $m_6$, and then waits for the next sequence of operations to begin.

MAC unit $m_3$ calculates the dot product of the third row of converted weight matrix 212 (i.e., converted weight set $212^3$) and the first column of converted input data matrix 214 to generate element $o^3{}_1$ of converted output data matrix 216. During the first processing cycle, $w^3{}_1$ is read from local memory and stored in a first delay register fit MAC unit $m_3$ does not receive any data from MAC unit $m_2$ because $a_1$ is not yet available, and does not transmit any data to MAC unit $m_7$ because $w^3{}_1$ has been stored in the first delay register $ff_1$. During the second processing cycle, $w^3{}_1$ is transferred from the first delay register $ff_1$ to a second delay register $ff_2$, and $w^3{}_2$ is then read from local memory and stored in the first delay register $ff_1$. MAC unit $m_3$ does not receive any data from MAC unit $m_2$ because $a_1$ is not yet available, and does not transmit any data to MAC unit $m_7$ because $w^3{}_1$ has been stored in the second delay register $ff_2$. During the third processing cycle, MAC unit $m_3$ receives $a_1$ from MAC unit $m_2$ and $w^3{}_1$ from the second delay register $ff_2$; $w^3{}_2$ is transferred from the first delay register $ff_1$ to the second delay register $ff_2$ after $w^3{}_1$ has been accessed, and $w^3{}_3$ is then read from local memory and stored in the first delay register $ff_1$. MAC unit $m_3$ multiplies $a_1$ and $w^3{}_1$ to generate an intermediate product, adds the intermediate product to the value stored in the storage register (i.e., 0), and stores the accumulated result back in the storage register.

During the fourth processing cycle, MAC unit $m_3$ transmits $a_1$ to MAC unit $m_4$ and $w^3{}_1$ to MAC unit $m_7$, receives $a_2$ from MAC unit $m_2$, and receives $w^3{}_2$ from the second delay register $ff_2$; $w^3{}_3$ is transferred to the second delay register $ff_2$ after $w^3{}_2$ has been accessed, and $w^3{}_4$ is then read from local memory and stored in the first delay register $ff_1$. MAC unit $m_3$ multiplies $a_2$ and $w^3{}_2$ to generate an intermediate product, adds the intermediate product to the value stored in the storage register, and stores the accumulated result back in the storage register. During the fifth processing cycle, MAC unit $m_3$ transmits $a_2$ to MAC unit $m_4$ and $w^3_2$ to MAC unit $m_7$, receives $a_3$ from MAC unit $m_2$, and receives $w^3_3$ from the second delay register $ff_2$; $w^3_4$ is transferred to the second delay register $ff_2$ after $w^3_3$ has been accessed. MAC unit $m_3$ multiplies $a_3$ and $w^3_3$ to generate an intermediate product, adds the intermediate product to the value stored in the storage register, and stores the accumulated result back in the storage register. During the sixth processing cycle, MAC unit $m_3$ transmits $a_3$ to MAC unit $m_4$ and $w^3_3$ to MAC unit $m_7$, receives $a_4$ from MAC unit $m_2$, and receives $w^3_4$ from the second delay register $ff_2$. MAC unit $m_3$ multiplies $a_4$ and $w^3_4$ to generate an intermediate product, adds the intermediate product to the value stored in the storage register, stores the accumulated result back in the storage register, and then outputs the value stored in the storage register as element $o_3$. During the seventh processing cycle, MAC unit $m_3$ transmits $a_4$ to MAC unit $m_4$ and $w^3_4$ to MAC unit $m_7$, and then waits for the next sequence of operations to begin.

MAC unit $m_4$ calculates the dot product of the fourth row of converted weight matrix 212 (i.e., converted weight set $212^4$) and the first column of converted input data matrix 214 to generate element $o^4_1$ of converted output data matrix 216. During the first processing cycle, $w^4_1$ is read from local memory and stored in a first delay register $ff_1$, and MAC unit $m_4$ does not receive any data from MAC unit $m_3$ because $a_1$ is not yet available, and $w^4_1$ has been stored in the first delay register During the second processing cycle, $w^4_1$ is transferred from the first delay register $ff_1$ to a second delay register $ff_2$, $w^4_2$ is then read from local memory and stored in the first delay register $ff_1$, and MAC unit $m_4$ does not receive any data from MAC unit $m_3$ because $a_1$ is not yet available, and $w^4_1$ has been stored in the second delay register $ff_2$. During the third processing cycle, $w^4_1$ is transferred from the second delay register $ff_2$ to a third delay register $ff_3$, $w^4_2$ is transferred from the first delay register $ff_1$ to the second delay register $ff_2$, $w^4_3$ is then read from local memory and stored in the first delay register $ff_1$, and MAC unit $m_4$ does not receive any data from MAC unit $m_3$ because $a_1$ is not yet available, and $w^4_1$ has been stored in the third delay register $ff_3$.

During the fourth processing cycle, MAC unit $m_4$ receives $a_1$ from MAC unit $m_3$ and $w^4_1$ from the third delay register $ff_3$; $w^4_2$ is transferred from the second delay register $ff_2$ to the third delay register $ff_3$ after $w^4_1$ has been accessed, $w^4_3$ is transferred from the first delay register $ff_1$ to the second delay register $ff_2$, and $w^4_4$ is read from local memory and stored in the first delay register $ff_1$. MAC unit $m_4$ multiplies $a_1$ and $w^4_1$ to generate an intermediate product, adds the intermediate product to the value stored in the storage register (i.e., 0), and stores the accumulated result back in the storage register. During the fifth processing cycle, MAC unit $m_4$ transmits $w^4_1$ to MAC unit ma, receives $a_2$ from MAC unit $m_3$, and receives $w^4_2$ from the third delay register $ff_3$; $w^4_3$ is transferred from the second delay register $ff_2$ to the third delay register $ff_3$ after $w^4_2$ has been accessed, and $w^4_4$ is transferred from the first delay register $ff_1$ to the second delay register $ff_2$. MAC unit $m_4$ multiplies $a_2$ and $w^4_2$ to generate an intermediate product, adds the intermediate product to the value stored in the storage register, and stores the accumulated result back in the storage register.

During the sixth processing cycle, MAC unit $m_4$ transmits $w^4_2$ to MAC unit ma, receives $a_3$ from MAC unit $m_3$, and receives $w^4_3$ from the third delay register $ff_3$; $w^4_4$ is transferred from the second delay register $ff_2$ to the third delay register $ff_3$ after $w^3_3$ has been accessed. MAC unit $m_4$ multiplies $a_3$ and $w^4_3$ to generate an intermediate product, adds the intermediate product to the value stored in the storage register, and stores the accumulated result back in the storage register. During the seventh processing cycle, MAC unit $m_4$ transmits $w^4_3$ to MAC unit $m_8$, receives $a_4$ from MAC unit $m_3$, and receives $w^3_4$ from the third delay register $ff_3$. MAC unit $m_4$ multiplies $a_4$ and $w^4_4$ to generate an intermediate product, adds the intermediate product to the value stored in the storage register, stores the accumulated result back in the storage register, and then outputs the value stored in the storage register as element $o^4_1$. During the eighth processing cycle, MAC unit $m_4$ transmits $w^4_4$ to MAC unit ma, and waits for the next sequence of operations to begin.

MAC unit $m_5$ calculates the dot product of the first row of converted weight matrix 212 (i.e., converted weight set $212^1$) and the second column of converted input data matrix 214 to generate element $o^1_2$ of converted output data matrix 216. During the first processing cycle, $a_2$ is read from local memory and stored in a delay register $ff_1$. MAC unit $m_5$ does not receive any data from MAC unit $m_1$ because $w^1_1$ is not yet available, does not transmit any data to MAC unit $m_6$ because $a_2$ has been stored in the delay register $ff_1$, and does not transmit any data to MAC unit $m_9$ because $w^1_1$ is not yet available.

During the second processing cycle, MAC unit $m_5$ receives $w^1_1$ from MAC unit $m_1$ and $a_2$ from the delay register $ff_1$; $a_3$ is read from local memory and stored in the delay register $ff_1$ after $a_2$ has been accessed. MAC unit $m_5$ multiplies $a_2$ and $w^1_1$ to generate an intermediate product, adds the intermediate product to the value stored in the storage register (i.e., 0), and stores the accumulated result back in the storage register. During the third processing cycle, MAC unit $m_5$ transmits $a_2$ to MAC unit $m_6$ and $w^1_1$ to MAC unit $m_9$, receives $w^1_2$ from MAC unit $m_1$, and receives $a_3$ from the delay register $ff_1$; $a_7$ is read from local memory and stored in the delay register $ff_1$ after $a_3$ has been accessed. MAC unit $m_5$ multiplies $a_3$ and $w^1_2$ to generate an intermediate product, adds the intermediate product to the value stored in the storage register, and stores the accumulated result back in the storage register.

During the fourth processing cycle, MAC unit $m_5$ transmits $a_3$ to MAC unit $m_6$ and $w^1_2$ to MAC unit $m_9$, receives $w^1_3$ from MAC unit $m_1$, and receives $a_7$ from the delay register $ff_1$; $a_8$ is read from local memory and stored in the delay register $ff_1$ after $a_7$ has been accessed. MAC unit $m_5$ multiplies $a_7$ and $w^1_3$ to generate an intermediate product, adds the intermediate product to the value stored in the storage register, and stores the accumulated result back in the storage register. During the fifth processing cycle, MAC unit $m_5$ transmits $a_7$ to MAC unit $m_6$ and $w^1_3$ to MAC unit $m_9$, receives $w^1_4$ from MAC unit $m_1$, and receives aa from the delay register $ff_1$. MAC unit $m_5$ multiplies $a_8$ and $w^1_4$ to generate an intermediate product, adds the intermediate product to the value stored in the storage register, stores the accumulated result back in the storage register, and then outputs the value stored in the storage register as element $o^1_2$. During the sixth processing cycle, MAC unit $m_5$ transmits $a_8$ to MAC unit $m_6$ and $w^1_4$ to MAC unit $m_9$, and then waits for the next sequence of operations to begin.

The remainder of the second row of MAC array 228 includes MAC units $m_6$, $m_7$ and $m_8$. MAC unit $m_6$ receives weights from MAC unit $m_2$ and input data from MAC unit $m_5$, transmits weights to MAC unit $m_{10}$ and input data to MAC unit $m_7$, and calculates the dot product of the second row of converted weight matrix 212 (i.e., converted weight set $212^2$) and the second column of converted input data matrix 214 to generate element $o^2_2$ of converted output data matrix 216. MAC unit $m_7$ receives weights from MAC unit $m_3$ and input data from MAC unit ma, transmits weights to MAC unit mu and input data to MAC unit ma, and calculates the dot product of the third row of converted weight matrix 212 (i.e., converted weight set $212^3$) and the second column of converted input data matrix 214 to generate element $o^3{}_2$ of converted output data matrix 216. MAC unit ma receives weights from MAC unit $m_4$ and input data from MAC unit $m_7$, transmits weights to MAC unit $m_{12}$, and calculates the dot product of the fourth row of converted weight matrix 212 (i.e., converted weight set $212^4$) and the second column of converted input data matrix 214 to generate element $o^4{}_2$ of converted output data matrix 216.

MAC unit $m_9$ calculates the dot product of the first row of converted weight matrix 212 (i.e., converted weight set $212^1$) and the third column of converted input data matrix 214 to generate element $o^1{}_3$ of converted output data matrix 216. During the first processing cycle, $a_3$ is read from local memory and stored in a first delay register $ff_1$. MAC unit $m_9$ does not receive any data from MAC unit $m_5$ because $w^1{}_1$ is not yet available, does not transmit any data to MAC unit $m_{10}$ because $a_3$ has been stored in the first delay register $ff_1$, and does not transmit any data to MAC unit $m_{13}$ because $w^1{}_1$ is not yet available.

During the second processing cycle, $a_3$ is transferred from the first delay register $ff_1$ to a second delay register $ff_2$, and $a_4$ is then read from local memory and stored in the first delay register $ff_1$. MAC unit $m_9$ does not receive any data from MAC unit $m_5$ because $w^1{}_1$ is not yet available, does not transmit any data to MAC unit $m_{10}$ because $a_3$ has been stored in the second delay register $ff_2$, and does not transmit any data to MAC unit $m_{13}$ because $w^1{}_1$ is not yet available. During the third processing cycle, MAC unit $m_9$ receives $w^1{}_1$ from MAC unit $m_5$ and $a_3$ from the second delay register $ff_2$; $a_4$ is transferred from the first delay register $ff_1$ to the second delay register $ff_2$ after $a_3$ has been accessed, and $a_8$ is then read from local memory and stored in the first delay register $ff_1$. MAC unit $m_9$ multiplies $a_3$ and $w^1{}_1$ to generate an intermediate product, adds the intermediate product to the value stored in the storage register (i.e., 0), and stores the accumulated result back in the storage register.

During the fourth processing cycle, MAC unit $m_9$ transmits $w^1{}_1$ to MAC unit $m_{13}$ and $a_3$ to MAC unit $m_{10}$, receives $w^1{}_2$ from MAC unit $m_5$, and receives $a_4$ from the second delay register $ff_2$; $a_8$ is transferred to the second delay register $ff_2$ after $a_4$ has been accessed, and $a_9$ is then read from local memory and stored in the first delay register $ff_1$. MAC unit $m_9$ multiplies $a_4$ and $w^1{}_2$ to generate an intermediate product, adds the intermediate product to the value stored in the storage register, and stores the accumulated result back in the storage register. During the fifth processing cycle, MAC unit $m_9$ transmits $w^1{}_2$ to MAC unit $m_{13}$ and $a_4$ to MAC unit $m_{10}$, receives $w^1{}_3$ from MAC unit $m_5$, and receives $a_8$ from the second delay register $ff_2$; $a_9$ is transferred to the second delay register $ff_2$ after $a_8$ has been accessed. MAC unit $m_9$ multiplies $a_8$ and $w^1{}_3$ to generate an intermediate product, adds the intermediate product to the value stored in the storage register, and stores the accumulated result back in the storage register.

During the sixth processing cycle, MAC unit $m_9$ transmits $w^1{}_3$ to MAC unit $m_1$ and $a_8$ to MAC unit $m_{10}$, receives $w^1{}_4$ from MAC unit $m_5$, and receives $a_9$ from the second delay register $ff_2$. MAC unit $m_9$ multiplies $a_9$ and $w^1{}_4$ to generate an intermediate product, adds the intermediate product to the value stored in the storage register, stores the accumulated result back in the storage register, and then outputs the value stored in the storage register as element $o^1{}_3$. During the seventh processing cycle, MAC unit $m_9$ transmits $a_9$ to MAC unit $m_{10}$ and $w^1{}_4$ to MAC unit $m_{13}$, and then waits for the next sequence of operations to begin.

The remainder of the third row of MAC array 228 includes MAC units $m_{10}$, mu and $m_{12}$. MAC unit $m_{10}$ receives weights from MAC unit $m_6$ and input data from MAC unit $m_9$, transmits weights to MAC unit $m_{14}$ and input data to MAC unit $m_{11}$, and calculates the dot product of the second row of converted weight matrix 212 (i.e., converted weight set $212^2$) and the third column of converted input data matrix 214 to generate element $o^2{}_3$ of converted output data matrix 216. MAC unit $m_{11}$ receives weights from MAC unit $m_7$ and input data from MAC unit $m_{10}$, transmits weights to MAC unit $m_{15}$ and input data to MAC unit $m_{12}$, and calculates the dot product of the third row of converted weight matrix 212 (i.e., converted weight set $212^3$) and the third column of converted input data matrix 214 to generate element $o^3{}_3$ of converted output data matrix 216. MAC unit $m_{12}$ receives weights from MAC unit ma and input data from MAC unit $m_{11}$, transmits weights to MAC unit $m_{16}$, and calculates the dot product of the fourth row of converted weight matrix 212 (i.e., converted weight set $212^4$) and the third column of converted input data matrix 214 to generate element $o^4{}_3$ of converted output data matrix 216.

MAC unit $m_{13}$ calculates the dot product of the first row of converted weight matrix 212 (i.e., converted weight set $212^1$) and the fourth column of converted input data matrix 214 to generate element $o^1{}_4$ of converted output data matrix 216. During the first processing cycle, $a_4$ is read from local memory and stored in a first delay register $ff_1$, and MAC unit $m_1$ does not receive any data from MAC unit $m_9$ because $w^1{}_1$ is not yet available, and $a_4$ has been stored in the first delay register $ff_1$. During the second processing cycle, $a_4$ is transferred from the first delay register $ff_1$ to a second delay register $ff_2$, $a_5$ is then read from local memory and stored in the first delay register $ff_1$, and MAC unit $m_{13}$ does not receive any data from MAC unit $m_9$ because $w^1{}_1$ is not yet available, and $a_4$ has been stored in the second delay register $ff_2$. During the third processing cycle, $a_4$ is transferred from the second delay register $ff_2$ to a third delay register $ff_3$, $a_5$ is transferred from the first delay register $ff_1$ to the second delay register $ff_2$, $a_9$ is then read from local memory and stored in the first delay register $ff_1$, and MAC unit $m_{13}$ does not receive any data from MAC unit $m_9$ because $w^1{}_1$ is not yet available, and $a_4$ has been stored in the third delay register $ff_3$.

During the fourth processing cycle, MAC unit $m_{13}$ receives $w^1{}_1$ from MAC unit $m_9$ and $a_4$ from the third delay register $ff_3$; $a_5$ is transferred from the second delay register $ff_2$ to the third delay register $ff_3$ after $a_4$ has been accessed, $a_9$ is transferred from the first delay register $ff_1$ to the second delay register $ff_2$, and $a_{10}$ is read from local memory and stored in the first delay register $ff_1$. MAC unit $m_{13}$ multiplies $a_4$ and $w^1{}_1$ to generate an intermediate product, adds the intermediate product to the value stored in the storage register (i.e., 0), and stores the accumulated result back in the storage register. During the fifth processing cycle, MAC unit $m_{13}$ transmits $a_4$ to MAC unit $m_{14}$, receives $w^1{}_2$ from MAC unit $m_9$, and receives $a_5$ from the third delay register $ff_3$; $a_9$ is transferred from the second delay register $ff_2$ to the third delay register $ff_3$ after $a_5$ has been accessed, and $a_{10}$ is transferred from the first delay register $ff_1$ to the second delay register $ff_2$. MAC unit $m_1$ multiplies $a_5$ and $w^1{}_2$ to generate an intermediate product, adds the intermediate product to the value stored in the storage register, and stores the accumulated result back in the storage register.

During the sixth processing cycle, MAC unit $m_{13}$ transmits $a_5$ to MAC unit mid, receives $w^1{}_3$ from MAC unit $m_9$, and receives $a_9$ from the third delay register $ff_3$; $a_{10}$ is transferred from the second delay register $ff_2$ to the third delay register $ff_3$ after $a_9$ has been accessed. MAC unit $m_{13}$ multiplies $a_9$ and $w^1{}_3$ to generate an intermediate product, adds the intermediate product to the value stored in the storage register, and stores the accumulated result back in the storage register. During the seventh processing cycle, MAC unit $m_{13}$ transmits $a_9$ to MAC unit $m_{14}$, receives $w^1{}_4$ from MAC unit $m_9$, and receives $a_{10}$ from the third delay register $ff_3$. MAC unit $m_{13}$ multiplies $a_{10}$ and $w^1{}_4$ to generate an intermediate product, adds the intermediate product to the value stored in the storage register, stores the accumulated result back in the storage register, and then outputs the value stored in the storage register as element $o^1{}_4$. During the eighth processing cycle, MAC unit $m_{13}$ transmits $a_{10}$ to MAC unit ma, and waits for the next sequence of operations to begin.

The remainder of the fourth row of MAC array 228 includes MAC units $m_{14}$, $m_{15}$ and $m_{16}$. MAC unit $m_{14}$ receives weights from MAC unit $m_{10}$ and input data from MAC unit $m_{13}$, transmits input data to MAC unit $m_{15}$, and calculates the dot product of the second row of converted weight matrix 212 (i.e., converted weight set $212^2$) and the fourth column of converted input data matrix 214 to generate element $o^2{}_4$ of converted output data matrix 216. MAC unit $m_{15}$ receives weights from MAC unit $m_{11}$ and input data from MAC unit $m_{14}$, transmits input data to MAC unit $m_{16}$, and calculates the dot product of the third row of converted weight matrix 212 (i.e., converted weight set $212^3$) and the fourth column of converted input data matrix 214 to generate element $o^3{}_4$ of converted output data matrix 216. MAC unit $m_1$ receives weights from MAC unit $m_{12}$ and input data from MAC unit $m_{15}$, and calculates the dot product of the fourth row of converted weight matrix 212 (i.e., converted weight set $212^4$) and the fourth column of converted input data matrix 214 to generate element $o^4{}_4$ of converted output data matrix 216.

After the first quadrant $a_{q1}$ of converted input data matrix 214 has been processed, the next sequence of operations may begin in order to process the second quadrant $a_{q2}$ of converted input data matrix 214. After the second quadrant $a_{q2}$ of converted input data matrix 214 has been processed, the next sequence of operations may begin in order to process the third quadrant $a_{q3}$ of converted input data matrix 214. And, after the third quadrant $a_{q3}$ of converted input data matrix 214 has been processed, the final sequence of operations may begin in order to process the fourth quadrant $a_{q4}$ of converted input data matrix 214. Converted weight matrix 212 is accessed for each sequence of operations.

In one embodiment, MAC array 228 may wait until the final element $o^4{}_4$ of converted output data matrix 216 has been calculated at the end of the 10th processing cycle before beginning the next sequence of operations for the next quadrant of converted input data matrix 214. In another embodiment, MAC array 228 may begin the next sequence of operations for the next quadrant of converted input data matrix 214 as soon as the first element $o^1{}_1$ of converted output data matrix 216 has been calculated at the end of the 4th processing cycle. In this embodiment, MAC array 228 does not wait or suspend operations; instead, MAC array 228 continuously performs dot product calculations.

Each column of converted weight matrix 212 is read at the beginning of a processing cycle. The first column of converted weight matrix 212, i.e., weights $w^1{}_1$, $w^2{}_1$, $w^3{}_1$ and $w^4{}_1$, is read at the beginning of the first processing cycle; $w^1{}_1$ is provided to MAC unit $m_1$, $w^2{}_1$ is provided to the first delay register for MAC unit $m_2$, $w^3{}_1$ is provided to the first delay register for MAC unit $m_3$, and $w^4{}_1$ is provided to the first delay register for MAC unit $m_4$. Similarly, the second column of converted weight matrix 212, i.e., weights $w^1{}_2$, $w^2{}_2$, $w^3{}_2$ and $w^4{}_2$, is read at the beginning of the second processing cycle; $w^1{}_2$ is provided to MAC unit $m_1$, $w^2{}_2$ is provided to the first delay register for MAC unit $m_2$, $w^3{}_2$ is provided to the first delay register for MAC unit $m_3$, and $w^4{}_2$ is provided to the first delay register for MAC unit $m_4$. The third column of converted weight matrix 212, i.e., weights $w^1{}_3$, $w^2{}_3$, $w^3{}_3$ and $w^4{}_3$, is read at the beginning of the third processing cycle; $w^1{}_3$ is provided to MAC unit $m_1$, $w^2{}_3$ is provided to the first delay register for MAC unit $m_2$, $w^3{}_3$ is provided to the first delay register for MAC unit $m_3$, and $w^4{}_3$ is provided to the first delay register for MAC unit $m_4$. And, the fourth column of converted weight matrix 212, i.e., weights $w^1{}_4$, $w^2{}_4$, $w^3{}_4$ and $w^4{}_4$, is read at the beginning of the fourth processing cycle; $w^1{}_4$ is provided to MAC unit $m_1$, $w^2{}_4$ is provided to the first delay register for MAC unit $m_2$, $w^3{}_4$ is provided to the first delay register for MAC unit $m_3$, and $w^4{}_4$ is provided to the first delay register for MAC unit $m_4$.

Similarly, each row of a particular quadrant of converted input data matrix 214 is read at the beginning of a processing cycle. For example, the first row of the first quadrant $a_{q1}$ of converted input data matrix 214, i.e., elements $a_1$, $a_2$, $a_3$ and $a_4$, is read at the beginning of the first processing cycle; $a_1$ is provided to MAC unit $m_1$, $a_2$ is provided to the first delay register for MAC unit $m_5$, $a_3$ is provided to the first delay register for MAC unit $m_9$, and $a_4$ is provided to the first delay register for MAC unit $m_{13}$. Similarly, the second row of the first quadrant $a_{q1}$ of converted input data matrix 214, i.e., elements $a_2$, $a_3$, $a_4$ and $a_5$, is read at the beginning of the second processing cycle; $a_2$ is provided to MAC unit $m_1$, $a_3$ is provided to the first delay register for MAC unit $m_5$, $a_4$ is provided to the first delay register for MAC unit $m_9$, and $a_5$ is provided to the first delay register for MAC unit $m_{13}$. The third row of the first quadrant $a_{q1}$ of converted input data matrix 214, i.e., elements $a_6$, $a_7$, $a_8$ and $a_9$, is read at the beginning of the third processing cycle; $a_6$ is provided to MAC unit $m_1$, $a_7$ is provided to the first delay register for MAC unit $m_5$, $a_8$ is provided to the first delay register for MAC unit $m_9$, and $a_9$ is provided to the first delay register for MAC unit $m_{13}$. And, the fourth row of the first quadrant $a_{q1}$ of converted input data matrix 214, i.e., elements $a_7$, $a_8$, $a_9$ and $a_{10}$, is read at the beginning of the fourth processing cycle; $a_7$ is provided to MAC unit $m_1$, $a_8$ is provided to the first delay register for MAC unit $m_5$, $a_9$ is provided to the first delay register for MAC unit $m_9$, and $a_{10}$ is provided to the first delay register for MAC unit $m_{13}$.

Figure 3A:
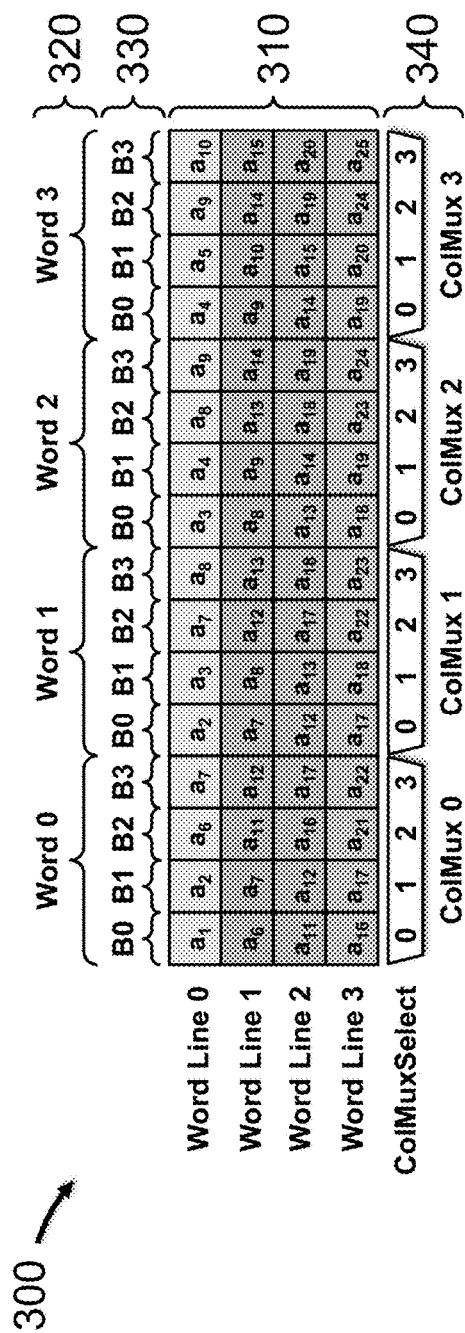
FIG. 3A depicts a memory for an ANN accelerator, in accordance with an embodiment of the present disclosure.

FIG. 3A depicts a block diagram 300 of a memory for an ANN accelerator, in accordance with an embodiment of the present disclosure.

Block diagram 300 depicts a portion of a memory, such as, for example, a conventional, 32-bit static random-access memory (SRAM). In this memory, the size of a word is 32 bits or 4 bytes. Four rows or word lines 310 are depicted for illustration purposes, i.e., word line 0, word line 1, word line 2 and word line 3. Each word line has four, 32-bit words 320, i.e., word 0, word 1, word 2 and word 3, and each 32-bit word has 4 bytes 330, i.e., b0, b1, b2 and b3.

Generally, a single access to a conventional 32-bit memory may only read (or write) a single word from (or to) a single row. A WordLineSelect signal identifies which row or word line 310 is to be accessed, such as, for example, word line 0, word line 1, word line 2, word line 3, etc. A column multiplexer 340 is coupled to the memory cells that store each word 320 of each word line 310, i.e., ColMux 0 is coupled to word 0 of word lines 0, 1, 2 and 3, ColMux 1 is coupled to word 1 of word lines 0, 1, 2 and 3, ColMux 2 is coupled to word 2 of word lines 0, 1, 2 and 3, and ColMux 3 is coupled to word 3 of word lines 0, 1, 2 and 3.

In this embodiment, column multiplexers 340 are associated with a memory read operation. Each "read" column multiplexer 340 has four 8-bit input ports and one 8-bit output port, and each input port is coupled to a different byte 330 of word 320, i.e., b0, b1, b2 or b3. A "read" ColMuxSelect signal identifies which input port of each column multiplexer 340 is to be selected, i.e., a value of 0 selects input port 0, a value of 1 selects input port 1, a value of 2 selects input port 2, and a value of 3 selects input port 3. The output port of each column multiplexer 340 outputs the value of the byte coupled to the selected input port, and the byte values are then formed into the word to be read, i.e., ColMux 0 provides the first byte, ColMux 1 provides the second byte, ColMux 2 provides the third byte, and ColMux 3 provides the fourth byte.

In this embodiment, each input port of each column multiplexer 340 is coupled to a different byte of the associated word as follows. For ColMux 0, input port 0 is coupled to b0 of word 0 of word lines 0, 1, 2 and 3, input port 1 is coupled to b1 of word 0 of word lines 0, 1, 2 and 3, input port 2 is coupled to b2 of word 0 of word lines 0, 1, 2 and 3, and input port 3 is coupled to b3 of word 0 of word lines 0, 1, 2 and 3. For ColMux 1, input port 0 is coupled to b0 of word 1 of word lines 0, 1, 2 and 3, input port 1 is coupled to b1 of word 1 of word lines 0, 1, 2 and 3, input port 2 is coupled to b2 of word 1 of word lines 0, 1, 2 and 3, and input port 3 is coupled to b3 of word 1 of word lines 0, 1, 2 and 3. For ColMux 2, input port 0 is coupled to b0 of word 2 of word lines 0, 1, 2 and 3, input port 1 is coupled to b1 of word 2 of word lines 0, 1, 2 and 3, input port 2 is coupled to b2 of word 2 of word lines 0, 1, 2 and 3, and input port 3 is coupled to b3 of word 2 of word lines 0, 1, 2 and 3. And, for ColMux 3, input port 0 is coupled to b0 of word 3 of word lines 0, 1, 2 and 3, input port 1 is coupled to b1 of word 3 of word lines 0, 1, 2 and 3, input port 2 is coupled to b2 of word 3 of word lines 0, 1, 2 and 3, and input port 3 is coupled to b3 of word 3 of word lines 0, 1, 2 and 3.

In one example, in response to a WordLineSelect signal of having a value of 0 and a ColMuxSelect signal of having a value of 0, word line 0 is selected, input port 0 of each column multiplexer 340 is selected, four bytes are read from the memory and a word is formed from b0 of word 0 of word line 0 (i.e., the output of ColMux 0), b0 of word 1 of word line 0 (i.e., the output of ColMux 1), b0 of word 2 of word line 0 (i.e., the output of ColMux 2), and b0 of word 3 of word line 0 (i.e., the output of ColMux 3).

For illustration purposes, converted input data matrix 214 has been stored in word lines 0, 1, 2 and 3 of the memory in column-order. Each word line 310 stores one quadrant of converted input data matrix 214, i.e., word line 0 stores quadrant $a_{q1}$, word line 1 stores quadrant $a_{q2}$, word line 2 stores quadrant $a_{q3}$, and word line 3 stores quadrant $a_{q4}$.

For word line 0, the elements of the first column of quadrant $a_{q1}$ are stored in word 0, i.e., $a_1$, $a_2$, $a_6$ and $a_7$, the elements of the second column of quadrant $a_{q1}$ are stored in word 1, i.e., $a_2$, $a_3$, $a_7$ and $a_8$, the elements of the third column of quadrant $a_{q1}$ are stored in word 2, i.e., $a_3$, $a_4$, $a_8$ and $a_9$, and the elements of the fourth column of quadrant $a_{q1}$ are stored in word 3, i.e., $a_4$, $a_5$, $a_9$ and $a_{10}$.

For word line 1, the elements of the first column of quadrant $a_{q2}$ are stored in word 0, i.e., $a_6$, $a_7$, $a_{11}$ and $a_{12}$, the elements of the second column of quadrant $a_{q2}$ are stored in word 1, i.e., $a_7$, $a_8$, $a_{12}$ and $a_{13}$, the elements of the third column of quadrant $a_{q2}$ are stored in word 2, i.e., $a_8$, $a_9$, $a_{13}$ and $a_{14}$, and the elements of the fourth column of quadrant $a_{q2}$ are stored in word 3, i.e., $a_9$, $a_{10}$, $a_{14}$ and $a_{15}$.

For word line 2, the elements of the first column of quadrant $a_{q3}$ are stored in word 0, i.e., $a_{11}$, $a_{12}$, $a_{16}$ and $a_{17}$, the elements of the second column of quadrant $a_{q3}$ are stored in word 1, i.e., $a_{12}$, $a_{13}$, $a_{17}$ and $a_{18}$, the elements of the third column of quadrant $a_{q3}$ are stored in word 2, i.e., $a_{13}$, $a_{14}$, $a_{18}$ and $a_{19}$, and the elements of the fourth column of quadrant $a_{q3}$ are stored in word 3, i.e., $a_{14}$, $a_{15}$, $a_{19}$ and $a_{20}$.

For word line 3, the elements of the first column of quadrant $a_{q4}$ are stored in word 0, i.e., $a_{16}$, $a_{17}$, $a_{21}$ and $a_{22}$, the elements of the second column of quadrant $a_{q4}$ are stored in word 1, i.e., $a_{17}$, $a_{18}$, $a_{22}$ and $a_{23}$, the elements of the third column of quadrant $a_{q4}$ are stored in word 2, i.e., $a_{18}$, $a_{19}$, $a_{23}$ and $a_{24}$, and the elements of the fourth column of quadrant $a_{q4}$ are stored in word 3, i.e., $a_{19}$, $a_{20}$, $a_{24}$ and $a_{25}$.

While converted input data matrix 214 has been depicted, converted weight matrix 212 may be similarly be stored in a different word line of the memory in row-order (rather than column-order), and similarly accessed for each quadrant of converted input data matrix 214. Converted weight set $212^1$ (i.e., weights $w^1_1$, $w^1_2$, $w^1_3$ and $w^1_4$) may be stored in word 0, converted weight set $212^2$ (i.e., weights $w^2_1$, $w^2_2$, $w^2_3$ and $w^2_4$) may be stored in word 1, converted weight set $212^3$ (i.e., weights $w^3_1$, $w^3_2$, $w^3_3$ and $w^3_4$) may be stored in word 2, and converted weight set $212^4$ (i.e., weights $w^4_1$, $w^4_2$, $w^4_3$ and $w^4_4$) may be stored in word 3.

In this embodiment, additional column multiplexers 350 (depicted in FIG. 3C; not depicted in FIG. 3A for clarity) may be associated with a memory write operation. Each "write" column multiplexer 350 has four 8-bit output ports and one 8-bit input port, and each output port is coupled to a different byte 330 of a respective word 320, i.e., b0, b1, b2 or b3. A "write" ColMuxSelect signal identifies which output port of each column multiplexer 350 is to be selected, i.e., a value of 0 selects output port 0, a value of 1 selects output port 1, a value of 2 selects output port 2, and a value of 3 selects output port 3. The input port of each column multiplexer 350 receives one byte of the word to be written, which is provided to the selected output port for writing to the memory cell, i.e., the first column multiplexer 350 receives and writes the first byte ("Byte 0") to one of the bytes of word 0, the second column multiplexer 350 receives and writes the second byte ("Byte 1") to one of the bytes of word 1, the third column multiplexer 350 receives and writes the third byte ("Byte 2") to one of the bytes of word 2, and the fourth column multiplexer 350 receives and writes the fourth byte ("Byte 3") to one of the bytes of word 3.

In this embodiment, each output port of each column multiplexer 350 is coupled to a different byte of the associated word as follows. For the first column multiplexer 350 (e.g., ColMux 0), input port 0 is coupled to b0 of word 0 of word lines 0, 1, 2 and 3, input port 1 is coupled to b1 of word 0 of word lines 0, 1, 2 and 3, input port 2 is coupled to b2 of word 0 of word lines 0, 1, 2 and 3, and input port 3 is coupled to b3 of word 0 of word lines 0, 1, 2 and 3. For the second column multiplexer 350 (e.g., ColMux 1), input port 0 is coupled to b0 of word 1 of word lines 0, 1, 2 and 3, input port 1 is coupled to b1 of word 1 of word lines 0, 1, 2 and 3, input port 2 is coupled to b2 of word 1 of word lines 0, 1, 2 and 3, and input port 3 is coupled to b3 of word 1 of word lines 0, 1, 2 and 3. For the third column multiplexer

350 (e.g., ColMux 2), input port 0 is coupled to b0 of word 2 of word lines 0, 1, 2 and 3, input port 1 is coupled to b1 of word 2 of word lines 0, 1, 2 and 3, input port 2 is coupled to b2 of word 2 of word lines 0, 1, 2 and 3, and input port 3 is coupled to b3 of word 2 of word lines 0, 1, 2 and 3. And, for the fourth column multiplexer 350 (e.g., ColMux 3), input port 0 is coupled to b0 of word 3 of word lines 0, 1, 2 and 3, input port 1 is coupled to b1 of word 3 of word lines 0, 1, 2 and 3, input port 2 is coupled to b2 of word 3 of word lines 0, 1, 2 and 3, and input port 3 is coupled to b3 of word 3 of word lines 0, 1, 2 and 3.

In one example, in response to a WordLineSelect signal of having a value of 0 and a "write" ColMuxSelect signal of having a value of 0, word line 0 is selected, output port 0 of each column multiplexer 350 is selected, four bytes are written to the memory, i.e., the first byte is written to b0 of word 0 of word line 0 (i.e., the output of ColMux 0), the second byte is written to b0 of word 1 of word line 0 (i.e., the output of ColMux 1), the third byte is written to b0 of word 2 of word line 0 (i.e., the output of ColMux 2), and the fourth byte is written to b0 of word 3 of word line 0 (i.e., the output of ColMux 3).

Other memory characteristics, such as, for example, different sized words (e.g., 64 bits, etc.), different numbers of column multiplexers (e.g., 2, 8, 16, etc.), etc., are also contemplated.

Figure 3B:
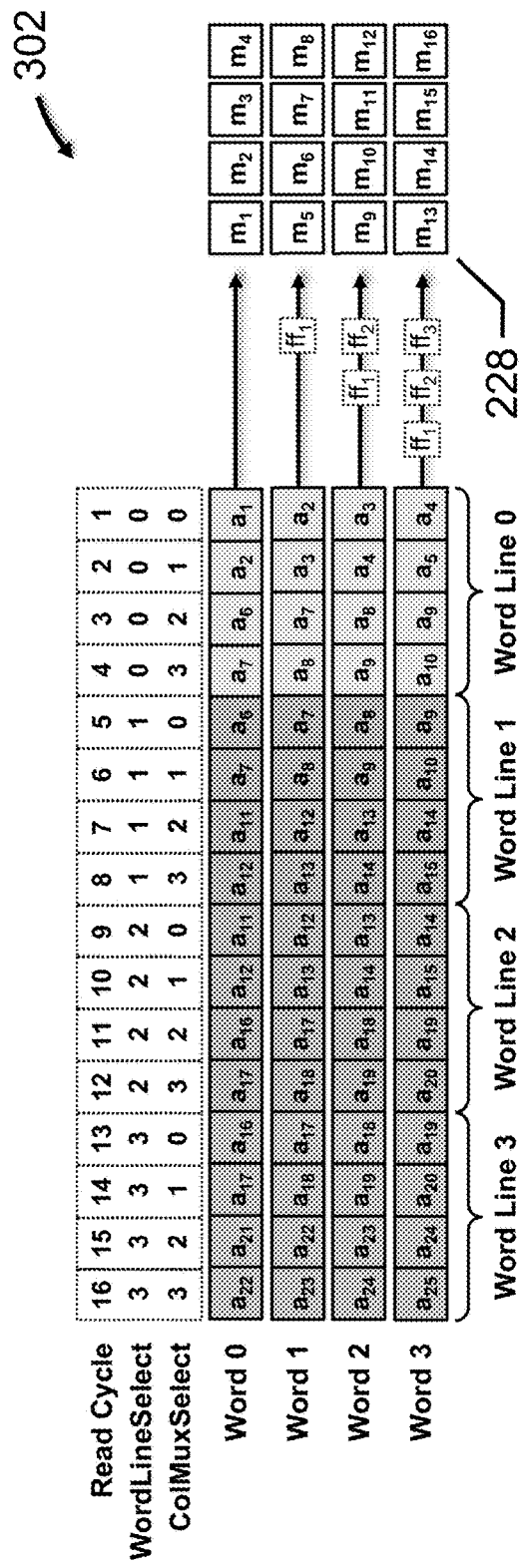
FIG. 3B depicts a data flow diagram for a sequence of read operations from a memory of an ANN accelerator, in accordance with an embodiment of the present disclosure.

FIG. 3B depicts a data flow diagram 302 for a sequence of read operations from a memory of an ANN accelerator, in accordance with an embodiment of the present disclosure.

As described above, one row of a quadrant of converted input data matrix 214 is read at the beginning of each processing cycle when MAC array 228 continuously performs dot product calculations. Data flow diagram 302 depicts read cycles 1 to 16, which correspond to processing cycles 1 to 16 for converted convolution operation 211. While MAC unit $m_1$ does not complete the calculation of the last converted output data element $o^4_4$ until processing cycle 22, only 16 read cycles are required to access all of the elements of converted input data matrix 214 from memory. Processing cycle 17 begins the sequence for a new converted convolution operation at read cycle 1, which accesses the first column of the first quadrant of the new converted input data matrix. MAC array 228 simultaneously performs dot product calculations for these two converted convolution operations during processing cycles 17 to 22, performs dot product calculations for the new converted convolution operation during processing cycles 23 to 32, and so on for each additional converted convolution operation.

With respect to converted convolution operation 211 described above, the first row of quadrant $a_{q1}$ of converted input data matrix 214, i.e., elements $a_1$, $a_2$, $a_3$ and $a_4$, is read at the beginning of processing cycle 1, which corresponds to read cycle 1 depicted in FIG. 3B. For read cycle 1, the WordLineSelect signal is set to a value of 0, the ColMuxSelect signal is set to a value of 0, and the following bytes are selected and read from the memory by column multiplexers 340: b0 of word 0 of word line 0 (i.e., $a_1$) by ColMux 0, b0 of word 1 of word line 0 (i.e., $a_2$) by ColMux 1, b0 of word 2 of word line 0 (i.e., $a_3$) by ColMux 2, and b0 of word 3 of word line 0 (i.e., $a_4$) by ColMux 3.

The second row of quadrant $a_{q1}$ of converted input data matrix 214, i.e., elements $a_2$, $a_3$, $a_4$ and $a_5$, is read at the beginning of processing cycle 2, which corresponds to read cycle 2 depicted in FIG. 3B. For read cycle 2, the WordLineSelect signal is set to a value of 0, the ColMuxSelect signal is set to a value of 1, and the following bytes are selected and read from the memory by column multiplexers 340: b1 of word 0 of word line 0 (i.e., $a_2$) by ColMux 0, b1 of word 1 of word line 0 (i.e., $a_3$) by ColMux 1, b1 of word 2 of word line 0 (i.e., $a_4$) by ColMux 2, and b1 of word 3 of word line 0 (i.e., $a_5$) by ColMux 3.

The third row of quadrant $a_{q1}$ of converted input data matrix 214, i.e., elements $a_6$, $a_7$, $a_8$ and $a_9$, is read at the beginning of processing cycle 3, which corresponds to read cycle 3 depicted in FIG. 3B. For read cycle 3, the WordLineSelect signal is set to a value of 0, the ColMuxSelect signal is set to a value of 2, and the following bytes are selected and read from the memory by column multiplexers 340: b2 of word 0 of word line 0 (i.e., $a_6$) by ColMux 0, b2 of word 1 of word line 0 (i.e., $a_7$) by ColMux 1, b2 of word 2 of word line 0 (i.e., $a_8$) by ColMux 2, and b2 of word 3 of word line 0 (i.e., $a_9$) by ColMux 3.

The fourth row of quadrant $a_{q1}$ of converted input data matrix 214, i.e., elements $a_7$, $a_8$, $a_9$ and $a_{10}$, is read at the beginning of processing cycle 4, which corresponds to read cycle 4 depicted in FIG. 3B. For read cycle 4, the WordLineSelect signal is set to a value of 0, the ColMuxSelect signal is set to a value of 3, and the following bytes are selected and read from the memory by column multiplexers 340: b3 of word 0 of word line 0 (i.e., $a_7$) by ColMux 0, b3 of word 1 of word line 0 (i.e., $a_8$) by ColMux 1, b3 of word 2 of word line 0 (i.e., $a_9$) by ColMux 2, and b3 of word 3 of word line 0 (i.e., $a_{10}$) by ColMux 3.

The first row of quadrant $a_{q2}$ of converted input data matrix 214, i.e., elements $a_6$, $a_7$, $a_8$ and $a_9$, is read at the beginning of processing cycle 5, which corresponds to read cycle 5 depicted in FIG. 3B. For read cycle 5, the WordLineSelect signal is set to a value of 1, the ColMuxSelect signal is set to a value of 0, and the following bytes are selected and read from the memory by column multiplexers 340: b0 of word 0 of word line 1 (i.e., $a_6$) by ColMux 0, b0 of word 1 of word line 1 (i.e., $a_7$) by ColMux 1, b0 of word 2 of word line 1 (i.e., $a_8$) by ColMux 2, and b0 of word 3 of word line 1 (i.e., $a_9$) by ColMux 3.

The second row of quadrant $a_{q2}$ of converted input data matrix 214, i.e., elements $a_7$, $a_8$, $a_9$ and $a_{10}$, is read at the beginning of processing cycle 6, which corresponds to read cycle 6 depicted in FIG. 3B. For read cycle 6, the WordLineSelect signal is set to a value of 1, the ColMuxSelect signal is set to a value of 1, and the following bytes are selected and read from the memory by column multiplexers 340: b1 of word 0 of word line 1 (i.e., $a_7$) by ColMux 0, b1 of word 1 of word line 1 (i.e., $a_8$) by ColMux 1, b1 of word 2 of word line 1 (i.e., $a_9$) by ColMux 2, and b1 of word 3 of word line 1 (i.e., $a_{10}$) by ColMux 3.

The third row of quadrant $a_{q2}$ of converted input data matrix 214, i.e., elements $a_{11}$, $a_{12}$, $a_{13}$ and $a_{14}$, is read at the beginning of processing cycle 7, which corresponds to read cycle 7 depicted in FIG. 3B. For read cycle 7, the WordLineSelect signal is set to a value of 1, the ColMuxSelect signal is set to a value of 2, and the following bytes are selected and read from the memory by column multiplexers 340: b2 of word 0 of word line 1 (i.e., $a_{11}$) by ColMux 0, b2 of word 1 of word line 1 (i.e., $a_{12}$) by ColMux 1, b2 of word 2 of word line 1 (i.e., $a_{13}$) by ColMux 2, and b2 of word 3 of word line 1 (i.e., $a_{14}$) by ColMux 3.

The fourth row of quadrant $a_{q2}$ of converted input data matrix 214, i.e., elements $a_{12}$, $a_{13}$, $a_{14}$ and $a_{15}$, is read at the beginning of processing cycle 8, which corresponds to read cycle 8 depicted in FIG. 3B. For read cycle 8, the WordLineSelect signal is set to a value of 1, the ColMuxSelect signal is set to a value of 3, and the following bytes are selected and read from the memory by column multiplexers 340: b3 of word 0 of word line 1 (i.e., $a_{12}$) by ColMux 0, b3 of word 1 of word line 1 (i.e., $a_{13}$) by ColMux 1, b3 of word 2 of word line 1 (i.e., $a_{14}$) by ColMux 2, and b3 of word 3 of word line 1 (i.e., $a_{15}$) by ColMux 3.

The first row of quadrant $a_{q3}$ of converted input data matrix 214, i.e., elements $a_{11}$, $a_{12}$, $a_{13}$ and $a_{14}$, is read at the beginning of processing cycle 9, which corresponds to read cycle 9 depicted in FIG. 3B. For read cycle 9, the WordLineSelect signal is set to a value of 2, the ColMuxSelect signal is set to a value of 0, and the following bytes are selected and read from the memory by column multiplexers 340: b0 of word 0 of word line 2 (i.e., $a_{11}$) by ColMux 0, b0 of word 1 of word line 2 (i.e., $a_{12}$) by ColMux 1, b0 of word 2 of word line 2 (i.e., $a_{13}$) by ColMux 2, and b0 of word 3 of word line 2 (i.e., $a_{14}$) by ColMux 3.

The second row of quadrant $a_{q3}$ of converted input data matrix 214, i.e., elements $a_{12}$, $a_{13}$, $a_{14}$ and $a_{15}$, is read at the beginning of processing cycle 10, which corresponds to read cycle 10 depicted in FIG. 3B. For read cycle 10, the WordLineSelect signal is set to a value of 2, the ColMuxSelect signal is set to a value of 1, and the following bytes are selected and read from the memory by column multiplexers 340: b1 of word 0 of word line 2 (i.e., $a_{12}$) by ColMux 0, b1 of word 1 of word line 2 (i.e., $a_{13}$) by ColMux 1, b1 of word 2 of word line 2 (i.e., $a_{14}$) by ColMux 2, and b1 of word 3 of word line 2 (i.e., $a_{15}$) by ColMux 3.

The third row of quadrant $a_{q3}$ of converted input data matrix 214, i.e., elements $a_{16}$, $a_{17}$, $a_{18}$ and $a_{19}$, is read at the beginning of processing cycle 11, which corresponds to read cycle 11 depicted in FIG. 3B. For read cycle 11, the WordLineSelect signal is set to a value of 2, the ColMuxSelect signal is set to a value of 2, and the following bytes are selected and read from the memory by column multiplexers 340: b2 of word 0 of word line 2 (i.e., $a_{16}$) by ColMux 0, b2 of word 1 of word line 2 (i.e., $a_{17}$) by ColMux 1, b2 of word 2 of word line 2 (i.e., $a_{18}$) by ColMux 2, and b2 of word 3 of word line 2 (i.e., $a_{19}$) by ColMux 3.

The fourth row of quadrant $a_{q3}$ of converted input data matrix 214, i.e., elements $a_{17}$, $a_{18}$, $a_{19}$ and $a_{20}$, is read at the beginning of processing cycle 12, which corresponds to read cycle 12 depicted in FIG. 3B. For read cycle 12, the WordLineSelect signal is set to a value of 2, the ColMuxSelect signal is set to a value of 3, and the following bytes are selected and read from the memory by column multiplexers 340: b3 of word 0 of word line 2 (i.e., $a_{17}$) by ColMux 0, b3 of word 1 of word line 2 (i.e., $a_{18}$) by ColMux 1, b3 of word 2 of word line 2 (i.e., $a_{19}$) by ColMux 2, and b3 of word 3 of word line 2 (i.e., $a_{20}$) by ColMux 3.

The first row of quadrant $a_{q4}$ of converted input data matrix 214, i.e., elements $a_{16}$, $a_{17}$, $a_{18}$ and $a_{19}$, is read at the beginning of processing cycle 13, which corresponds to read cycle 13 depicted in FIG. 3B. For read cycle 13, the WordLineSelect signal is set to a value of 3, the ColMuxSelect signal is set to a value of 0, and the following bytes are selected and read from the memory by column multiplexers 340: b0 of word 0 of word line 3 (i.e., $a_{16}$) by ColMux 0, b0 of word 1 of word line 3 (i.e., $a_{17}$) by ColMux 1, b0 of word 2 of word line 3 (i.e., $a_{18}$) by ColMux 2, and b0 of word 3 of word line 3 (i.e., $a_{19}$) by ColMux 3.

The second row of quadrant $a_{q4}$ of converted input data matrix 214, i.e., elements $a_{17}$, $a_{18}$, $a_{19}$ and $a_{20}$, is read at the beginning of processing cycle 14, which corresponds to read cycle 14 depicted in FIG. 3B. For read cycle 14, the WordLineSelect signal is set to a value of 3, the ColMuxSelect signal is set to a value of 1, and the following bytes are selected and read from the memory by column multiplexers 340: b1 of word 0 of word line 3 (i.e., $a_{17}$) by ColMux 0, b1 of word 1 of word line 3 (i.e., $a_{18}$) by ColMux 1, b1 of word 2 of word line 3 (i.e., $a_{19}$) by ColMux 2, and b1 of word 3 of word line 3 (i.e., $a_{20}$) by ColMux 3.

The third row of quadrant $a_{q4}$ of converted input data matrix 214, i.e., elements $a_{21}$, $a_{22}$, $a_{23}$ and $a_{24}$, is read at the beginning of processing cycle 15, which corresponds to read cycle 15 depicted in FIG. 3B. For read cycle 15, the WordLineSelect signal is set to a value of 3, the ColMuxSelect signal is set to a value of 2, and the following bytes are selected and read from the memory by column multiplexers 340: b2 of word 0 of word line 3 (i.e., $a_{21}$) by ColMux 0, b2 of word 1 of word line 3 (i.e., $a_{22}$) by ColMux 1, b2 of word 2 of word line 3 (i.e., $a_{23}$) by ColMux 2, and b2 of word 3 of word line 3 (i.e., $a_{24}$) by ColMux 3.

The fourth row of quadrant $a_{q4}$ of converted input data matrix 214, i.e., elements $a_{22}$, $a_{23}$, $a_{24}$ and $a_{25}$, is read at the beginning of processing cycle 16, which corresponds to read cycle 16 depicted in FIG. 3B. For read cycle 16, the WordLineSelect signal is set to a value of 3, the ColMuxSelect signal is set to a value of 3, and the following bytes are selected and read from the memory by column multiplexers 340: b3 of word 0 of word line 3 (i.e., $a_{22}$) by ColMux 0, b3 of word 1 of word line 3 (i.e., $a_{23}$) by ColMux 1, b3 of word 2 of word line 3 (i.e., $a_{24}$) by ColMux 2, and b3 of word 3 of word line 3 (i.e., $a_{25}$) by ColMux 3.

Figure 3C:
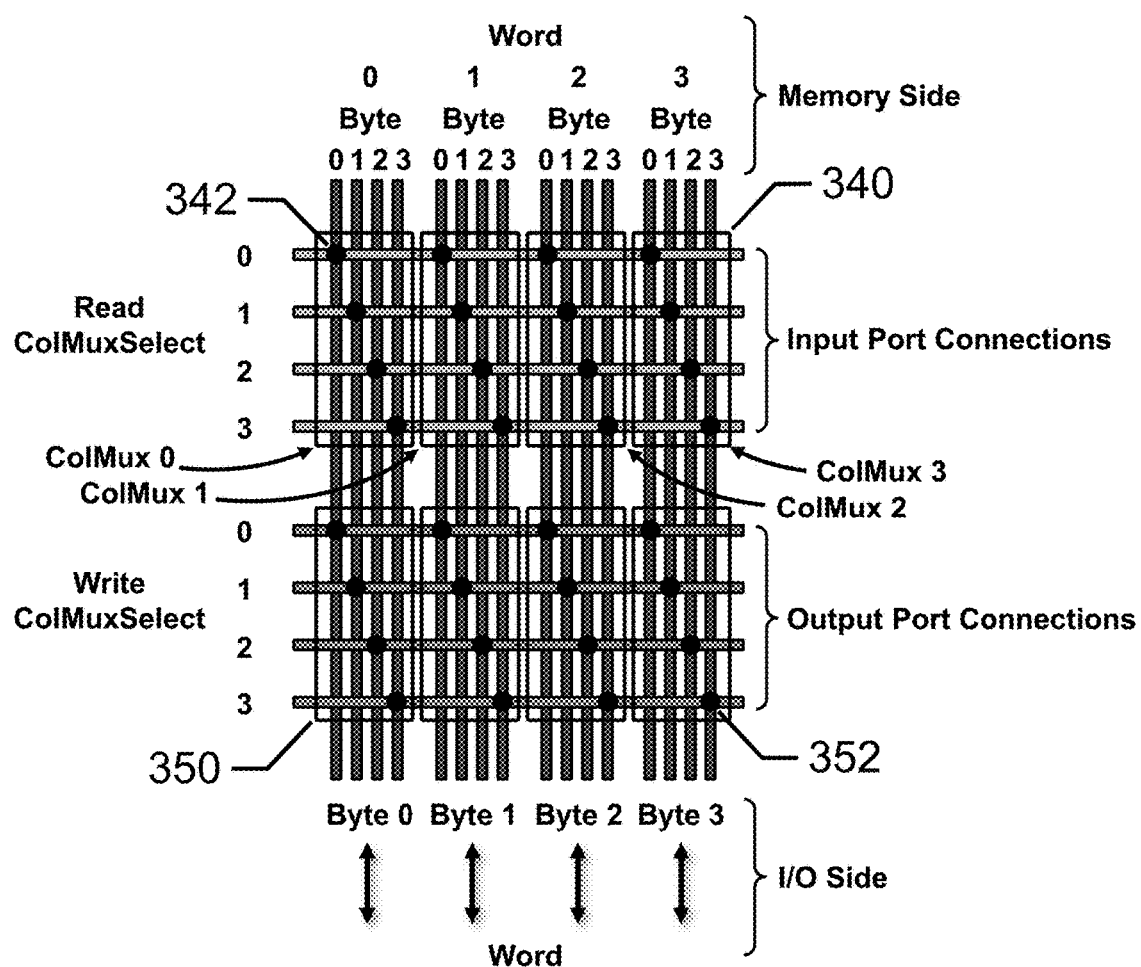
FIG. 3C depicts a multiplexer mapping diagram for a memory for an ANN accelerator, in accordance with an embodiment of the present disclosure.

FIG. 3C depicts a word selector or multiplexer mapping diagram 304 for a memory for an ANN accelerator, in accordance with an embodiment of the present disclosure.

As described above, the memory may include four column multiplexers 340 associated with read operations, and four column multiplexers 350 associated with write operations. Multiplexer mapping diagram 304 illustrates the mapping between the "read" ColMuxSelect signal values (i.e., 0, 1, 2 and 3) and the bytes 330 of each word 320, as well as the mapping between the "write" ColMuxSelect signal values (i.e., 0, 1, 2 and 3) and the bytes 330 of each word 320.

A "read" ColMuxSelect signal value of 0 selects input port 0 of each column multiplexer 340, and, as illustrated in FIG. 3C, each input port 0 of each column multiplexer 340 is coupled 342 to byte 0 of word 0, 1, 2 or 3. A "read" ColMuxSelect signal value of 1 selects input port 1 of each column multiplexer 340, and each input port 1 of each column multiplexer 340 is coupled 342 to byte 1 of word 0, 1, 2 or 3. A "read" ColMuxSelect signal value of 2 selects input port 2 of each column multiplexer 340, and each input port 2 of each column multiplexer 340 is coupled 342 to byte 2 of word 0, 1, 2 or 3. And, a "read" ColMuxSelect signal value of 3 selects input port 3 of each column multiplexer 340, and each input port 3 of each column multiplexer 340 is coupled 342 to byte 3 of word 0, 1, 2 or 3.

Similarly, a "write" ColMuxSelect signal value of 0 selects output port 0 of each column multiplexer 350, and, as illustrated in FIG. 3C, each output port 0 of each column multiplexer 350 is coupled 352 to byte 0 of word 0, 1, 2 or 3. A "write" ColMuxSelect signal value of 1 selects output port 1 of each column multiplexer 350, and each output port 1 of each column multiplexer 350 is coupled 352 to byte 1 of word 0, 1, 2 or 3. A "write" ColMuxSelect signal value of 2 selects output port 2 of each column multiplexer 350, and each output port 2 of each column multiplexer 350 is coupled 352 to byte 2 of word 0, 1, 2 or 3. And, a "write" ColMuxSelect signal value of 3 selects output port 3 of each column multiplexer 350, and each output port 3 of each column multiplexer 350 is coupled 352 to byte 3 of word 0, 1, 2 or 3.

With respect to the systolic aspect of output stationary MAC array 228, the delay registers (i.e., flip flop blocks $ff_1$, $ff_2$ and $ff_3$) cost power and circuit area proportional to the size of the array. The cost of these delays is about $N^2-N$ flops for a square array of dimension N. Embodiments of the present disclosure advantageously eliminate the delay registers by changing the way data is read from, or written to, the memory without adding complexity and area to SRAM memories.

Figure 4C:
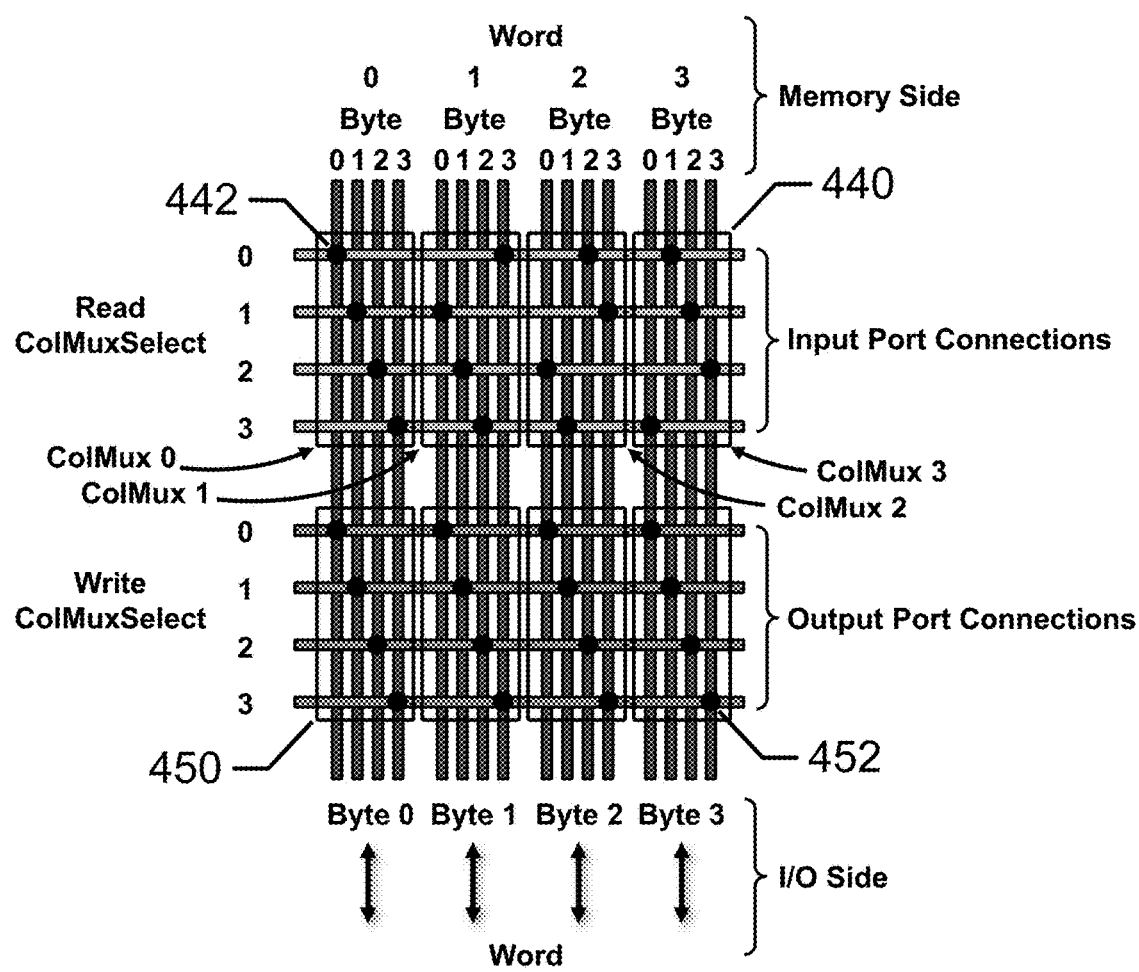
FIG. 4C depicts a multiplexer mapping diagram for a memory for an ANN accelerator, in accordance with an embodiment of the present disclosure.

In the embodiment depicted in FIGS. 4A, 4B and 4C, the elements of each quadrant of converted input data matrix 214 are read from memory and provided to MAC array 228 in the proper sequence, as depicted in FIG. 2D. Because each quadrant of converted input data matrix 214 is stored in a single row or word line 310, the last element of each quadrant is read before the elements of the next quadrant of converted input data matrix 214 may be accessed.

Figure 5A:
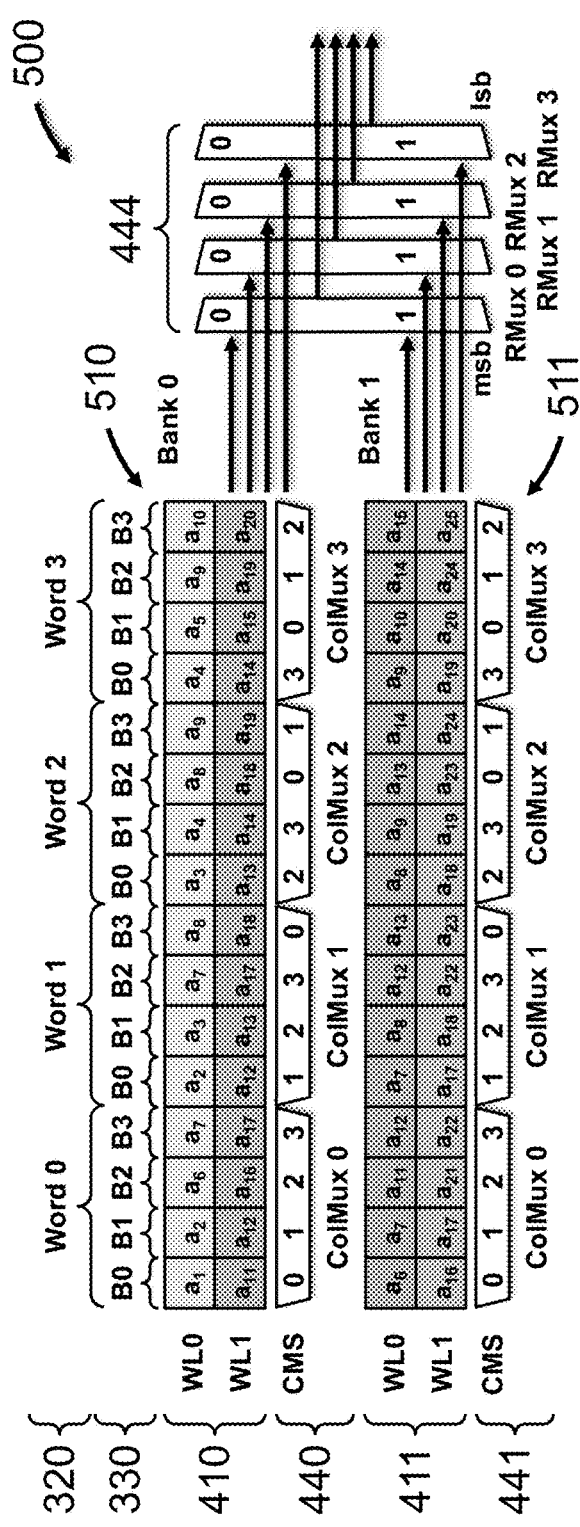
FIG. 5A depicts a block diagram of a memory for an ANN accelerator, in accordance with an embodiment of the present disclosure.
Figure 5B:
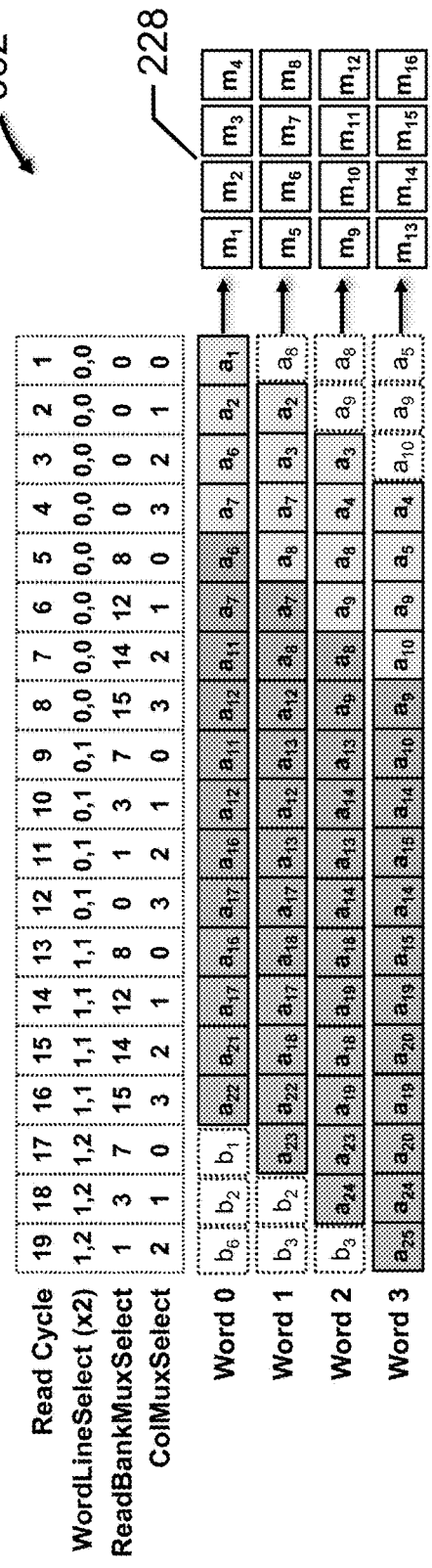
FIG. 5B depicts a data flow diagram for a sequence of read operations from a memory of an ANN accelerator, in accordance with an embodiment of the present disclosure.
Figure 5C:
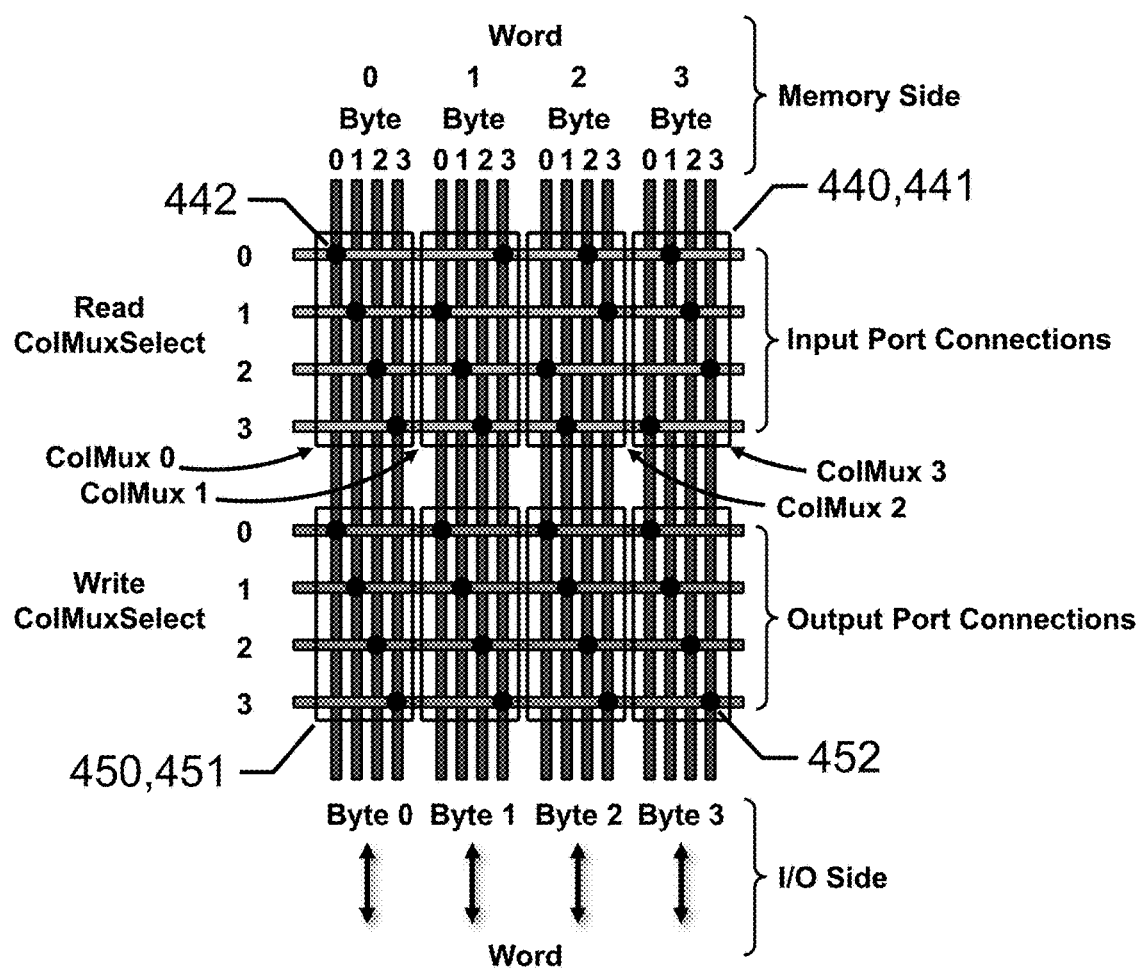
FIG. 5C depicts a multiplexer mapping diagram for a memory for an ANN accelerator, in accordance with an embodiment of the present disclosure.

In the embodiment depicted in FIGS. 5A, 5B and 5C, the elements of each quadrant of converted input data matrix 214 are read from memory and provided to MAC array 228 in the proper sequence, as depicted in FIG. 2D. Because adjacent quadrants of converted input data matrix 214 are stored in a single row or word line 310 in different memory banks, elements of both quadrants may be read during a single access.

In the embodiment depicted in FIGS. 6A, 6B, 6C, 6D and 6E, the elements of each quadrant of converted input data matrix 214 are written to memory in the proper sequence, as depicted in FIG. 2D. Because adjacent quadrants of converted input data matrix 214 are stored in a single row or word line 310 in different memory banks, elements of both quadrants may be written during a single access, and subsequently read during a single access.

FIG. 4A depicts a block diagram 400 of a memory for an ANN accelerator, in accordance with an embodiment of the present disclosure.

Block diagram 400 depicts a portion of a memory, such as, for example, a conventional, 32-bit static random-access memory (SRAM). Similar to the memory depicted in FIG. 3A, the size of a word is 32 bits or 4 bytes. Four rows or word lines 310 are depicted for illustration purposes, i.e., word line 0, word line 1, word line 2 and word line 3. Each word line has four, 32-bit words 320, i.e., word 0, word 1, word 2 and word 3, and each 32-bit word has 4 bytes 330, i.e., b0, b1, b2 and b3.

As noted above, a single access to a conventional 32-bit memory may only read (or write) a single word from (or to) a single row. A WordLineSelect signal identifies which row or word line 310 is to be accessed, such as, for example, word line 0, word line 1, word line 2, word line 3, etc. A column multiplexer 440 is coupled to the memory cells that store each word 320 of each word line 310, i.e., ColMux 0 is coupled to word 0 of word lines 0, 1, 2 and 3, ColMux 1 is coupled to word 1 of word lines 0, 1, 2 and 3, ColMux 2 is coupled to word 2 of word lines 0, 1, 2 and 3, and ColMux 3 is coupled to word 3 of word lines 0, 1, 2 and 3.

In this embodiment, column multiplexers 440 are associated with a memory read operation. Each "read" column multiplexer 440 has four 8-bit input ports and one 8-bit output port, and each input port is coupled to a different byte 330 of word 320, i.e., b0, b1, b2 or b3. A "read" ColMuxSelect signal identifies which input port of each column multiplexer 440 is to be selected, i.e., a value of 0 selects input port 0, a value of 1 selects input port 1, a value of 2 selects input port 2, and a value of 3 selects input port 3. The output port of each column multiplexer 440 outputs the value of the byte coupled to the selected input port, and the byte values are then formed into the word to be read, i.e., ColMux 0 provides the first byte, ColMux 1 provides the second byte, ColMux 2 provides the third byte, and ColMux 3 provides the fourth byte.

In this embodiment, each input port of each column multiplexer 440 is coupled to a different byte of the associated word as follows. For ColMux 0, input port 0 is coupled to b0 of word 0 of word lines 0, 1, 2 and 3, input port 1 is coupled to b1 of word 0 of word lines 0, 1, 2 and 3, input port 2 is coupled to b2 of word 0 of word lines 0, 1, 2 and 3, and input port 3 is coupled to b3 of word 0 of word lines 0, 1, 2 and 3. For ColMux 1, input port 0 is coupled to b3 of word 1 of word lines 0, 1, 2 and 3, input port 1 is coupled to b0 of word 1 of word lines 0, 1, 2 and 3, input port 2 is coupled to b1 of word 1 of word lines 0, 1, 2 and 3, and input port 3 is coupled to b2 of word 1 of word lines 0, 1, 2 and 3. For ColMux 2, input port 0 is coupled to b2 of word 2 of word lines 0, 1, 2 and 3, input port 1 is coupled to b3 of word 2 of word lines 0, 1, 2 and 3, input port 2 is coupled to b0 of word 2 of word lines 0, 1, 2 and 3, and input port 3 is coupled to b1 of word 2 of word lines 0, 1, 2 and 3. And, for ColMux 3, input port 0 is coupled to b1 of word 3 of word lines 0, 1, 2 and 3, input port 1 is coupled to b2 of word 3 of word lines 0, 1, 2 and 3, input port 2 is coupled to b3 of word 3 of word lines 0, 1, 2 and 3, and input port 3 is coupled to b0 of word 3 of word lines 0, 1, 2 and 3.

In one example, in response to a WordLineSelect signal of having a value of 0 and a ColMuxSelect signal of having a value of 0, word line 0 is selected, input port 0 of each column multiplexer 440 is selected, four bytes are read from the memory and a word is formed from b0 of word 0 of word line 0 (i.e., the output of ColMux 0), b3 of word 1 of word line 0 (i.e., the output of ColMux 1), b2 of word 2 of word line 0 (i.e., the output of ColMux 2), and b1 of word 3 of word line 0 (i.e., the output of ColMux 3).

As depicted in FIG. 4A, for illustration purposes, converted input data matrix 214 has been stored in word lines 0, 1, 2 and 3 of the memory in column-order. Each word line 310 stores one quadrant of converted input data matrix 214, i.e., word line 0 stores quadrant $a_{q1}$, word line 1 stores quadrant $a_{q2}$, word line 2 stores quadrant $a_{q3}$, and word line 3 stores quadrant $a_{q4}$. While converted input data matrix 214 has been depicted, converted weight matrix 212 may be similarly be stored in a different word line of the memory in row-order (rather than column-order), and similarly accessed for each quadrant of converted input data matrix 214.

In this embodiment, additional column multiplexers 350 (depicted in FIG. 4C; not depicted in FIG. 4A for clarity) may be associated with a memory write operation, as described above. Other memory characteristics, such as, for example, different sized words (e.g., 64 bits, etc.), different numbers of column multiplexers (e.g., 2, 8, 16, etc.), etc., are also contemplated.

FIG. 4B depicts a data flow diagram 402 for a sequence of read operations from a memory of an ANN accelerator, in accordance with an embodiment of the present disclosure.

In this embodiment, seven processing cycles are needed to read all of the elements from each quadrant of converted input data matrix 214, and 28 read cycles are needed to read all four quadrants of converted input data matrix 214. During each read cycle, four elements from one quadrant of converted input data matrix 214 are read from a single word line of the memory. The 28 read cycle sequence simply repeats for the next converted input data matrix 214 to be processed.

In the first read cycle for each quadrant of converted input data matrix 214 (i.e., read cycles 1, 8, 15 and 22), word 0 is read and provided to MAC array 228, while words 1, 2 and 3 are read but not provided to MAC array 228. In the second read cycle for each quadrant of converted input data matrix 214 (i.e., 2, 9, 16 and 23), words 0 and 1 are read and provided to MAC array 228, while words 2 and 3 are read but not provided to MAC array 228. In the third read cycle for each quadrant of converted input data matrix 214 (i.e., 3, 10, 17 and 24), words 0, 1 and 2 are read and provided to MAC array 228, while word 3 is read but not provided to MAC array 228. In the fourth read cycle for each quadrant of converted input data matrix 214 (i.e., 4, 11, 18 and 25), words 0, 1, 2 and 3 are read and provided to MAC array 228.

In the fifth read cycle for each quadrant of converted input data matrix 214 (i.e., 5, 12, 19 and 26), words 1, 2 and 3 are read and provided to MAC array 228, while word 0 is read but not provided to MAC array 228. In the sixth read cycle for each quadrant of converted input data matrix 214 (i.e., 6, 13, 20 and 27), words 1 and 2 are read and provided to MAC array 228, while words 0 and 1 are read but not provided to MAC array 228. In the seventh read cycle for each quadrant of converted input data matrix 214 (i.e., 7, 14, 21 and 28), word 3 is read and provided to MAC array 228, while words 0, 1 and 2 are read but not provided to MAC array 228.

Generally, a sense amplifier is coupled to each column multiplexer 440. For read cycles that include one or more elements that are not provided to MAC array 228, the sense amplifier for the respective column multiplexer 440 may be disabled to prevent reading the memory cells in which these element are stored. For example, a SenseAmplifierSelect signal may be provided to each sense amplifier to enable or disable the sense amplifier, which advantageously saves power. The SenseAmplifierSelect signal may be generated locally or globally. In this embodiment, 28 elements are read for each quadrant of converted input data matrix 214, however, 12 of those elements are not provided to MAC array 228. The power reduction provided by disabling the sense amplifiers for those elements that are not provided to MAC array 228 is equal to (12/28)*36%, or about 15%.

In another embodiment, all of four elements may be provided to MAC array 228 during each read cycle without effecting the accuracy of the dot product calculations because each MAC unit outputs the result of the dot product calculation at the end of the processing cycle in which the dot product calculation is complete, and each MAC unit is reset at the beginning of the processing cycle in which the first element of the next dot product calculation for the next quadrant of converted input data matrix 214 is received.

With respect to converted convolution operation 211 described above, for quadrant $a_{q1}$ of converted input data matrix 214, MAC unit $m_1$ begins the calculation of the first converted output data element $o^1_4$ at the start of processing cycle 1 and completes the calculation at the end of processing cycle 4, while MAC unit $m_1$ begins the calculation of the last converted output data element $o^4_4$ at the start of processing cycle 7 and completes the calculation at the end of processing cycle 10. For quadrant $a_{q2}$ of converted input data matrix 214, MAC unit $m_1$ begins the calculation of the first converted output data element $o^1_4$ at the start of processing cycle 8 and completes the calculation at the end of processing cycle 11, while MAC unit $m_1$ begins the calculation of the last converted output data element $o^4_4$ at the start of processing cycle 14 and completes the calculation at the end of processing cycle 17.

For quadrant $a_{q3}$ of converted input data matrix 214, MAC unit $m_1$ begins the calculation of the first converted output data element $o^1_4$ at the start of processing cycle 15 and completes the calculation at the end of processing cycle 18, while MAC unit $m_{16}$ begins the calculation of the last converted output data element $o^4_4$ at the start of processing cycle 21 and completes the calculation at the end of processing cycle 24. And, for quadrant $a_{q4}$ of converted input data matrix 214, MAC unit $m_1$ begins the calculation of the first converted output data element $o^1_4$ at the start of processing cycle 22 and completes the calculation at the end of processing cycle 25, while MAC unit $m_{16}$ begins the calculation of the last converted output data element $o^4_4$ at the start of processing cycle 28 and completes the calculation at the end of processing cycle 31.

Compared to data flow diagram 302, data flow diagram 402 requires an additional 9 processing cycles to complete the dot product calculations for converted input data matrix 214, i.e., 31 processing cycles as compared to 22 processing cycles.

For read cycles 1 to 7, the WordLineSelect signal is set to a value of 0 to access word line 0.

The initial four elements of quadrant $a_{q1}$ of converted input data matrix 214, i.e., elements $a_1$, $a_8$, $a_8$ and $a_5$, are read at the beginning of processing cycle 1, which corresponds to read cycle 1 depicted in FIG. 4B. For read cycle 1, the ColMuxSelect signal is set to a value of 0, and the following bytes are selected and read from the memory by column multiplexers 440: b0 of word 0 of word line 0 (i.e., $a_1$) by ColMux 0, b3 of word 1 of word line 0 (i.e., $a_8$) by ColMux 1, b2 of word 2 of word line 0 (i.e., $a_8$) by ColMux 2, and b1 of word 3 of word line 0 (i.e., $a_5$) by ColMux 3.

The next four elements of quadrant $a_{q1}$ of converted input data matrix 214, i.e., elements $a_2$, $a_2$, $a_9$ and $a_9$, are read at the beginning of processing cycle 2, which corresponds to read cycle 2 depicted in FIG. 4B. For read cycle 2, the ColMuxSelect signal is set to a value of 1, and the following bytes are selected and read from the memory by column multiplexers 440: b1 of word 0 of word line 0 (i.e., $a_2$) by ColMux 0, b0 of word 1 of word line 0 (i.e., $a_2$) by ColMux 1, b3 of word 2 of word line 0 (i.e., $a_9$) by ColMux 2, and b2 of word 3 of word line 0 (i.e., $a_9$) by ColMux 3.

The next four elements of quadrant $a_{q1}$ of converted input data matrix 214, i.e., elements $a_6$, $a_3$, $a_3$ and $a_{10}$, are read at the beginning of processing cycle 3, which corresponds to read cycle 3 depicted in FIG. 4B. For read cycle 3, the ColMuxSelect signal is set to a value of 2, and the following bytes are selected and read from the memory by column multiplexers 440: b2 of word 0 of word line 0 (i.e., $a_6$) by ColMux 0, b1 of word 1 of word line 0 (i.e., $a_3$) by ColMux 1, b0 of word 2 of word line 0 (i.e., $a_3$) by ColMux 2, and b3 of word 3 of word line 0 (i.e., $a_{10}$) by ColMux 3.

The next four elements of quadrant $a_{q1}$ of converted input data matrix 214, i.e., elements $a_7$, $a_7$, $a_4$ and $a_4$, are read at the beginning of processing cycle 4, which corresponds to read cycle 4 depicted in FIG. 4B. For read cycle 4, the ColMuxSelect signal is set to a value of 3, and the following bytes are selected and read from the memory by column multiplexers 340: b3 of word 0 of word line 0 (i.e., $a_7$) by ColMux 0, b2 of word 1 of word line 0 (i.e., $a_7$) by ColMux 1, b1 of word 2 of word line 0 (i.e., $a_4$) by ColMux 2, and b0 of word 3 of word line 0 (i.e., $a_4$) by ColMux 3.

The next four elements of quadrant $a_{q1}$ of converted input data matrix 214, i.e., elements $a_1$, $a_8$, $a_8$ and $a_5$, are read at the beginning of processing cycle 5, which corresponds to read cycle 5 depicted in FIG. 4B. For read cycle 5, the ColMuxSelect signal is set to a value of 0, and the following bytes are selected and read from the memory by column multiplexers 440: b0 of word 0 of word line 0 (i.e., $a_1$) by ColMux 0, b3 of word 1 of word line 0 (i.e., $a_8$) by ColMux 1, b2 of word 2 of word line 0 (i.e., $a_8$) by ColMux 2, and b1 of word 3 of word line 0 (i.e., $a_5$) by ColMux 3. Read cycle 5 reads the same elements of quadrant $a_{q1}$ of converted input data matrix 214 as read cycle 1 because the Word-LineSelect signal and the ColMuxSelect signal are set to the same values.

The next four elements of quadrant $a_{q1}$ of converted input data matrix 214, i.e., elements $a_2$, $a_2$, $a_9$ and $a_9$, are read at the beginning of processing cycle 6, which corresponds to read cycle 6 depicted in FIG. 4B. For read cycle 6, the ColMuxSelect signal is set to a value of 1, and the following bytes are selected and read from the memory by column multiplexers 440: b1 of word 0 of word line 0 (i.e., $a_2$) by ColMux 0, b0 of word 1 of word line 0 (i.e., $a_2$) by ColMux 1, b3 of word 2 of word line 0 (i.e., $a_9$) by ColMux 2, and b2 of word 3 of word line 0 (i.e., $a_9$) by ColMux 3. Read cycle 6 reads the same elements of quadrant $a_{q1}$ of converted input data matrix 214 as read cycle 2 because the WordLineSelect signal and the ColMuxSelect signal are set to the same values.

The last four elements of quadrant $a_{q1}$ of converted input data matrix 214, i.e., elements $a_6$, $a_3$, $a_3$ and $a_{10}$, are read at the beginning of processing cycle 7, which corresponds to read cycle 7 depicted in FIG. 4B. For read cycle 7, the ColMuxSelect signal is set to a value of 2, and the following bytes are selected and read from the memory by column multiplexers 440: b2 of word 0 of word line 0 (i.e., $a_6$) by ColMux 0, b1 of word 1 of word line 0 (i.e., $a_3$) by ColMux 1, b0 of word 2 of word line 0 (i.e., $a_3$) by ColMux 2, and b3 of word 3 of word line 0 (i.e., $a_{10}$) by ColMux 3. Read cycle 7 reads the same elements of quadrant $a_{q1}$ of converted input data matrix 214 as read cycle 3 because the WordLineSelect signal and the ColMuxSelect signal are set to the same values.

For read cycles 8 to 14, the WordLineSelect signal is set to a value of 1 to access word line 1.

The initial four elements of quadrant $a_{q2}$ of converted input data matrix 214, i.e., elements $a_6$, $a_{13}$, $a_{13}$ and $a_{10}$, are read at the beginning of processing cycle 8, which corresponds to read cycle 8 depicted in FIG. 4B. For read cycle 8, the ColMuxSelect signal is set to a value of 0, and the following bytes are selected and read from the memory by column multiplexers 440: b0 of word 0 of word line 1 (i.e., $a_6$) by ColMux 0, b3 of word 1 of word line 1 (i.e., $a_{13}$) by ColMux 1, b2 of word 2 of word line 1 (i.e., $a_{13}$) by ColMux 2, and b1 of word 3 of word line 1 (i.e., $a_{10}$) by ColMux 3.

The next four elements row of quadrant $a_{q2}$ of converted input data matrix 214, i.e., elements $a_7$, $a_7$, $a_{14}$ and $a_{14}$, are read at the beginning of processing cycle 9, which corresponds to read cycle 9 depicted in FIG. 4B. For read cycle 9, the ColMuxSelect signal is set to a value of 1, and the following bytes are selected and read from the memory by column multiplexers 440: b1 of word 0 of word line 1 (i.e., $a_7$) by ColMux 0, b0 of word 1 of word line 1 (i.e., $a_7$) by ColMux 1, b3 of word 2 of word line 1 (i.e., $a_{14}$) by ColMux 2, and b2 of word 3 of word line 1 (i.e., $a_{14}$) by ColMux 3.

The next four elements of quadrant $a_{q2}$ of converted input data matrix 214, i.e., elements $a_{11}$, $a_8$, $a_8$ and $a_{15}$, are read at the beginning of processing cycle 10, which corresponds to read cycle 10 depicted in FIG. 4B. For read cycle 10, the ColMuxSelect signal is set to a value of 2, and the following bytes are selected and read from the memory by column multiplexers 440: b2 of word 0 of word line 1 (i.e., $a_{11}$) by ColMux 0, b1 of word 1 of word line 1 (i.e., $a_8$) by ColMux 1, b0 of word 2 of word line 1 (i.e., $a_8$) by ColMux 2, and b3 of word 3 of word line 1 (i.e., $a_{15}$) by ColMux 3.

The next four elements of quadrant $a_{q2}$ of converted input data matrix 214, i.e., elements $a_{12}$, $a_{12}$, $a_9$ and $a_9$, are read at the beginning of processing cycle 11, which corresponds to read cycle 11 depicted in FIG. 4B. For read cycle 11, the ColMuxSelect signal is set to a value of 3, and the following bytes are selected and read from the memory by column multiplexers 440: b3 of word 0 of word line 1 (i.e., $a_{12}$) by ColMux 0, b2 of word 1 of word line 1 (i.e., $a_{12}$) by ColMux 1, b1 of word 2 of word line 1 (i.e., $a_9$) by ColMux 2, and b0 of word 3 of word line 1 (i.e., $a_9$) by ColMux 3.

The next four elements of quadrant $a_{q2}$ of converted input data matrix 214, i.e., elements $a_6$, $a_{13}$, $a_{13}$ and $a_{10}$, are read at the beginning of processing cycle 12, which corresponds to read cycle 12 depicted in FIG. 4B. For read cycle 12, the ColMuxSelect signal is set to a value of 0, and the following bytes are selected and read from the memory by column multiplexers 440: b0 of word 0 of word line 1 (i.e., $a_6$) by ColMux 0, b3 of word 1 of word line 1 (i.e., $a_{13}$) by ColMux 1, b2 of word 2 of word line 1 (i.e., $a_{13}$) by ColMux 2, and b1 of word 3 of word line 1 (i.e., $a_{10}$) by ColMux 3. Read cycle 12 reads the same elements of quadrant $a_{q2}$ of converted input data matrix 214 as read cycle 8 because the WordLineSelect signal and the ColMuxSelect signal are set to the same values.

The next four elements of quadrant $a_{q2}$ of converted input data matrix 214, i.e., elements $a_7$, $a_7$, $a_{14}$ and $a_{14}$, are read at the beginning of processing cycle 13, which corresponds to read cycle 13 depicted in FIG. 4B. For read cycle 13, the ColMuxSelect signal is set to a value of 1, and the following bytes are selected and read from the memory by column multiplexers 440: b1 of word 0 of word line 1 (i.e., $a_7$) by ColMux 0, b0 of word 1 of word line 1 (i.e., $a_7$) by ColMux 1, b3 of word 2 of word line 1 (i.e., $a_{14}$) by ColMux 2, and b2 of word 3 of word line 1 (i.e., $a_{14}$) by ColMux 3. Read cycle 13 reads the same elements of quadrant $a_{q2}$ of converted input data matrix 214 as read cycle 9 because the WordLineSelect signal and the ColMuxSelect signal are set to the same values.

The last four elements of quadrant $a_{q2}$ of converted input data matrix 214, i.e., elements $a_{11}$, $a_8$, $a_8$ and $a_{15}$, are read at the beginning of processing cycle 14, which corresponds to read cycle 14 depicted in FIG. 4B. For read cycle 14, the ColMuxSelect signal is set to a value of 2, and the following bytes are selected and read from the memory by column multiplexers 440: b2 of word 0 of word line 1 (i.e., $a_{11}$) by ColMux 0, b1 of word 1 of word line 1 (i.e., $a_8$) by ColMux 1, b0 of word 2 of word line 1 (i.e., $a_8$) by ColMux 2, and b3 of word 3 of word line 1 (i.e., $a_{15}$) by ColMux 3. Read cycle 14 reads the same elements of quadrant $a_{q2}$ of converted input data matrix 214 as read cycle 10 because the WordLineSelect signal and the ColMuxSelect signal are set to the same values.

For read cycles 15 to 21, the WordLineSelect signal is set to a value of 2 to access word line 2.

The initial four elements of quadrant $a_{q3}$ of converted input data matrix 214, i.e., elements $a_{11}$, $a_{18}$, $a_{18}$ and $a_{15}$, are read at the beginning of processing cycle 15, which corresponds to read cycle 15 depicted in FIG. 4B. For read cycle 15, the ColMuxSelect signal is set to a value of 0, and the following bytes are selected and read from the memory by column multiplexers 440: b0 of word 0 of word line 2 (i.e., $a_{11}$) by ColMux 0, b3 of word 1 of word line 2 (i.e., $a_{18}$) by ColMux 1, b2 of word 2 of word line 2 (i.e., $a_{18}$) by ColMux 2, and b1 of word 3 of word line 2 (i.e., $a_{15}$) by ColMux 3.

The next four elements row of quadrant $a_{q3}$ of converted input data matrix 214, i.e., elements $a_{12}$, $a_{12}$, $a_{19}$ and $a_{19}$, are read at the beginning of processing cycle 16, which corresponds to read cycle 16 depicted in FIG. 4B. For read cycle 16, the ColMuxSelect signal is set to a value of 1, and the following bytes are selected and read from the memory by column multiplexers 440: b1 of word 0 of word line 2 (i.e., $a_{12}$) by ColMux 0, b0 of word 1 of word line 2 (i.e., $a_{12}$) by ColMux 1, b3 of word 2 of word line 2 (i.e., $a_{19}$) by ColMux 2, and b2 of word 3 of word line 2 (i.e., $a_{19}$) by ColMux 3.

The next four elements of quadrant $a_{q3}$ of converted input data matrix 214, i.e., elements $a_{16}$, $a_{13}$, $a_{13}$ and $a_{20}$, are read at the beginning of processing cycle 17, which corresponds to read cycle 17 depicted in FIG. 4B. For read cycle 17, the ColMuxSelect signal is set to a value of 2, and the following bytes are selected and read from the memory by column multiplexers 440: b2 of word 0 of word line 2 (i.e., $a_{16}$) by ColMux 0, b1 of word 1 of word line 2 (i.e., $a_{13}$) by ColMux 1, b0 of word 2 of word line 2 (i.e., $a_{13}$) by ColMux 2, and b3 of word 3 of word line 2 (i.e., $a_{20}$) by ColMux 3.

The next four elements of quadrant $a_{q3}$ of converted input data matrix 214, i.e., elements $a_{17}$, $a_{17}$, $a_{14}$ and $a_{14}$, are read at the beginning of processing cycle 18, which corresponds to read cycle 18 depicted in FIG. 4B. For read cycle 18, the ColMuxSelect signal is set to a value of 3, and the following bytes are selected and read from the memory by column multiplexers 440: b3 of word 0 of word line 2 (i.e., $a_{17}$) by ColMux 0, b2 of word 1 of word line 2 (i.e., $a_{17}$) by ColMux 1, b1 of word 2 of word line 2 (i.e., $a_{14}$) by ColMux 2, and b0 of word 3 of word line 2 (i.e., $a_{14}$) by ColMux 3.

The next four elements of quadrant $a_{q3}$ of converted input data matrix 214, i.e., elements $a_{11}$, $a_{18}$, $a_{18}$ and $a_{15}$, are read at the beginning of processing cycle 19, which corresponds to read cycle 19 depicted in FIG. 4B. For read cycle 19, the ColMuxSelect signal is set to a value of 0, and the following bytes are selected and read from the memory by column multiplexers 440: b0 of word 0 of word line 1 (i.e., $a_{11}$) by ColMux 0, b3 of word 1 of word line 1 (i.e., $a_{18}$) by ColMux 1, b2 of word 2 of word line 1 (i.e., $a_{18}$) by ColMux 2, and b1 of word 3 of word line 1 (i.e., $a_{15}$) by ColMux 3. Read cycle 19 reads the same elements of quadrant $a_{q3}$ of converted input data matrix 214 as read cycle 15 because the WordLineSelect signal and the ColMuxSelect signal are set to the same values.

The next four elements of quadrant $a_{q3}$ of converted input data matrix 214, i.e., elements $a_{12}$, $a_{12}$, $a_{19}$ and $a_{19}$, are read at the beginning of processing cycle 20, which corresponds to read cycle 20 depicted in FIG. 4B. For read cycle 20, the ColMuxSelect signal is set to a value of 1, and the following bytes are selected and read from the memory by column multiplexers 440: b1 of word 0 of word line 2 (i.e., $a_{12}$) by ColMux 0, b0 of word 1 of word line 2 (i.e., $a_{12}$) by ColMux 1, b3 of word 2 of word line 2 (i.e., $a_{19}$) by ColMux 2, and b2 of word 3 of word line 2 (i.e., $a_{19}$) by ColMux 3. Read cycle 20 reads the same elements of quadrant $a_{q2}$ of converted input data matrix 214 as read cycle 16 because the WordLineSelect signal and the ColMuxSelect signal are set to the same values.

The last four elements of quadrant $a_{q3}$ of converted input data matrix 214, i.e., elements $a_{16}$, $a_{13}$, $a_{13}$ and $a_{20}$, are read at the beginning of processing cycle 21, which corresponds to read cycle 21 depicted in FIG. 4B. For read cycle 21, the ColMuxSelect signal is set to a value of 2, and the following bytes are selected and read from the memory by column multiplexers 440: b2 of word 0 of word line 2 (i.e., $a_{16}$) by ColMux 0, b1 of word 1 of word line 2 (i.e., $a_{13}$) by ColMux 1, b0 of word 2 of word line 2 (i.e., $a_{13}$) by ColMux 2, and b3 of word 3 of word line 2 (i.e., $a_{20}$) by ColMux 3. Read cycle 21 reads the same elements of quadrant $a_{q2}$ of converted input data matrix 214 as read cycle 17 because the WordLineSelect signal and the ColMuxSelect signal are set to the same values.

For read cycles 22 to 28, the WordLineSelect signal is set to a value of 3 to access word line 3.

The initial four elements of quadrant $a_{q4}$ of converted input data matrix 214, i.e., elements $a_{16}$, $a_{23}$, $a_{23}$ and $a_{20}$, are read at the beginning of processing cycle 22, which corresponds to read cycle 22 depicted in FIG. 4B. For read cycle 22, the ColMuxSelect signal is set to a value of 0, and the following bytes are selected and read from the memory by column multiplexers 440: b0 of word 0 of word line 3 (i.e., $a_{16}$) by ColMux 0, b3 of word 1 of word line 3 (i.e., $a_{23}$) by ColMux 1, b2 of word 2 of word line 3 (i.e., $a_{23}$) by ColMux 2, and b1 of word 3 of word line 3 (i.e., $a_{20}$) by ColMux 3.

The next four elements row of quadrant $a_{q4}$ of converted input data matrix 214, i.e., elements $a_{17}$, $a_{17}$, $a_{24}$ and $a_{24}$, are read at the beginning of processing cycle 23, which corresponds to read cycle 23 depicted in FIG. 4B. For read cycle 23, the ColMuxSelect signal is set to a value of 1, and the following bytes are selected and read from the memory by column multiplexers 440: b1 of word 0 of word line 3 (i.e., $a_{17}$) by ColMux 0, b0 of word 1 of word line 3 (i.e., $a_{17}$) by ColMux 1, b3 of word 2 of word line 3 (i.e., $a_{24}$) by ColMux 2, and b2 of word 3 of word line 3 (i.e., $a_{24}$) by ColMux 3.

The next four elements of quadrant $a_{q4}$ of converted input data matrix 214, i.e., elements $a_{21}$, $a_{18}$, $a_{18}$ and $a_{25}$, are read at the beginning of processing cycle 24, which corresponds to read cycle 24 depicted in FIG. 4B. For read cycle 24, the ColMuxSelect signal is set to a value of 2, and the following bytes are selected and read from the memory by column multiplexers 440: b2 of word 0 of word line 3 (i.e., $a_{21}$) by ColMux 0, b1 of word 1 of word line 3 (i.e., $a_{18}$) by ColMux 1, b0 of word 2 of word line 3 (i.e., $a_{18}$) by ColMux 2, and b3 of word 3 of word line 3 (i.e., $a_{25}$) by ColMux 3.

The next four elements of quadrant $a_{q4}$ of converted input data matrix 214, i.e., elements $a_{22}$, $a_{22}$, $a_{19}$ and $a_{19}$, are read at the beginning of processing cycle 25, which corresponds to read cycle 25 depicted in FIG. 4B. For read cycle 25, the ColMuxSelect signal is set to a value of 3, and the following bytes are selected and read from the memory by column multiplexers 440: b3 of word 0 of word line 3 (i.e., $a_{22}$) by ColMux 0, b2 of word 1 of word line 3 (i.e., $a_{22}$) by ColMux 1, b1 of word 2 of word line 3 (i.e., $a_{19}$) by ColMux 2, and b0 of word 3 of word line 3 (i.e., $a_{19}$) by ColMux 3.

The next four elements of quadrant $a_{q4}$ of converted input data matrix 214, i.e., elements $a_{16}$, $a_{23}$, $a_{23}$ and $a_{20}$, are read at the beginning of processing cycle 26, which corresponds to read cycle 26 depicted in FIG. 4B. For read cycle 26, the ColMuxSelect signal is set to a value of 0, and the following bytes are selected and read from the memory by column multiplexers 440: b0 of word 0 of word line 3 (i.e., $a_{16}$) by ColMux 0, b3 of word 1 of word line 3 (i.e., $a_{23}$) by ColMux 1, b2 of word 2 of word line 3 (i.e., $a_{23}$) by ColMux 2, and b1 of word 3 of word line 3 (i.e., $a_{20}$) by ColMux 3. Read cycle 26 reads the same elements of quadrant $a_{q3}$ of converted input data matrix 214 as read cycle 22 because the WordLineSelect signal and the ColMuxSelect signal are set to the same values.

The next four elements of quadrant $a_{q4}$ of converted input data matrix 214, i.e., elements $a_{17}$, $a_{17}$, $a_{24}$ and $a_{24}$, are read at the beginning of processing cycle 27, which corresponds to read cycle 27 depicted in FIG. 4B. For read cycle 27, the ColMuxSelect signal is set to a value of 1, and the following bytes are selected and read from the memory by column multiplexers 440: b1 of word 0 of word line 3 (i.e., $a_{17}$) by ColMux 0, b0 of word 1 of word line 3 (i.e., $a_{17}$) by ColMux 1, b3 of word 2 of word line 3 (i.e., $a_{24}$) by ColMux 2, and b2 of word 3 of word line 3 (i.e., $a_{24}$) by ColMux 3. Read cycle 27 reads the same elements of quadrant $a_{q2}$ of converted input data matrix 214 as read cycle 23 because the WordLineSelect signal and the ColMuxSelect signal are set to the same values.

The last four elements of quadrant $a_{q4}$ of converted input data matrix 214, i.e., elements $a_{21}$, $a_{18}$, $a_{18}$ and $a_{25}$, are read at the beginning of processing cycle 28, which corresponds to read cycle 28 depicted in FIG. 4B. For read cycle 28, the ColMuxSelect signal is set to a value of 2, and the following bytes are selected and read from the memory by column multiplexers 440: b2 of word 0 of word line 3 (i.e., $a_{21}$) by ColMux 0, b1 of word 1 of word line 3 (i.e., $a_{18}$) by ColMux 1, b0 of word 2 of word line 3 (i.e., $a_{18}$) by ColMux 2, and b3 of word 3 of word line 3 (i.e., $a_{25}$) by ColMux 3. Read cycle 28 reads the same elements of quadrant $a_{q2}$ of converted input data matrix 214 as read cycle 24 because the WordLineSelect signal and the ColMuxSelect signal are set to the same values.

FIG. 4C depicts a word selector or multiplexer mapping diagram 404 for a memory for an ANN accelerator, in accordance with an embodiment of the present disclosure.

As described above, the memory may include four column multiplexers 440 associated with read operations, and four column multiplexers 450 associated with write operations. Multiplexer mapping diagram 404 illustrates the mapping between the "read" ColMuxSelect signal values (i.e., 0, 1, 2 and 3) and the bytes 330 of each word 320, as well as the mapping between the "write" ColMuxSelect signal values (i.e., 0, 1, 2 and 3) and the bytes 330 of each word 320.

A "read" ColMuxSelect signal value of 0 selects input port 0 of column multiplexers 440. Input port 0 of the first column multiplexer 440 (i.e., ColMux 0) is coupled 442 to byte 0 of word 0, input port 0 of the second column multiplexer 440 (i.e., ColMux 1) is coupled 442 to byte 3 of word 1, input port 0 of the third column multiplexer 440 (i.e., ColMux 2) is coupled 442 to byte 2 of word 2, and input port 0 of the fourth column multiplexer 440 (i.e., ColMux 3) is coupled 442 to byte 1 of word 3.

A "read" ColMuxSelect signal value of 1 selects input port 1 of each column multiplexer 440. Input port 1 of the first column multiplexer 440 (i.e., ColMux 0) is coupled 442 to byte 1 of word 0, input port 1 of the second column multiplexer 440 (i.e., ColMux 1) is coupled 442 to byte 0 of word 1, input port 1 of the third column multiplexer 440 (i.e., ColMux 2) is coupled 442 to byte 3 of word 2, and input port 1 of the fourth column multiplexer 440 (i.e., ColMux 3) is coupled 442 to byte 2 of word 3.

A "read" ColMuxSelect signal value of 2 selects input port 2 of each column multiplexer 440. Input port 2 of the first column multiplexer 440 (i.e., ColMux 0) is coupled 442 to byte 2 of word 0, input port 2 of the second column multiplexer 440 (i.e., ColMux 1) is coupled 442 to byte 1 of word 1, input port 2 of the third column multiplexer 440 (i.e., ColMux 2) is coupled 442 to byte 0 of word 2, and input port 2 of the fourth column multiplexer 440 (i.e., ColMux 3) is coupled 442 to byte 3 of word 3.

A "read" ColMuxSelect signal value of 3 selects input port 3 of each column multiplexer 440. Input port 3 of the first column multiplexer 440 (i.e., ColMux 0) is coupled 442 to byte 3 of word 0, input port 3 of the second column multiplexer 440 (i.e., ColMux 1) is coupled 442 to byte 2 of word 1, input port 3 of the third column multiplexer 440 (i.e., ColMux 2) is coupled 442 to byte 1 of word 2, and input port 3 of the fourth column multiplexer 440 (i.e., ColMux 3) is coupled 442 to byte 0 of word 3.

A "write" ColMuxSelect signal value of 0 selects output port 0 of each column multiplexer 450, and, as illustrated in FIG. 4C, each output port 0 of each column multiplexer 450 is coupled 452 to byte 0 of word 0, 1, 2 or 3. A "write" ColMuxSelect signal value of 1 selects output port 1 of each column multiplexer 450, and each output port 1 of each column multiplexer 450 is coupled 452 to byte 1 of word 0, 1, 2 or 3. A "write" ColMuxSelect signal value of 2 selects output port 2 of each column multiplexer 450, and each output port 2 of each column multiplexer 450 is coupled 452 to byte 2 of word 0, 1, 2 or 3. And, a "write" ColMuxSelect signal value of 3 selects output port 3 of each column multiplexer 450, and each output port 3 of each column multiplexer 450 is coupled 352 to byte 3 of word 0, 1, 2 or 3.

Generally, for a memory with two banks, the number of bytes per word must be less than or equal to the number of bytes per row plus 1. Memories with larger word sizes require additional memory banks and larger systolic MAC arrays. For example, a 64-bit memory uses 8 bytes per word, three banks and an 8×8 MAC array, and most read cycles access three banks at the same time.

FIG. 5A depicts a block diagram 500 of a memory for an ANN accelerator, in accordance with an embodiment of the present disclosure.

Block diagram 500 depicts a portion of a multi-bank memory, such as, for example, a conventional, 32-bit static random-access memory (SRAM). Similar to the memory depicted in FIG. 4A, the size of a word is 32 bits or 4 bytes. Banks 510 and 511 are depicted for illustration purposes. Bank 510 has at least two rows or word lines 410, i.e., word line 0, word line 1, etc., while bank 511 has at least two rows or word lines 411, i.e., word line 0, word line 1, etc. Each word line has four, 32-bit words 320, i.e., word 0, word 1, word 2 and word 3, and each 32-bit word has 4 bytes 330, i.e., b0, b1, b2 and b3.

A single access to a conventional 32-bit memory bank may only read (or write) a single word from (or to) a single row of that bank.

For bank 510, a first WordLineSelect signal identifies which row or word line 410 is to be accessed, such as, for example, word line 0, word line 1, etc. A column multiplexer 440 is coupled to the memory cells that store each word 320 of each word line 410, i.e., ColMux 0 is coupled to word 0 of word lines 0, 1, 2 and 3, ColMux 1 is coupled to word 1 of word lines 0, 1, 2 and 3, ColMux 2 is coupled to word 2 of word lines 0, 1, 2 and 3, and ColMux 3 is coupled to word 3 of word lines 0, 1, 2 and 3.

Similarly, for bank 511, a second WordLineSelect signal identifies which row or word line 411 is to be accessed, such as, for example, word line 0, word line 1, etc. A column multiplexer 441 is coupled to the memory cells that store each word 320 of each word line 411, i.e., ColMux 0 is coupled to word 0 of word lines 0, 1, 2 and 3, ColMux 1 is coupled to word 1 of word lines 0, 1, 2 and 3, ColMux 2 is coupled to word 2 of word lines 0, 1, 2 and 3, and ColMux 3 is coupled to word 3 of word lines 0, 1, 2 and 3.

In this embodiment, column multiplexers 440, 441 are associated with a memory read operation. Each "read" column multiplexer 440, 441 has four 8-bit input ports and one 8-bit output port, and each input port is coupled to a different byte 330 of word 320, i.e., b0, b1, b2 or b3. A "read" ColMuxSelect signal identifies which input port of each column multiplexer 440, 441 is to be selected, i.e., a value of 0 selects input port 0, a value of 1 selects input port 1, a value of 2 selects input port 2, and a value of 3 selects input port 3. The output port of each column multiplexer 440, 441 outputs the value of the byte coupled to the selected input port, and the byte values are then formed into the word to be read, i.e., ColMux 0 provides the first byte, ColMux 1 provides the second byte, ColMux 2 provides the third byte, and ColMux 3 provides the fourth byte.

In this embodiment, each input port of each column multiplexer 440, 441 is coupled to a different byte of the associated word as follows. For ColMux 0 in banks 510 and 511, input port 0 is coupled to b0 of word 0 of word lines 0, 1, etc., input port 1 is coupled to b1 of word 0 of word lines 0, 1, etc., input port 2 is coupled to b2 of word 0 of word lines 0, 1, etc., and input port 3 is coupled to b3 of word 0 of word lines 0, 1, etc. For ColMux 1 in banks 510 and 511, input port 0 is coupled to b3 of word 1 of word lines 0, 1, etc., input port 1 is coupled to b0 of word 1 of word lines 0, 1, etc., input port 2 is coupled to b1 of word 1 of word lines 0, 1, etc., and input port 3 is coupled to b2 of word 1 of word lines 0, 1, etc. For ColMux 2 in banks 510 and 511, input port 0 is coupled to b2 of word 2 of word lines 0, 1, etc., input port 1 is coupled to b3 of word 2 of word lines 0, 1, etc., input port 2 is coupled to b0 of word 2 of word lines 0, 1, etc., and input port 3 is coupled to b1 of word 2 of word lines 0, 1, etc. And, for ColMux 3 in banks 510 and 511, input port 0 is coupled to b1 of word 3 of word lines 0, 1, etc., input port 1 is coupled to b2 of word 3 of word lines 0, 1, etc., input port 2 is coupled to b3 of word 3 of word lines 0, 1, etc., and input port 3 is coupled to b0 of word 3 of word lines 0, 1, etc.

Read bank multiplexers 444, i.e., RMux 0, RMux 1, RMux 2 and RMux 3, are coupled to column multiplexers 440 of bank 510 and column multiplexers 441 of bank 511. Each read bank multiplexer 444 includes two 8-bit input ports and one 8-bit output port. The input ports of RMux 0 are coupled to ColMux 0 of bank 510 and ColMux 0 of bank 511, the input ports of RMux 1 are coupled to ColMux 1 of bank 510 and ColMux 1 of bank 511, the input ports of RMux 2 are coupled to ColMux 2 of bank 510 and ColMux 2 of bank 511, and the input ports of RMux 3 are coupled to ColMux 3 of bank 510 and ColMux 3 of bank 511.

A ReadBankMuxSelect signal identifies which column multiplexer 440, 441 is to be selected for each byte to be read. In one embodiment, the ReadBankMuxSelect signal includes 4 bits, each bit corresponding to a different read bank multiplexer 444. The most significant bit (msb) corresponds to RMux 0, the next bit corresponds to RMux 1, the next bit corresponds to RMux 2, and the least significant bit (lsb) corresponds to RMux 3. A value of 0 for a particular bit selects the respective column multiplexer 440 of bank 510, while the value of 1 for a particular bit selects the respective column multiplexer 441 of bank 511.

More particularly, a ReadBankMuxSelect signal having a binary value of 0000 (0 digital) selects the outputs from ColMuxs 0, 1, 2 and 3 of bank 510. A ReadBankMuxSelect signal having a binary value of 1000 (8 digital) selects the outputs from ColMuxs 1, 2 and 3 of bank 510 and the output from ColMux 0 of bank 511. A ReadBankMuxSelect signal having a binary value of 1100 (12 digital) selects the outputs from ColMuxs 2 and 3 of bank 510 and the outputs from ColMuxs 0 and 1 of bank 511. A ReadBankMuxSelect signal having a binary value of 1110 (14 digital) selects the output from ColMux 3 from bank 510 and the outputs from ColMuxs 0, 1 and 2 of bank 511. A ReadBankMuxSelect signal having a binary value of 1111 (15 digital) selects the outputs from ColMuxs 0, 1, 2 and 3 of bank 511.

The output port of each read bank multiplexer 444 provides the output of the selected column multiplexer 440, 441, and the byte values are then formed into the word to be read, i.e., RMux 0 provides the first byte, RMux 1 provides the second byte, RMux 2 provides the third byte, and RMux 3 provides the fourth byte.

As depicted in FIG. 5A, for illustration purposes, converted input data matrix 214 has been stored in word lines 410, 411 of banks 510, 511 of the memory in column-order. Each word line 410, 411 stores one quadrant of converted input data matrix 214, i.e., word line 0 of bank 510 stores quadrant $a_{q1}$, word line 1 of bank 510 stores quadrant $a_{q3}$, word line 0 of bank 511 stores quadrant $a_{q2}$, and word line 1 of bank 511 stores quadrant $a_{q4}$. Converted weight matrix 212 may be similarly be stored in two different banks of the memory in row-order (rather than column-order).

In this embodiment, additional column multiplexers 450, 451 (depicted in FIG. 5C; not depicted in FIG. 5A for clarity) may be associated with a memory write operation, as described above. Other memory characteristics, such as, for example, different sized words (e.g., 64 bits, etc.), different numbers of column multiplexers (e.g., 2, 8, 16, etc.), etc., are also contemplated.

FIG. 5B depicts a data flow diagram 502 for a sequence of read operations from a memory of an ANN accelerator, in accordance with an embodiment of the present disclosure.

In this embodiment, seven processing cycles are needed to read all of the elements from each quadrant of converted input data matrix 214, and 19 processing cycles are needed to read all four quadrants of converted input data matrix 214. During each read cycle, four elements from one quadrant or a combination of elements from two quadrants of converted input data matrix 214 are read from banks 510, 511 of the memory.

With respect to converted convolution operation 211 described above, for quadrant $a_{q1}$ of converted input data matrix 214, MAC unit $m_1$ begins the calculation of the first converted output data element $o^1_4$ at the start of processing cycle 1 and completes the calculation at the end of processing cycle 4, while MAC unit $m_1$ begins the calculation of the last converted output data element $o^4_4$ at the start of processing cycle 7 and completes the calculation at the end of processing cycle 10. For quadrant $a_{q2}$ of converted input data matrix 214, MAC unit $m_1$ begins the calculation of the first converted output data element $o^1_4$ at the start of processing cycle 5 and completes the calculation at the end of processing cycle 8, while MAC unit $m_1$ begins the calculation of the last converted output data element $o^4_4$ at the start of processing cycle 11 and completes the calculation at the end of processing cycle 14.

For quadrant $a_{q3}$ of converted input data matrix 214, MAC unit $m_1$ begins the calculation of the first converted output data element $o^1_4$ at the start of processing cycle 9 and completes the calculation at the end of processing cycle 12, while MAC unit $m_{16}$ begins the calculation of the last converted output data element $o^4_4$ at the start of processing cycle 15 and completes the calculation at the end of processing cycle 18. And, for quadrant $a_{q4}$ of converted input data matrix 214, MAC unit $m_1$ begins the calculation of the first converted output data element $o^1_4$ at the start of processing cycle 13 and completes the calculation at the end of processing cycle 16, while MAC unit $m_{16}$ begins the calculation of the last converted output data element $o^4_4$ at the start of processing cycle 19 and completes the calculation at the end of processing cycle 22.

Compared to data flow diagram 302, data flow diagram 502 advantageously requires the same number of processing cycles to complete the dot product calculations for converted input data matrix 214, i.e., 22 processing cycles, without the need for delay registers or $ff_1$ blocks which cost power and circuit area proportional to the size of the array.

For read cycles 1 to 4, the WordLineSelect signal for bank 510 is set to a value of 0 to access word line 0, and the WordLineSelect signal for bank 511 is set to a value of 0 to access word line 0.

The initial four elements of quadrant $a_{q1}$ of converted input data matrix 214, i.e., elements $a_1$, $a_8$, $a_8$ and $a_5$, are read at the beginning of processing cycle 1, which corresponds to read cycle 1 depicted in FIG. 5B. As discussed above, elements $a_8$, $a_8$ and $a_5$ may be read and not provided to MAC array 228, or the sense amplifiers associated with the column multiplexers for these elements may be disabled to prevent reading the memory cells in which these elements are stored. For read cycle 1, the ReadBankMuxSelect signal is set to a binary value of 0000 (0 digital), the ColMuxSelect signals for column multiplexers 440, 441 are set to a value of 0, and the following bytes are selected and read from the memory by column multiplexers 440 and/or column multiplexers 441: b0 of word 0 of word line 0 (i.e., $a_1$) by ColMux 0 of bank 510, b3 of word 1 of word line 0 (i.e., $a_8$) by ColMux 1 of bank 510, b2 of word 2 of word line 0 (i.e., $a_8$) by ColMux 2 of bank 510, and b1 of word 3 of word line 0 (i.e., $a_5$) by ColMux 3 of bank 510.

The next four elements of quadrant $a_{q1}$ of converted input data matrix 214, i.e., elements $a_2$, $a_2$, $a_9$ and $a_9$, are read at the beginning of processing cycle 2, which corresponds to read cycle 2 depicted in FIG. 5B. As discussed above, elements $a_9$ and $a_9$ may be read and not provided to MAC array 228, or the sense amplifiers associated with the column multiplexers for these elements may be disabled to prevent reading the memory cells in which these elements are stored. For read cycle 2, the ReadBankMuxSelect signal is set to a binary value of 0000 (0 digital), the ColMuxSelect signals for column multiplexers 440, 441 are set to a value of 1, and the following bytes are selected and read from the memory by column multiplexers 440 and/or column multiplexers 441: b1 of word 0 of word line 0 (i.e., $a_2$) by ColMux 0 of bank 510, b0 of word 1 of word line 0 (i.e., $a_2$) by ColMux 1 of bank 510, b3 of word 2 of word line 0 (i.e., $a_9$) by ColMux 2 of bank 510, and b2 of word 3 of word line 0 (i.e., $a_9$) by ColMux 3 of bank 510.

The next four elements of quadrant $a_{q1}$ of converted input data matrix 214, i.e., elements $a_6$, $a_3$, $a_3$ and $a_{10}$, are read at the beginning of processing cycle 3, which corresponds to read cycle 3 depicted in FIG. 5B. As discussed above, element $a_{10}$ may be read and not provided to MAC array 228, or the sense amplifiers associated with the column multiplexers for this element may be disabled to prevent reading the memory cells in which this element are stored. For read cycle 3, the ReadBankMuxSelect signal is set to a binary value of 0000 (0 digital), the ColMuxSelect signals for column multiplexers 440, 441 are set to a value of 2, and the following bytes are selected and read from the memory by column multiplexers 440 and/or column multiplexers 441: b2 of word 0 of word line 0 (i.e., $a_6$) by ColMux 0 of bank 510, b1 of word 1 of word line 0 (i.e., $a_3$) by ColMux 1 of bank 510, b0 of word 2 of word line 0 (i.e., $a_3$) by ColMux 2 of bank 510, and b3 of word 3 of word line 0 (i.e., $a_{10}$) by ColMux 3 of bank 510.

The next four elements of quadrant $a_{q1}$ of converted input data matrix 214, i.e., elements $a_7$, $a_7$, $a_4$ and $a_4$, are read at the beginning of processing cycle 4, which corresponds to read cycle 4 depicted in FIG. 5B. For read cycle 4, the ReadBankMuxSelect signal is set to a binary value of 0000 (0 digital), the ColMuxSelect signals for column multiplexers 440, 441 are set to a value of 3, and the following bytes are selected and read from the memory by column multiplexers 440 and/or column multiplexers 441: b3 of word 0 of word line 0 (i.e., $a_7$) by ColMux 0 of bank 510, b2 of word 1 of word line 0 (i.e., $a_7$) by ColMux 1 of bank 510, b1 of word 2 of word line 0 (i.e., $a_4$) by ColMux 2 of bank 510, and b0 of word 3 of word line 0 (i.e., $a_4$) by ColMux 3 of bank 510.

For read cycles 5 to 8, the WordLineSelect signal for bank 510 is set to a value of 0 to access word line 0, and the WordLineSelect signal for bank 511 is set to a value of 0 to access word line 0 (i.e., the same values as read cycles 1 to 4).

The first element of quadrant $a_{q2}$ of converted input data matrix 214, i.e., element $a_6$, and the next three elements of quadrant $a_{q1}$ of converted input data matrix 214, i.e., elements $a_8$, $a_8$ and $a_5$, are read at the beginning of processing cycle 5, which corresponds to read cycle 5 depicted in FIG. 5B. For read cycle 5, the ReadBankMuxSelect signal is set to a binary value of 1000 (8 digital), the ColMuxSelect signals for column multiplexers 440, 441 are set to a value of 0, and the following bytes are selected and read from the memory by column multiplexers 440 and/or column multiplexers 441: b0 of word 0 of word line 0 (i.e., $a_6$) by ColMux 0 of bank 511, b3 of word 1 of word line 0 (i.e., $a_8$) by ColMux 1 of bank 510, b2 of word 2 of word line 0 (i.e., $a_8$) by ColMux 2 of bank 510, and b1 of word 3 of word line 0 (i.e., $a_5$) by ColMux 3 of bank 510.

The next two elements of quadrant $a_{q2}$ of converted input data matrix 214, i.e., elements $a_7$ and $a_7$, and the next two elements of quadrant $a_{q1}$ of converted input data matrix 214, i.e., elements $a_9$ and $a_9$, are read at the beginning of processing cycle 6, which corresponds to read cycle 6 depicted in FIG. 5B. For read cycle 6, the ReadBankMuxSelect signal is set to a binary value of 1100 (12 digital), the ColMuxSelect signals for column multiplexers 440, 441 are set to a value of 1, and the following bytes are selected and read from the memory by column multiplexers 440 and/or column multiplexers 441: b1 of word 0 of word line 0 (i.e., $a_7$) by ColMux 0 of bank 511, b0 of word 1 of word line 0 (i.e., $a_7$) by ColMux 1 of bank 511, b3 of word 2 of word line 0 (i.e., $a_9$) by ColMux 2 of bank 510, and b2 of word 3 of word line 0 (i.e., $a_9$) by ColMux 3 of bank 510.

The next three elements of quadrant $a_{q2}$ of converted input data matrix 214, i.e., elements $a_{11}$, $a_8$ and $a_8$, and the last element of quadrant $a_{q1}$ of converted input data matrix 214, i.e., element $a_{10}$, are read at the beginning of processing cycle 7, which corresponds to read cycle 7 depicted in FIG. 5B. For read cycle 7, the ReadBankMuxSelect signal is set to a binary value of 1110 (14 digital), the ColMuxSelect signals for column multiplexers 440, 441 are set to a value of 2, and the following bytes are selected and read from the memory by column multiplexers 440 and/or column multiplexers 441: b2 of word 0 of word line 0 (i.e., $a_{11}$) by ColMux 0 of bank 511, b1 of word 1 of word line 0 (i.e., $a_8$) by ColMux 1 of bank 511, b0 of word 2 of word line 0 (i.e., $a_8$) by ColMux 2 of bank 511, and b3 of word 3 of word line 0 (i.e., $a_{10}$) by ColMux 3 of bank 510.

The next four elements of quadrant $a_{q2}$ of converted input data matrix 214, i.e., elements $a_{12}$, $a_{12}$, $a_9$ and $a_9$, are read at the beginning of processing cycle 8, which corresponds to read cycle 8 depicted in FIG. 5B. For read cycle 8, the ReadBankMuxSelect signal is set to a binary value of 1111 (15 digital), the ColMuxSelect signals for column multiplexers 440, 441 are set to a value of 3, and the following bytes are selected and read from the memory by column multiplexers 440 and/or column multiplexers 441: b3 of word 0 of word line 0 (i.e., $a_{12}$) by ColMux 0 of bank 511, b2 of word 1 of word line 0 (i.e., $a_{12}$) by ColMux 1 of bank 511, b1 of word 2 of word line 0 (i.e., $a_9$) by ColMux 2 of bank 511, and b0 of word 3 of word line 0 (i.e., $a_9$) by ColMux 3 of bank 511.

For read cycles 9 to 12, the WordLineSelect signal for bank 510 is set to a value of 1 to access word line 1, and the WordLineSelect signal for bank 511 is set to a value of 0 to access word line 0.

The first element of quadrant $a_{q3}$ of converted input data matrix 214, i.e., element $a_{11}$, and the next three elements of quadrant $a_{q2}$ of converted input data matrix 214, i.e., elements $a_{13}$, $a_{13}$ and $a_{10}$, are read at the beginning of processing cycle 9, which corresponds to read cycle 9 depicted in FIG. 5B. For read cycle 9, the ReadBankMuxSelect signal is set to a binary value of 0111 (7 digital), the ColMuxSelect signals for column multiplexers 440, 441 are set to a value of 0, and the following bytes are selected and read from the memory by column multiplexers 440 and/or column multiplexers 441: b0 of word 0 of word line 1 (i.e., $a_{11}$) by ColMux 0 of bank 510, b3 of word 1 of word line 0 (i.e., $a_{13}$) by ColMux 1 of bank 511, b2 of word 2 of word line 0 (i.e., $a_{13}$) by ColMux 2 of bank 511, and b1 of word 3 of word line 0 (i.e., $a_{10}$) by ColMux 3 of bank 511.

The next two elements of quadrant $a_{q3}$ of converted input data matrix 214, i.e., elements $a_{12}$ and $a_{12}$, and the next two elements of quadrant $a_{q2}$ of converted input data matrix 214, i.e., elements $a_{14}$ and $a_{14}$, are read at the beginning of processing cycle 10, which corresponds to read cycle 10 depicted in FIG. 5B. For read cycle 10, the ReadBankMuxSelect signal is set to a binary value of 0011 (3 digital), the ColMuxSelect signals for column multiplexers 440, 441 are set to a value of 1, and the following bytes are selected and read from the memory by column multiplexers 440 and/or column multiplexers 441: b1 of word 0 of word line 1 (i.e., $a_{12}$) by ColMux 0 of bank 510, b0 of word 1 of word line 1 (i.e., $a_{12}$) by ColMux 1 of bank 510, b3 of word 2 of word line 0 (i.e., $a_{14}$) by ColMux 2 of bank 511, and b2 of word 3 of word line 0 (i.e., $a_{14}$) by ColMux 3 of bank 511.

The next three elements of quadrant $a_{q3}$ of converted input data matrix 214, i.e., elements $a_{16}$, $a_{13}$ and $a_{13}$, and the last element of quadrant $a_{q2}$ of converted input data matrix 214, i.e., element $a_{15}$, are read at the beginning of processing cycle 11, which corresponds to read cycle 11 depicted in FIG. 5B. For read cycle 11, the ReadBankMuxSelect signal is set to a binary value of 0001 (1 digital), the ColMuxSelect signals for column multiplexers 440, 441 are set to a value of 2, and the following bytes are selected and read from the memory by column multiplexers 440 and/or column multiplexers 441: b2 of word 0 of word line 1 (i.e., $a_{16}$) by ColMux 0 of bank 510, b1 of word 1 of word line 1 (i.e., $a_{13}$) by ColMux 1 of bank 510, b0 of word 2 of word line 1 (i.e., $a_{13}$) by ColMux 2 of bank 510, and b3 of word 3 of word line 0 (i.e., $a_{15}$) by ColMux 3 of bank 511.

The next four elements of quadrant $a_{q3}$ of converted input data matrix 214, i.e., elements $a_{17}$, $a_{17}$, $a_{14}$ and $a_{14}$, are read at the beginning of processing cycle 12, which corresponds to read cycle 12 depicted in FIG. 5B. For read cycle 12, the ReadBankMuxSelect signal is set to a binary value of 0000 (0 digital), the ColMuxSelect signals for column multiplexers 440, 441 are set to a value of 3, and the following bytes are selected and read from the memory by column multiplexers 440 and/or column multiplexers 441: b3 of word 0 of word line 1 (i.e., $a_{17}$) by ColMux 0 of bank 510, b2 of word 1 of word line 1 (i.e., $a_{17}$) by ColMux 1 of bank 510, b1 of word 2 of word line 1 (i.e., $a_{14}$) by ColMux 2 of bank 510, and b0 of word 3 of word line 1 (i.e., $a_{14}$) by ColMux 3 of bank 510.

For read cycles 13 to 16, the WordLineSelect signal for bank 510 is set to a value of 1 to access word line 1, and the WordLineSelect signal for bank 511 is set to a value of 1 to access word line 1.

The first element of quadrant $a_{q4}$ of converted input data matrix 214, i.e., element $a_{16}$, and the next three elements of quadrant $a_{q3}$ of converted input data matrix 214, i.e., elements $a_{18}$, $a_{18}$ and $a_{15}$, are read at the beginning of processing cycle 13, which corresponds to read cycle 13 depicted in FIG. 5B. For read cycle 13, the ReadBankMuxSelect signal is set to a binary value of 1000 (8 digital), the ColMuxSelect signals for column multiplexers 440, 441 are set to a value of 0, and the following bytes are selected and read from the memory by column multiplexers 440 and/or column multiplexers 441: b0 of word 0 of word line 1 (i.e., $a_{16}$) by ColMux 0 of bank 511, b3 of word 1 of word line 1 (i.e., $a_{18}$) by ColMux 1 of bank 510, b2 of word 2 of word line 1 (i.e., $a_{18}$) by ColMux 2 of bank 510, and b1 of word 3 of word line 1 (i.e., $a_{15}$) by ColMux 3 of bank 510.

The next two elements of quadrant $a_{q4}$ of converted input data matrix 214, i.e., elements $a_{17}$ and $a_{17}$, and the next two elements of quadrant $a_{q3}$ of converted input data matrix 214, i.e., elements $a_{19}$ and $a_{19}$, are read at the beginning of processing cycle 14, which corresponds to read cycle 14 depicted in FIG. 5B. For read cycle 14, the ReadBankMuxSelect signal is set to a binary value of 1100 (12 digital), the ColMuxSelect signals for column multiplexers 440, 441 are set to a value of 1, and the following bytes are selected and read from the memory by column multiplexers 440 and/or column multiplexers 441: b1 of word 0 of word line 1 (i.e., $a_{17}$) by ColMux 0 of bank 511, b0 of word 1 of word line 1 (i.e., $a_{17}$) by ColMux 1 of bank 511, b3 of word 2 of word line 1 (i.e., $a_{19}$) by ColMux 2 of bank 510, and b2 of word 3 of word line 1 (i.e., $a_{19}$) by ColMux 3 of bank 510.

The next three elements of quadrant $a_{q4}$ of converted input data matrix 214, i.e., elements $a_{21}$, $a_{18}$ and $a_{18}$, and the next element of quadrant $a_{q3}$ of converted input data matrix 214, i.e., element $a_{20}$, are read at the beginning of processing cycle 15, which corresponds to read cycle 15 depicted in FIG. 5B. For read cycle 15, the ReadBankMuxSelect signal is set to a binary value of 1110 (14 digital), the ColMuxSelect signals for column multiplexers 440, 441 are set to a value of 2, and the following bytes are selected and read from the memory by column multiplexers 440 and/or column multiplexers 441: b2 of word 0 of word line 1 (i.e., $a_{21}$) by ColMux 0 of bank 511, b1 of word 1 of word line 1 (i.e., $a_{18}$) by ColMux 1 of bank 511, b0 of word 2 of word line 1 (i.e., $a_{18}$) by ColMux 2 of bank 511, and b3 of word 3 of word line 1 (i.e., $a_{20}$) by ColMux 3 of bank 510.

The next four elements of quadrant $a_{q4}$ of converted input data matrix 214, i.e., elements $a_{22}$, $a_{22}$, $a_{19}$ and $a_{19}$, are read at the beginning of processing cycle 16, which corresponds to read cycle 16 depicted in FIG. 5B. For read cycle 16, the ReadBankMuxSelect signal is set to a binary value of 1111 (15 digital), the ColMuxSelect signals for column multiplexers 440, 441 are set to a value of 3, and the following bytes are selected and read from the memory by column multiplexers 440 and/or column multiplexers 441: b3 of word 0 of word line 1 (i.e., $a_{22}$) by ColMux 0 of bank 511, b2 of word 1 of word line 1 (i.e., $a_{22}$) by ColMux 1 of bank 511, b1 of word 2 of word line 1 (i.e., $a_{19}$) by ColMux 2 of bank 511, and b0 of word 3 of word line 1 (i.e., $a_{19}$) by ColMux 3 of bank 511.

For read cycles 17 to 19, the WordLineSelect signal for bank 510 is set to a value of 2 to access word line 2 (not depicted in FIG. 5A), and the WordLineSelect signal for bank 511 is set to a value of 1 to access word line 1.

The first element of quadrant $b_{q1}$ (not depicted) of the next converted input data matrix 214 (not depicted), i.e., element $b_1$, and the next three elements of quadrant $a_{q4}$ of converted input data matrix 214, i.e., elements $a_{23}$, $a_{23}$ and $a_{20}$, are read at the beginning of processing cycle 17, which corresponds to read cycle 17 depicted in FIG. 5B. For read cycle 17, the ReadBankMuxSelect signal is set to a binary value of 0111 (7 digital), the ColMuxSelect signals for column multiplexers 440, 441 are set to a value of 0, and the following bytes are selected and read from the memory by column multiplexers 440 and/or column multiplexers 441: b0 of word 0 of word line 2 (i.e., $b_1$) by ColMux 0 of bank 510, b3 of word 1 of word line 1 (i.e., $a_{23}$) by ColMux 1 of bank 511, b2 of word 2 of word line 1 (i.e., $a_{23}$) by ColMux 2 of bank 511, and b1 of word 3 of word line 1 (i.e., $a_{20}$) by ColMux 3 of bank 511.

The next two elements of quadrant $b_{q1}$ of the next converted input data matrix 214, i.e., elements $b_2$ and $b_2$, and the next two elements of quadrant $a_{q4}$ of converted input data matrix 214, i.e., elements $a_{24}$ and $a_{24}$, are read at the beginning of processing cycle 18, which corresponds to read cycle 18 depicted in FIG. 5B. For read cycle 18, the ReadBankMuxSelect signal is set to a binary value of 0011 (3 digital), the ColMuxSelect signals for column multiplexers 440, 441 are set to a value of 1, and the following bytes are selected and read from the memory by column multiplexers 440 and/or column multiplexers 441: b1 of word 0 of word line 2 (i.e., $b_2$) by ColMux 0 of bank 510, b0 of word 1 of word line 2 (i.e., $b_2$) by ColMux 1 of bank 510, b3 of word 2 of word line 1 (i.e., $a_{24}$) by ColMux 2 of bank 511, and b2 of word 3 of word line 1 (i.e., $a_{24}$) by ColMux 3 of bank 511.

The next three elements of quadrant $b_{q1}$ of the next converted input data matrix 214, i.e., elements $b_6$, $b_3$ and $b_3$, and the last element of quadrant $a_{q4}$ of converted input data matrix 214, i.e., element $a_{25}$, are read at the beginning of processing cycle 19, which corresponds to read cycle 19 depicted in FIG. 5B. For read cycle 19, the ReadBankMuxSelect signal is set to a binary value of 0001 (1 digital), the ColMuxSelect signals for column multiplexers 440, 441 are set to a value of 2, and the following bytes are selected and read from the memory by column multiplexers 440 and/or column multiplexers 441: b2 of word 0 of word line 2 (i.e., $b_6$) by ColMux 0 of bank 510, b1 of word 1 of word line 2 (i.e., $b_3$) by ColMux 1 of bank 510, b0 of word 2 of word line 2 (i.e., $b_3$) by ColMux 2 of bank 510, and b3 of word 3 of word line 1 (i.e., $a_{25}$) by ColMux 3 of bank 511.

And so on.

FIG. 5C depicts a word selector or multiplexer mapping diagram 504 for a memory for an ANN accelerator, in accordance with an embodiment of the present disclosure.

As described above, bank 510 and 511 of the memory may include four column multiplexers 440 and 441 (respectively) associated with read operations, and four column multiplexers 450 and 451 (respectively) associated with write operations. Multiplexer mapping diagram 504 illustrates the mapping between the "read" ColMuxSelect signal values (i.e., 0, 1, 2 and 3) and the bytes 330 of each word 320, as well as the mapping between the "write" ColMuxSelect signal values (i.e., 0, 1, 2 and 3) and the bytes 330 of each word 320.

A "read" ColMuxSelect signal value of 0 selects input port 0 of column multiplexers 440, 441. Input port 0 of the first column multiplexer 440, 441 (i.e., ColMux 0) is coupled 442 to byte 0 of word 0, input port 0 of the second column multiplexer 440, 441 (i.e., ColMux 1) is coupled 442 to byte 3 of word 1, input port 0 of the third column multiplexer 440, 441 (i.e., ColMux 2) is coupled 442 to byte 2 of word 2, and input port 0 of the fourth column multiplexer 440, 441 (i.e., ColMux 3) is coupled 442 to byte 1 of word 3.

A "read" ColMuxSelect signal value of 1 selects input port 1 of each column multiplexer 440, 441. Input port 1 of the first column multiplexer 440, 441 (i.e., ColMux 0) is coupled 442 to byte 1 of word 0, input port 1 of the second column multiplexer 440, 441 (i.e., ColMux 1) is coupled 442 to byte 0 of word 1, input port 1 of the third column multiplexer 440, 441 (i.e., ColMux 2) is coupled 442 to byte 3 of word 2, and input port 1 of the fourth column multiplexer 440, 441 (i.e., ColMux 3) is coupled 442 to byte 2 of word 3.

A "read" ColMuxSelect signal value of 2 selects input port 2 of each column multiplexer 440, 441. Input port 2 of the first column multiplexer 440, 441 (i.e., ColMux 0) is coupled 442 to byte 2 of word 0, input port 2 of the second column multiplexer 440, 441 (i.e., ColMux 1) is coupled 442 to byte 1 of word 1, input port 2 of the third column multiplexer 440, 441 (i.e., ColMux 2) is coupled 442 to byte 0 of word 2, and input port 2 of the fourth column multiplexer 440, 441 (i.e., ColMux 3) is coupled 442 to byte 3 of word 3.

A "read" ColMuxSelect signal value of 3 selects input port 3 of each column multiplexer 440, 441. Input port 3 of the first column multiplexer 440, 441 (i.e., ColMux 0) is coupled 442 to byte 3 of word 0, input port 3 of the second column multiplexer 440, 441 (i.e., ColMux 1) is coupled 442 to byte 2 of word 1, input port 3 of the third column multiplexer 440, 441 (i.e., ColMux 2) is coupled 442 to byte 1 of word 2, and input port 3 of the fourth column multiplexer 440, 441 (i.e., ColMux 3) is coupled 442 to byte 0 of word 3.

A "write" ColMuxSelect signal value of 0 selects output port 0 of each column multiplexer 450, 451, and, as illustrated in FIG. 5C, each output port 0 of each column multiplexer 450, 451 is coupled 452 to byte 0 of word 0, 1, 2 or 3. A "write" ColMuxSelect signal value of 1 selects output port 1 of each column multiplexer 450, 451, and each output port 1 of each column multiplexer 450, 451 is coupled 452 to byte 1 of word 0, 1, 2 or 3. A "write" ColMuxSelect signal value of 2 selects output port 2 of each column multiplexer 450, 451, and each output port 2 of each column multiplexer 450, 451 is coupled 452 to byte 2 of word 0, 1, 2 or 3. And, a "write" ColMuxSelect signal value of 3 selects output port 3 of each column multiplexer 450, 451, and each output port 3 of each column multiplexer 450, 451 is coupled 452 to byte 3 of word 0, 1, 2 or 3.

Figure 6A:
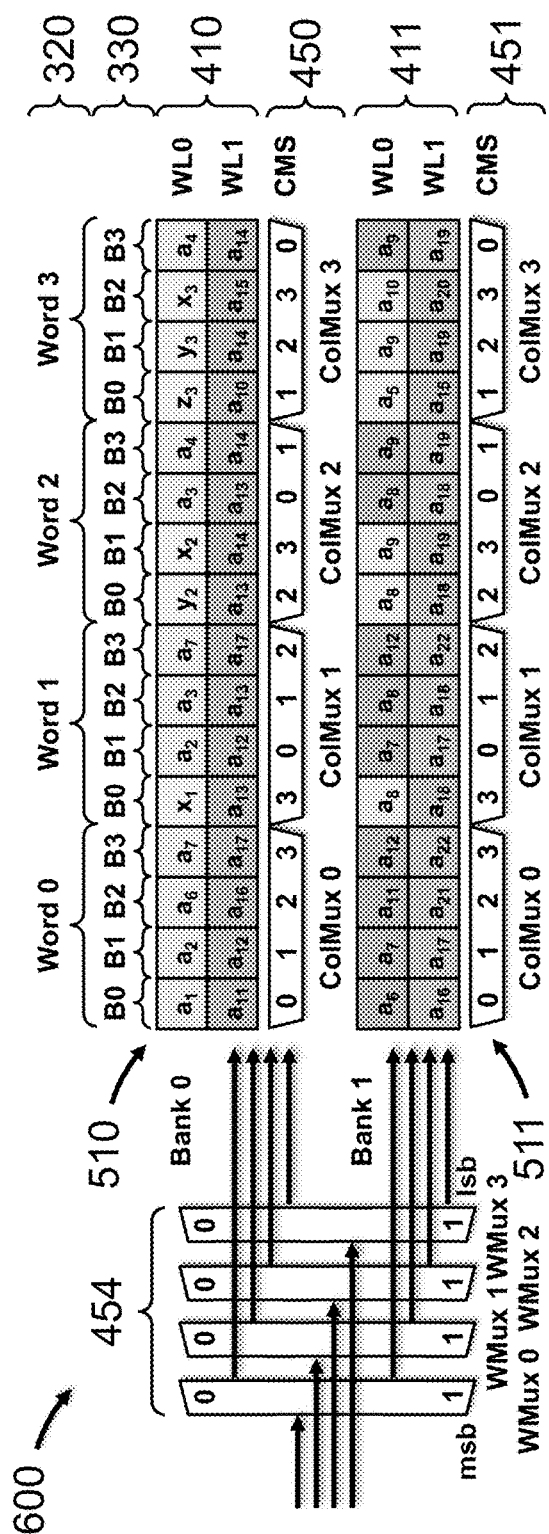
FIG. 6A depicts a block diagram of a memory for an ANN accelerator, in accordance with an embodiment of the present disclosure.

FIG. 6A depicts a block diagram 600 of a memory for an ANN accelerator, in accordance with an embodiment of the present disclosure.

Block diagram 600 depicts a portion of a multi-bank memory, such as, for example, a conventional, 32-bit static random-access memory (SRAM). Similar to the memory depicted in FIG. 5A, the size of a word is 32 bits or 4 bytes. Banks 510 and 511 are depicted for illustration purposes. Bank 510 has at least two rows or word lines 410, i.e., word line 0, word line 1, etc., while bank 511 has at least two rows or word lines 411, i.e., word line 0, word line 1, etc. Each word line has four, 32-bit words 320, i.e., word 0, word 1, word 2 and word 3, and each 32-bit word has 4 bytes 330, i.e., b0, b1, b2 and b3.

A single access to a conventional 32-bit memory bank may only write (or read) a single word to (or from) a single row of that bank.

For bank 510, a first WordLineSelect signal identifies which row or word line 410 is to be accessed, such as, for example, word line 0, word line 1, etc. A column multiplexer 450 is coupled to the memory cells that store each word 320 of each word line 410, i.e., ColMux 0 is coupled to word 0 of word lines 0, 1, etc., ColMux 1 is coupled to word 1 of word lines 0, 1, etc., ColMux 2 is coupled to word 2 of word lines 0, 1, etc., and ColMux 3 is coupled to word 3 of word lines 0, 1, etc.

Similarly, for bank 511, a second WordLineSelect signal identifies which row or word line 411 is to be accessed, such as, for example, word line 0, word line 1, etc. A column multiplexer 451 is coupled to the memory cells that store each word 320 of each word line 411, i.e., ColMux 0 is coupled to word 0 of word lines 0, 1, etc., ColMux 1 is coupled to word 1 of word lines 0, 1, etc., ColMux 2 is coupled to word 2 of word lines 0, 1, etc., and ColMux 3 is coupled to word 3 of word lines 0, 1, etc.

In this embodiment, column multiplexers 450, 451 are associated with a memory write operation. Each "write" column multiplexer 450, 451 has four 8-bit output ports and one 8-bit input port, and each output port is coupled to a different byte 330 of word 320, i.e., b0, b1, b2 or b3. A "write" ColMuxSelect signal identifies which output port of each column multiplexer 450, 451 is to be selected, i.e., a value of 0 selects output port 0, a value of 1 selects output port 1, a value of 2 selects output port 2, and a value of 3 selects output port 3. The input port of each column multiplexer 450, 451 receives the value of the byte of the word to be written to the selected output port; ColMux 0 writes the first byte, ColMux 1 writes the second byte, ColMux 2 writes the third byte, and ColMux 3 writes the fourth byte.

In this embodiment, each output port of each column multiplexer 450, 451 is coupled to a different byte of the associated word as follows. For ColMux 0 in banks 510 and 511, input port 0 is coupled to b0 of word 0 of word lines 0, 1, etc., input port 1 is coupled to b1 of word 0 of word 0, 1, etc., input port 2 is coupled to b2 of word 0 of word lines 0, 1, etc., and input port 3 is coupled to b3 of word 0 of word lines 0, 1, etc. For ColMux 1 in banks 510 and 511, input port 0 is coupled to b1 of word 1 of word lines 0, 1, etc., input port 1 is coupled to b2 of word 1 of word lines 0, 1, etc., input port 2 is coupled to b3 of word 1 of word lines 0, 1, etc., and input port 3 is coupled to b0 of word 1 of word lines 0, 1, etc. For ColMux 2 in banks 510 and 511, input port 0 is coupled to b2 of word 2 of word lines 0, 1, etc., input port 1 is coupled to b3 of word 2 of word lines 0, 1, etc., input port 2 is coupled to b0 of word 2 of word lines 0, 1, etc., and input port 3 is coupled to b1 of word 2 of word lines 0, 1, etc. And, for ColMux 3 in banks 510 and 511, input port 0 is coupled to b3 of word 3 of word lines 0, 1, etc., input port 1 is coupled to b0 of word 3 of word lines 0, 1, etc., input port 2 is coupled to b1 of word 3 of word lines 0, 1, etc., and input port 3 is coupled to b2 of word 3 of word lines 0, 1, etc.

Write bank multiplexers 454, i.e., WMux 0, WMux 1, WMux 2 and WMux 3, are coupled to column multiplexers 450 of bank 510 and column multiplexers 451 of bank 511. Each write bank multiplexer 454 includes two 8-bit output ports and one 8-bit input port. The output ports of WMux 0 are coupled to ColMux 0 of bank 510 and ColMux 0 of bank 511, the output ports of WMux 1 are coupled to ColMux 1 of bank 510 and ColMux 1 of bank 511, the output ports of WMux 2 are coupled to ColMux 2 of bank 510 and ColMux 2 of bank 511, and the output ports of WMux 3 are coupled to ColMux 3 of bank 510 and ColMux 3 of bank 511.

A WriteBankMuxSelect signal identifies which column multiplexer 450, 451 is to be selected for each byte to be written. In one embodiment, the WriteBankMuxSelect signal includes 4 bits, each bit corresponding to a different write bank multiplexer 454. The most significant bit (msb) corresponds to WMux 0, the next bit corresponds to WMux 1, the next bit corresponds to WMux 2, and the least significant bit (lsb) corresponds to WMux 3. A value of 0 for a particular bit selects the respective column multiplexer 450 of bank 510, while the value of 1 for a particular bit selects the respective column multiplexer 451 of bank 511.

More particularly, a WriteBankMuxSelect signal having a binary value of 0000 (0 digital) selects the inputs of ColMuxs 0, 1, 2 and 3 of bank 510. A WriteBankMuxSelect signal having a binary value of 1000 (8 digital) selects the inputs of ColMuxs 1, 2 and 3 of bank 510 and the input of ColMux 0 of bank 511. A WriteBankMuxSelect signal having a binary value of 1100 (12 digital) selects the inputs of ColMuxs 2 and 3 of bank 510 and the inputs of ColMuxs 0 and 1 of bank 511. A WriteBankMuxSelect signal having a binary value of 1110 (14 digital) selects the input of ColMux 3 from bank 510 and the inputs of ColMuxs 0, 1 and 2 of bank 511. A WriteBankMuxSelect signal having a binary value of 1111 (15 digital) selects the inputs of ColMuxs 0, 1, 2 and 3 of bank 511.

The output port of each read bank multiplexer 454 provides one byte of the word to be written to the selected column multiplexer 450, 451, and the byte values are then written to the memory, i.e., WMux 0 provides the first byte, WMux 1 provides the second byte, WMux 2 provides the third byte, and WMux 3 provides the fourth byte.

As depicted in FIG. 6A, for illustration purposes, converted input data matrix 214 (except for several elements of quadrant $a_{q4}$) has been stored in word lines 410, 411 of banks 510, 511 of the memory. Each word line 410, 411 stores elements from one or two quadrants of converted input data matrix 214, i.e., word line 0 of bank 510 stores elements from quadrant $a_{q1}$ and other data (i.e., elements $x_1$, $x_2$, $x_3$, $y_2$, $y_3$ and $z_3$), word line 1 of bank 510 stores elements from quadrants $a_{q2}$ and $a_{q3}$, word line 0 of bank 511 stores elements from quadrants $a_{q1}$ and $a_{q2}$, and word line 1 of bank 511 stores elements from quadrants $a_{q3}$ and $a_{q4}$. Converted weight matrix 212 may be similarly be stored in two different banks of the memory in row-order (rather than column-order).

In this embodiment, additional column multiplexers 440, 441 (depicted in FIGS. 6C and 6E; not depicted in FIG. 6A for clarity) may be associated with a memory read operation, as described below. Other memory characteristics, such as, for example, different sized words (e.g., 64 bits, etc.), different numbers of column multiplexers (e.g., 2, 8, 16, etc.), etc., are also contemplated.

Figure 6B:
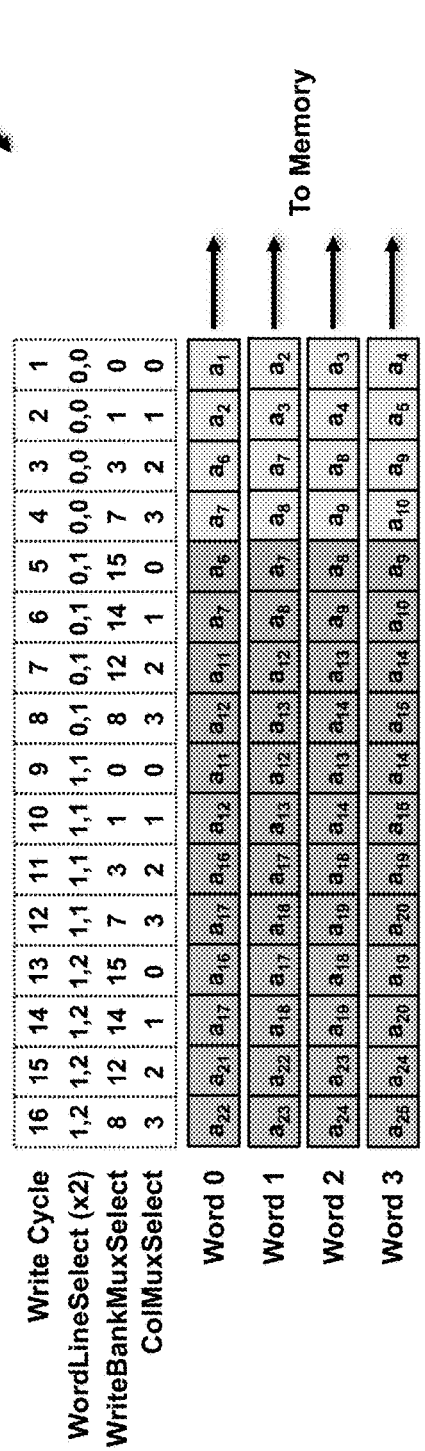
FIG. 6B depicts a data flow diagram for a sequence of write operations to a memory of an ANN accelerator, in accordance with an embodiment of the present disclosure.

FIG. 6B depicts a data flow diagram 602 for a sequence of write operations to a memory of an ANN accelerator, in accordance with an embodiment of the present disclosure.

In this embodiment, four processing cycles are needed to write all of the elements from each quadrant of converted input data matrix 214, and 16 processing cycles are needed to write all four quadrants of converted input data matrix 214. During each write cycle, four elements from one quadrant are written to banks 510, 511 of the memory.

For write cycles 1 to 4, the WordLineSelect signal for bank 510 is set to a value of 0 to access word line 0, and the WordLineSelect signal for bank 511 is set to a value of 0 to access word line 0.

The first row of quadrant $a_{q1}$ of converted input data matrix 214, i.e., elements $a_1$, $a_2$, $a_3$ and $a_4$, is written during write cycle 1. For write cycle 1, the WriteBankMuxSelect signal is set to a binary value of 0000 (0 digital), the ColMuxSelect signals for column multiplexers 450, 451 are set to a value of 0, and the following bytes are written to the memory by column multiplexers 450 and/or column multiplexers 451: b0 of word 0 of word line 0 (i.e., $a_1$) by ColMux 0 of bank 510, b1 of word 1 of word line 0 (i.e., $a_2$) by ColMux 1 of bank 510, b2 of word 2 of word line 0 (i.e., $a_3$) by ColMux 2 of bank 510, and b3 of word 3 of word line 0 (i.e., $a_4$) by ColMux 3 of bank 510.

The second row of quadrant $a_{q1}$ of converted input data matrix 214, i.e., elements $a_2$, $a_3$, $a_4$ and $a_5$, is written during write cycle 2. For write cycle 2, the WriteBankMuxSelect signal is set to a binary value of 0001 (1 digital), the ColMuxSelect signals for column multiplexers 450, 451 are set to a value of 1, and the following bytes are written to the memory by column multiplexers 450 and/or column multiplexers 451: b1 of word 0 of word line 0 (i.e., $a_2$) by ColMux 0 of bank 510, b2 of word 1 of word line 0 (i.e., $a_3$) by ColMux 1 of bank 510, b3 of word 2 of word line 0 (i.e., $a_4$) by ColMux 2 of bank 510, and b0 of word 3 of word line 0 (i.e., $a_5$) by ColMux 3 of bank 511.

The third row of quadrant $a_{q1}$ of converted input data matrix 214, i.e., elements $a_6$, $a_7$, $a_8$ and $a_9$, is written during write cycle 3. For write cycle 3, the WriteBankMuxSelect signal is set to a binary value of 0011 (3 digital), the ColMuxSelect signals for column multiplexers 450, 451 are set to a value of 2 and the following bytes are written to the memory by column multiplexers 450 and/or column multiplexers 451: b2 of word 0 of word line 0 (i.e., $a_6$) by ColMux 0 of bank 510, b3 of word 1 of word line 0 (i.e., $a_7$) by ColMux 1 of bank 510, b0 of word 2 of word line 0 (i.e., $a_8$) by ColMux 2 of bank 511, and b1 of word 3 of word line 0 (i.e., $a_9$) by ColMux 3 of bank 511.

The fourth row of quadrant $a_{q1}$ of converted input data matrix 214, i.e., elements $a_7$, $a_8$, $a_9$ and $a_{10}$, is written during write cycle 4. For write cycle 4, the WriteBankMuxSelect signal is set to a binary value of 0111 (7 digital), the ColMuxSelect signals for column multiplexers 450, 451 are set to a value of 3 and the following bytes are written to the memory by column multiplexers 450 and/or column multiplexers 451: b3 of word 0 of word line 0 (i.e., $a_7$) by ColMux 0 of bank 510, b0 of word 1 of word line 0 (i.e., $a_8$) by ColMux 1 of bank 511, b1 of word 2 of word line 0 (i.e., $a_9$) by ColMux 2 of bank 511, and b2 of word 3 of word line 0 (i.e., $a_{10}$) by ColMux 3 of bank 511.

For write cycles 5 to 8, the WordLineSelect signal for bank 510 is set to a value of 1 to access word line 1, and the WordLineSelect signal for bank 511 is set to a value of 0 to access word line 0.

The first row of quadrant $a_{q2}$ of converted input data matrix 214, i.e., elements $a_6$, $a_7$, $a_8$ and $a_9$, is written during write cycle 5. For write cycle 5, the WriteBankMuxSelect signal is set to a binary value of 1111 (15 digital), the ColMuxSelect signals for column multiplexers 450, 451 are set to a value of 0, and the following bytes are written to the memory by column multiplexers 450 and/or column multiplexers 451: b0 of word 0 of word line 0 (i.e., $a_6$) by ColMux 0 of bank 511, b1 of word 1 of word line 0 (i.e., $a_7$) by ColMux 1 of bank 511, b2 of word 2 of word line 0 (i.e., $a_8$) by ColMux 2 of bank 511, and b3 of word 3 of word line 0 (i.e., $a_9$) by ColMux 3 of bank 511.

The second row of quadrant $a_{q2}$ of converted input data matrix 214, i.e., elements $a_7$, $a_8$, $a_9$ and $a_{10}$, is written during write cycle 6. For write cycle 6, the WriteBankMuxSelect signal is set to a binary value of 1110 (14 digital), the ColMuxSelect signals for column multiplexers 450, 451 are set to a value of 1, and the following bytes are written to the memory by column multiplexers 450 and/or column multiplexers 451: b1 of word 0 of word line 0 (i.e., $a_7$) by ColMux 0 of bank 511, b2 of word 1 of word line 0 (i.e., $a_8$) by ColMux 1 of bank 511, b3 of word 2 of word line 0 (i.e., $a_9$) by ColMux 2 of bank 511, and b0 of word 3 of word line 1 (i.e., $a_{10}$) by ColMux 3 of bank 510.

The third row of quadrant $a_{q2}$ of converted input data matrix 214, i.e., elements $a_{11}$, $a_{12}$, $a_{13}$ and $a_{14}$, is written during write cycle 7. For write cycle 7, the WriteBankMuxSelect signal is set to a binary value of 1100 (12 digital), the ColMuxSelect signals for column multiplexers 450, 451 are set to a value of 2 and the following bytes are written to the memory by column multiplexers 450 and/or column multiplexers 451: b2 of word 0 of word line 0 (i.e., $a_{11}$) by ColMux 0 of bank 511, b3 of word 1 of word line 0 (i.e., $a_{12}$) by ColMux 1 of bank 511, b0 of word 2 of word line 1 (i.e., $a_{13}$) by ColMux 2 of bank 510, and b1 of word 3 of word line 1 (i.e., $a_{14}$) by ColMux 3 of bank 510.

The fourth row of quadrant $a_{q2}$ of converted input data matrix 214, i.e., elements $a_{12}$, $a_{13}$, $a_{14}$ and $a_{15}$, is written during write cycle 8. For write cycle 8, the WriteBankMuxSelect signal is set to a binary value of 1000 (8 digital), the ColMuxSelect signals for column multiplexers 450, 451 are set to a value of 3 and the following bytes are written to the memory by column multiplexers 450 and/or column multiplexers 451: b3 of word 0 of word line 0 (i.e., $a_{12}$) by ColMux 0 of bank 511, b0 of word 1 of word line 1 (i.e., $a_{13}$) by ColMux 1 of bank 510, b1 of word 2 of word line 1 (i.e., $a_{14}$) by ColMux 2 of bank 510, and b2 of word 3 of word line 1 (i.e., $a_{15}$) by ColMux 3 of bank 510.

For write cycles 9 to 12, the WordLineSelect signal for bank 510 is set to a value of 1 to access word line 1, and the WordLineSelect signal for bank 511 is set to a value of 1 to access word line 1.

The first row of quadrant $a_{q3}$ of converted input data matrix 214, i.e., elements $a_{11}$, $a_{12}$, $a_{13}$ and $a_{14}$, is written during write cycle 9. For write cycle 9, the WriteBankMuxSelect signal is set to a binary value of 0000 (0 digital), the ColMuxSelect signals for column multiplexers 450, 451 are set to a value of 0, and the following bytes are written to the memory by column multiplexers 450 and/or column multiplexers 451: b0 of word 0 of word line 1 (i.e., $a_{11}$) by ColMux 0 of bank 510, b1 of word 1 of word line 1 (i.e., $a_{12}$) by ColMux 1 of bank 510, b2 of word 2 of word line 1 (i.e., $a_{13}$) by ColMux 2 of bank 510, and b3 of word 3 of word line 1 (i.e., $a_{14}$) by ColMux 3 of bank 510.

The second row of quadrant $a_{q3}$ of converted input data matrix 214, i.e., elements $a_{12}$, $a_{13}$, $a_{14}$ and $a_{15}$, is written during write cycle 10. For write cycle 10, the WriteBankMuxSelect signal is set to a binary value of 0001 (1 digital), the ColMuxSelect signals for column multiplexers 450, 451 are set to a value of 1, and the following bytes are written to the memory by column multiplexers 450 and/or column multiplexers 451: b1 of word 0 of word line 1 (i.e., $a_{12}$) by ColMux 0 of bank 510, b2 of word 1 of word line 1 (i.e., $a_{13}$) by ColMux 1 of bank 510, b3 of word 2 of word line 1 (i.e., $a_{14}$) by ColMux 2 of bank 510, and b0 of word 3 of word line 1 (i.e., $a_{15}$) by ColMux 3 of bank 511.

The third row of quadrant $a_{q3}$ of converted input data matrix 214, i.e., elements $a_{16}$, $a_{17}$, $a_{18}$ and $a_{19}$, is written during write cycle 11. For write cycle 11, the WriteBankMuxSelect signal is set to a binary value of 0011 (3 digital), the ColMuxSelect signals for column multiplexers 450, 451 are set to a value of 2 and the following bytes are written to the memory by column multiplexers 450 and/or column multiplexers 451: b2 of word 0 of word line 1 (i.e., $a_{16}$) by ColMux 0 of bank 510, b3 of word 1 of word line 1 (i.e., $a_{17}$) by ColMux 1 of bank 510, b0 of word 2 of word line 1 (i.e., $a_{18}$) by ColMux 2 of bank 511, and b1 of word 3 of word line 1 (i.e., $a_{19}$) by ColMux 3 of bank 511.

The fourth row of quadrant $a_{q3}$ of converted input data matrix 214, i.e., elements $a_{17}$, $a_{18}$, $a_{19}$ and $a_{20}$, is written during write cycle 12. For write cycle 12, the Write-BankMuxSelect signal is set to a binary value of 0111 (7 digital), the ColMuxSelect signals for column multiplexers 450, 451 are set to a value of 3 and the following bytes are written to the memory by column multiplexers 450 and/or column multiplexers 451: b3 of word 0 of word line 1 (i.e., $a_{17}$) by ColMux 0 of bank 510, b0 of word 1 of word line 1 (i.e., $a_{18}$) by ColMux 1 of bank 511, b1 of word 2 of word line 1 (i.e., $a_{19}$) by ColMux 2 of bank 511, and b2 of word 3 of word line 1 (i.e., $a_{20}$) by ColMux 3 of bank 511.

For write cycles 13 to 16, the WordLineSelect signal for bank 510 is set to a value of 2 to access word line 2 (not depicted in FIG. 6A), and the WordLineSelect signal for bank 511 is set to a value of 1 to access word line 1.

The first row of quadrant $a_{q4}$ of converted input data matrix 214, i.e., elements $a_{16}$, $a_{17}$, $a_{18}$ and $a_{19}$, is written during write cycle 13. For write cycle 13, the Write-BankMuxSelect signal is set to a binary value of 1111 (15 digital), the ColMuxSelect signals for column multiplexers 450, 451 are set to a value of 0, and the following bytes are written to the memory by column multiplexers 450 and/or column multiplexers 451: b0 of word 0 of word line 1 (i.e., $a_{16}$) by ColMux 0 of bank 511, b1 of word 1 of word line 1 (i.e., $a_{17}$) by ColMux 1 of bank 511, b2 of word 2 of word line 1 (i.e., $a_{18}$) by ColMux 2 of bank 511, and b3 of word 3 of word line 1 (i.e., $a_{19}$) by ColMux 3 of bank 511.

The second row of quadrant $a_{q4}$ of converted input data matrix 214, i.e., elements $a_{17}$, $a_{18}$, $a_{19}$ and $a_{20}$, is written during write cycle 14. For write cycle 14, the Write-BankMuxSelect signal is set to a binary value of 1110 (14 digital), the ColMuxSelect signals for column multiplexers 450, 451 are set to a value of 1, and the following bytes are written to the memory by column multiplexers 450 and/or column multiplexers 451: b1 of word 0 of word line 1 (i.e., $a_{17}$) by ColMux 0 of bank 511, b2 of word 1 of word line 1 (i.e., $a_{18}$) by ColMux 1 of bank 511, b3 of word 2 of word line 1 (i.e., $a_{19}$) by ColMux 2 of bank 511, and b0 of word 3 of word line 2 (i.e., $a_{20}$) by ColMux 3 of bank 510.

The third row of quadrant $a_{q4}$ of converted input data matrix 214, i.e., elements $a_{21}$, $a_{22}$, $a_{23}$ and $a_{24}$, is written during write cycle 15. For write cycle 15, the Write-BankMuxSelect signal is set to a binary value of 1100 (12 digital), the ColMuxSelect signals for column multiplexers 450, 451 are set to a value of 2 and the following bytes are written to the memory by column multiplexers 450 and/or column multiplexers 451: b2 of word 0 of word line 1 (i.e., $a_{21}$) by ColMux 0 of bank 511, b3 of word 1 of word line 1 (i.e., $a_{22}$) by ColMux 1 of bank 511, b0 of word 2 of word line 2 (i.e., $a_{23}$) by ColMux 2 of bank 510, and b1 of word 3 of word line 2 (i.e., $a_{24}$) by ColMux 3 of bank 510.

The fourth row of quadrant $a_{q4}$ of converted input data matrix 214, i.e., elements $a_{22}$, $a_{23}$, $a_{24}$ and $a_{25}$, is written during write cycle 16. For write cycle 16, the Write-BankMuxSelect signal is set to a binary value of 1000 (8 digital), the ColMuxSelect signals for column multiplexers 450, 451 are set to a value of 3 and the following bytes are written to the memory by column multiplexers 450 and/or column multiplexers 451: b3 of word 0 of word line 1 (i.e., $a_{22}$) by ColMux 0 of bank 511, b0 of word 1 of word line 2 (i.e., $a_{23}$) by ColMux 1 of bank 510, b1 of word 2 of word line 2 (i.e., $a_{24}$) by ColMux 2 of bank 510, and b2 of word 3 of word line 2 (i.e., $a_{25}$) by ColMux 3 of bank 510.

And so on for the next converted input data matrix 214.

Figure 6C:
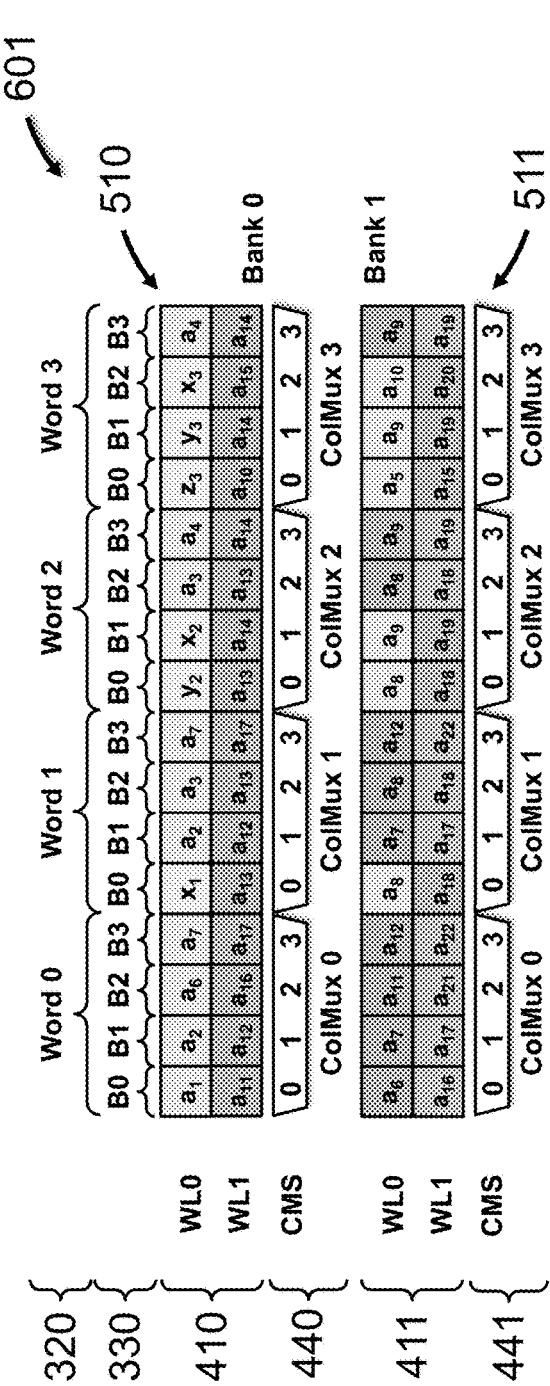
FIG. 6C depicts a block diagram of a memory for an ANN accelerator, in accordance with an embodiment of the present disclosure.

FIG. 6C depicts a block diagram 601 of a memory for an ANN accelerator, in accordance with an embodiment of the present disclosure.

Block diagram 601 generally depicts the memory bank depicted in block diagram 600. In this embodiment, column multiplexers 440, 441 are associated with a memory read operation. Each "read" column multiplexer 440, 441 has four 8-bit input ports and one 8-bit output port, and each input port is coupled to a different byte 330 of word 320, i.e., b0, b1, b2 or b3. A "read" ColMuxSelect signal identifies which input port of each column multiplexer 440, 441 is to be selected, i.e., a value of 0 selects input port 0, a value of 1 selects input port 1, a value of 2 selects input port 2, and a value of 3 selects input port 3. The output port of each column multiplexer 440, 441 outputs the value of the byte coupled to the selected input port, and the byte values are then formed into the word to be read, i.e., ColMux 0 provides the first byte, ColMux 1 provides the second byte, ColMux 2 provides the third byte, and ColMux 3 provides the fourth byte.

In this embodiment, each input port of each column multiplexer 440, 441 is coupled to a different byte of the associated word as follows. For ColMux 0 in banks 510 and 511, input port 0 is coupled to b0 of word 0 of word lines 0, 1, etc., input port 1 is coupled to b1 of word 0 of word lines 0, 1, etc., input port 2 is coupled to b2 of word 0 of word lines 0, 1, etc., and input port 3 is coupled to b3 of word 0 of word lines 0, 1, etc. For ColMux 1 in banks 510 and 511, input port 0 is coupled to b0 of word 1 of word lines 0, 1, etc., input port 1 is coupled to b1 of word 1 of word lines 0, 1, etc., input port 2 is coupled to b2 of word 1 of word lines 0, 1, etc., and input port 3 is coupled to b3 of word 1 of word lines 0, 1, etc. For ColMux 2 in banks 510 and 511, input port 0 is coupled to b0 of word 2 of word lines 0, 1, etc., input port 1 is coupled to b1 of word 2 of word lines 0, 1, etc., input port 2 is coupled to b2 of word 2 of word lines 0, 1, etc., and input port 3 is coupled to b3 of word 2 of word lines 0, 1, etc. And, for ColMux 3 in banks 510 and 511, input port 0 is coupled to b0 of word 3 of word lines 0, 1, etc., input port 1 is coupled to b1 of word 3 of word lines 0, 1, etc., input port 2 is coupled to b2 of word 3 of word lines 0, 1, etc., and input port 3 is coupled to b3 of word 3 of word lines 0, 1, etc.

A BankSelect signal identifies which memory bank is to be selected for a read operation, i.e., a value of 0 selects bank 510 and a value of 1 selects bank 511.

As depicted in FIG. 6C, for illustration purposes, converted input data matrix 214 has been stored in word lines 410, 411 of banks 510, 511 of the memory according to data flow diagram 602.

Figure 6D:
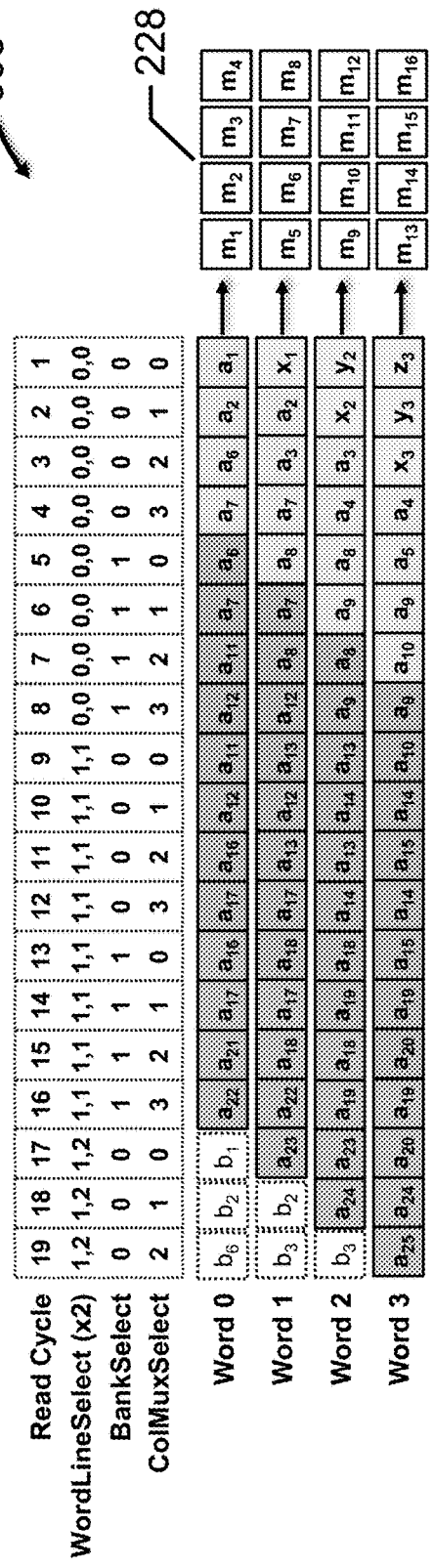
FIG. 6D depicts a data flow diagram for a sequence of read operations from a memory of an ANN accelerator, in accordance with an embodiment of the present disclosure.

FIG. 6D depicts a data flow diagram 603 for a sequence of read operations from a memory of an ANN accelerator, in accordance with an embodiment of the present disclosure.

Data flow diagram 603 is very similar to data flow diagram 502. The BankSelect signal of data flow diagram 603 replaces the ReadBankMuxSelect signal of data flow diagram 502, and the elements read from the respective the memories are the same. While data flow diagram 502 includes many read cycles that access banks 510 and 511 at the same time, data flow diagram 603 includes read cycles that only access one bank 510, 511 at a time.

For read cycles 1 to 4, the BankSelect signal is set to a value of 0 to access bank 510, and the WordLineSelect signal for bank 510 is set to a value of 0 to access word line 0.

The initial element of quadrant $a_{q1}$ of converted input data matrix 214, i.e., element $a_1$, as well as elements $x_1$, $y_2$ and $z_3$, are read at the beginning of processing cycle 1, which corresponds to read cycle 1 depicted in FIG. 6D. Elements $x_1$, $y_2$ and $z_3$ may be read and not provided to MAC array 228, or the sense amplifiers associated with the column multiplexers for these elements may be disabled to prevent reading the memory cells in which these elements are stored. For read cycle 1, the ColMuxSelect signals for column multiplexers 440, 441 are set to a value of 0, and the following bytes are selected and read from the memory by column multiplexers 440 and/or column multiplexers 441: b0 of word 0 of word line 0 (i.e., $a_1$) by ColMux 0 of bank 510, b0 of word 1 of word line 0 (i.e., $x_1$) by ColMux 1 of bank 510, b0 of word 2 of word line 0 (i.e., $y_2$) by ColMux 2 of bank 510, and b0 of word 3 of word line 0 (i.e., $z_3$) by ColMux 3 of bank 510.

The next two elements of quadrant $a_{q1}$ of converted input data matrix 214, i.e., elements $a_2$ and $a_2$, as well as elements $x_2$ and $y_3$, are read at the beginning of processing cycle 2, which corresponds to read cycle 2 depicted in FIG. 6D. Elements $x_2$ and $y_3$ may be read and not provided to MAC array 228, or the sense amplifiers associated with the column multiplexers for these elements may be disabled to prevent reading the memory cells in which these elements are stored. For read cycle 2, the ColMuxSelect signals for column multiplexers 440, 441 are set to a value of 1, and the following bytes are selected and read from the memory by column multiplexers 440 and/or column multiplexers 441: b1 of word 0 of word line 0 (i.e., $a_2$) by ColMux 0 of bank 510, b1 of word 1 of word line 0 (i.e., $a_2$) by ColMux 1 of bank 510, b1 of word 2 of word line 0 (i.e., $x_2$) by ColMux 2 of bank 510, and b1 of word 3 of word line 0 (i.e., $y_3$) by ColMux 3 of bank 510.

The next three elements of quadrant $a_{q1}$ of converted input data matrix 214, i.e., elements $a_6$, $a_3$, and $a_3$, as well as element $x_3$, are read at the beginning of processing cycle 3, which corresponds to read cycle 3 depicted in FIG. 6D. As discussed above, element $x_3$ may be read and not provided to MAC array 228, or the sense amplifiers associated with the column multiplexers for this element may be disabled to prevent reading the memory cells in which this element are stored. For read cycle 3, the ColMuxSelect signals for column multiplexers 440, 441 are set to a value of 2, and the following bytes are selected and read from the memory by column multiplexers 440 and/or column multiplexers 441: b2 of word 0 of word line 0 (i.e., $a_6$) by ColMux 0 of bank 510, b2 of word 1 of word line 0 (i.e., $a_3$) by ColMux 1 of bank 510, b2 of word 2 of word line 0 (i.e., $a_3$) by ColMux 2 of bank 510, and b2 of word 3 of word line 0 (i.e., $x_3$) by ColMux 3 of bank 510.

The next four elements of quadrant $a_{q1}$ of converted input data matrix 214, i.e., elements $a_7$, $a_7$, $a_4$ and $a_4$, are read at the beginning of processing cycle 4, which corresponds to read cycle 4 depicted in FIG. 6D. For read cycle 4, the ColMuxSelect signals for column multiplexers 440, 441 are set to a value of 3, and the following bytes are selected and read from the memory by column multiplexers 440 and/or column multiplexers 441: b3 of word 0 of word line 0 (i.e., $a_7$) by ColMux 0 of bank 510, b3 of word 1 of word line 0 (i.e., $a_7$) by ColMux 1 of bank 510, b3 of word 2 of word line 0 (i.e., $a_4$) by ColMux 2 of bank 510, and b3 of word 3 of word line 0 (i.e., $a_4$) by ColMux 3 of bank 510.

For read cycles 5 to 8, the BankSelect signal is set to a value of 1 to access bank 511, and the WordLineSelect signal for bank 511 is set to a value of 0 to access word line 0.

The first element of quadrant $a_{q2}$ of converted input data matrix 214, i.e., element $a_6$, and the next three elements of quadrant $a_{q1}$ of converted input data matrix 214, i.e., elements $a_8$, $a_8$ and $a_5$, are read at the beginning of processing cycle 5, which corresponds to read cycle 5 depicted in FIG. 6D. For read cycle 5, the ColMuxSelect signals for column multiplexers 440, 441 are set to a value of 0, and the following bytes are selected and read from the memory by column multiplexers 440 and/or column multiplexers 441: b0 of word 0 of word line 0 (i.e., $a_6$) by ColMux 0 of bank 511, b0 of word 1 of word line 0 (i.e., $a_8$) by ColMux 1 of bank 511, b0 of word 2 of word line 0 (i.e., $a_8$) by ColMux 2 of bank 511, and b0 of word 3 of word line 0 (i.e., $a_5$) by ColMux 3 of bank 511.

The next two elements of quadrant $a_{q2}$ of converted input data matrix 214, i.e., elements $a_7$ and $a_7$, and the next two elements of quadrant $a_{q1}$ of converted input data matrix 214, i.e., elements $a_9$ and $a_9$, are read at the beginning of processing cycle 6, which corresponds to read cycle 6 depicted in FIG. 6D. For read cycle 6, the ColMuxSelect signals for column multiplexers 440, 441 are set to a value of 1, and the following bytes are selected and read from the memory by column multiplexers 440 and/or column multiplexers 441: b1 of word 0 of word line 0 (i.e., $a_7$) by ColMux 0 of bank 511, b1 of word 1 of word line 0 (i.e., $a_7$) by ColMux 1 of bank 511, b1 of word 2 of word line 0 (i.e., $a_9$) by ColMux 2 of bank 511, and b1 of word 3 of word line 0 (i.e., $a_9$) by ColMux 3 of bank 511.

The next three elements of quadrant $a_{q2}$ of converted input data matrix 214, i.e., elements $a_{11}$, $a_8$ and $a_8$, and the last element of quadrant $a_{q1}$ of converted input data matrix 214, i.e., element $a_{10}$, are read at the beginning of processing cycle 7, which corresponds to read cycle 7 depicted in FIG. 6D. For read cycle 7, the ColMuxSelect signals for column multiplexers 440, 441 are set to a value of 2, and the following bytes are selected and read from the memory by column multiplexers 440 and/or column multiplexers 441: b2 of word 0 of word line 0 (i.e., $a_{11}$) by ColMux 0 of bank 511, b2 of word 1 of word line 0 (i.e., $a_8$) by ColMux 1 of bank 511, b2 of word 2 of word line 0 (i.e., $a_8$) by ColMux 2 of bank 511, and b2 of word 3 of word line 0 (i.e., $a_{10}$) by ColMux 3 of bank 511.

The next four elements of quadrant $a_{q2}$ of converted input data matrix 214, i.e., elements $a_{12}$, $a_{12}$, $a_9$ and $a_9$, are read at the beginning of processing cycle 8, which corresponds to read cycle 8 depicted in FIG. 6D. For read cycle 8, the ColMuxSelect signals for column multiplexers 440, 441 are set to a value of 3, and the following bytes are selected and read from the memory by column multiplexers 440 and/or column multiplexers 441: b3 of word 0 of word line 0 (i.e., $a_{12}$) by ColMux 0 of bank 511, b3 of word 1 of word line 0 (i.e., $a_{12}$) by ColMux 1 of bank 511, b3 of word 2 of word line 0 (i.e., $a_9$) by ColMux 2 of bank 511, and b3 of word 3 of word line 0 (i.e., $a_9$) by ColMux 3 of bank 511.

For read cycles 9 to 12, the BankSelect signal is set to a value of 0 to access bank 510, and the WordLineSelect signal for bank 510 is set to a value of 1 to access word line 1.

The first element of quadrant $a_{q3}$ of converted input data matrix 214, i.e., element $a_{11}$, and the next three elements of quadrant $a_{q2}$ of converted input data matrix 214, i.e., elements $a_{13}$, $a_{13}$ and $a_{10}$, are read at the beginning of processing cycle 9, which corresponds to read cycle 9 depicted in FIG. 6D. For read cycle 9, the ColMuxSelect signals for column multiplexers 440, 441 are set to a value of 0, and the following bytes are selected and read from the memory by column multiplexers 440 and/or column multiplexers 441: b0 of word 0 of word line 1 (i.e., $a_{11}$) by ColMux 0 of bank 510, b0 of word 1 of word line 1 (i.e., $a_{13}$) by ColMux 1 of bank 511, b0 of word 2 of word line 1 (i.e., $a_{13}$) by ColMux 2 of bank 510, and b0 of word 3 of word line 1 (i.e., $a_{10}$) by ColMux 3 of bank 510.

The next two elements of quadrant $a_{q3}$ of converted input data matrix 214, i.e., elements $a_{12}$ and $a_{12}$, and the next two elements of quadrant $a_{q2}$ of converted input data matrix 214, i.e., elements $a_{14}$ and $a_{14}$, are read at the beginning of processing cycle 10, which corresponds to read cycle 10 depicted in FIG. 6D. For read cycle 10, the ColMuxSelect signals for column multiplexers 440, 441 are set to a value of 1, and the following bytes are selected and read from the memory by column multiplexers 440 and/or column multiplexers 441: b1 of word 0 of word line 1 (i.e., $a_{12}$) by ColMux 0 of bank 510, b1 of word 1 of word line 1 (i.e., $a_{12}$) by ColMux 1 of bank 510, b1 of word 2 of word line 1 (i.e., $a_{14}$) by ColMux 2 of bank 510, and b1 of word 3 of word line 1 (i.e., $a_{14}$) by ColMux 3 of bank 510.

The next three elements of quadrant $a_{q3}$ of converted input data matrix 214, i.e., elements $a_{16}$, $a_{13}$ and $a_{13}$, and the last element of quadrant $a_{q2}$ of converted input data matrix 214, i.e., element $a_{15}$, are read at the beginning of processing cycle 11, which corresponds to read cycle 11 depicted in FIG. 6D. For read cycle 11, the ColMuxSelect signals for column multiplexers 440, 441 are set to a value of 2, and the following bytes are selected and read from the memory by column multiplexers 440 and/or column multiplexers 441: b2 of word 0 of word line 1 (i.e., $a_{16}$) by ColMux 0 of bank 510, b2 of word 1 of word line 1 (i.e., $a_{13}$) by ColMux 1 of bank 510, b2 of word 2 of word line 1 (i.e., $a_{13}$) by ColMux 2 of bank 510, and b2 of word 3 of word line 1 (i.e., $a_{15}$) by ColMux 3 of bank 511.

The next four elements of quadrant $a_{q3}$ of converted input data matrix 214, i.e., elements $a_{17}$, $a_{17}$, $a_{14}$ and $a_{14}$, are read at the beginning of processing cycle 12, which corresponds to read cycle 12 depicted in FIG. 6D. For read cycle 12, the ColMuxSelect signals for column multiplexers 440, 441 are set to a value of 3, and the following bytes are selected and read from the memory by column multiplexers 440 and/or column multiplexers 441: b3 of word 0 of word line 1 (i.e., $a_{17}$) by ColMux 0 of bank 510, b3 of word 1 of word line 1 (i.e., $a_{17}$) by ColMux 1 of bank 510, b3 of word 2 of word line 1 (i.e., $a_{14}$) by ColMux 2 of bank 510, and b3 of word 3 of word line 1 (i.e., $a_{14}$) by ColMux 3 of bank 510.

For read cycles 13 to 16, the BankSelect signal is set to a value of 1 to access bank 511, and the WordLineSelect signal for bank 511 is set to a value of 1 to access word line 1.

The first element of quadrant $a_{q4}$ of converted input data matrix 214, i.e., element $a_{16}$, and the next three elements of quadrant $a_{q3}$ of converted input data matrix 214, i.e., elements $a_{18}$, $a_{18}$ and $a_{15}$, are read at the beginning of processing cycle 13, which corresponds to read cycle 13 depicted in FIG. 6D. For read cycle 13, the ColMuxSelect signals for column multiplexers 440, 441 are set to a value of 0, and the following bytes are selected and read from the memory by column multiplexers 440 and/or column multiplexers 441: b0 of word 0 of word line 1 (i.e., $a_{16}$) by ColMux 0 of bank 511, b0 of word 1 of word line 1 (i.e., $a_{18}$) by ColMux 1 of bank 511, b0 of word 2 of word line 1 (i.e., $a_{18}$) by ColMux 2 of bank 511, and b0 of word 3 of word line 1 (i.e., $a_{15}$) by ColMux 3 of bank 511.

The next two elements of quadrant $a_{q4}$ of converted input data matrix 214, i.e., elements $a_{17}$ and $a_{17}$, and the next two elements of quadrant $a_{q3}$ of converted input data matrix 214, i.e., elements $a_{19}$ and $a_{19}$, are read at the beginning of processing cycle 14, which corresponds to read cycle 14 depicted in FIG. 6D. For read cycle 14, the ColMuxSelect signals for column multiplexers 440, 441 are set to a value of 1, and the following bytes are selected and read from the memory by column multiplexers 440 and/or column multiplexers 441: b1 of word 0 of word line 1 (i.e., $a_{17}$) by ColMux 0 of bank 511, b1 of word 1 of word line 1 (i.e., $a_{17}$) by ColMux 1 of bank 511, b1 of word 2 of word line 1 (i.e., $a_{19}$) by ColMux 2 of bank 511, and b1 of word 3 of word line 1 (i.e., $a_{19}$) by ColMux 3 of bank 511.

The next three elements of quadrant $a_{q4}$ of converted input data matrix 214, i.e., elements $a_{21}$, $a_{18}$ and $a_{18}$, and the next element of quadrant $a_{q3}$ of converted input data matrix 214, i.e., element $a_{20}$, are read at the beginning of processing cycle 15, which corresponds to read cycle 15 depicted in FIG. 6D. For read cycle 15, the ColMuxSelect signals for column multiplexers 440, 441 are set to a value of 2, and the following bytes are selected and read from the memory by column multiplexers 440 and/or column multiplexers 441: b2 of word 0 of word line 1 (i.e., $a_{21}$) by ColMux 0 of bank 511, b2 of word 1 of word line 1 (i.e., $a_{18}$) by ColMux 1 of bank 511, b2 of word 2 of word line 1 (i.e., $a_{18}$) by ColMux 2 of bank 511, and b2 of word 3 of word line 1 (i.e., $a_{20}$) by ColMux 3 of bank 511.

The next four elements of quadrant $a_{q4}$ of converted input data matrix 214, i.e., elements $a_{22}$, $a_{22}$, $a_{19}$ and $a_{19}$, are read at the beginning of processing cycle 16, which corresponds to read cycle 16 depicted in FIG. 6D. For read cycle 16, the ColMuxSelect signals for column multiplexers 440, 441 are set to a value of 3, and the following bytes are selected and read from the memory by column multiplexers 440 and/or column multiplexers 441: b3 of word 0 of word line 1 (i.e., $a_{22}$) by ColMux 0 of bank 511, b3 of word 1 of word line 1 (i.e., $a_{22}$) by ColMux 1 of bank 511, b3 of word 2 of word line 1 (i.e., $a_{19}$) by ColMux 2 of bank 511, and b3 of word 3 of word line 1 (i.e., $a_{19}$) by ColMux 3 of bank 511.

For read cycles 17 to 19, the BankSelect signal is set to a value of 0 to access bank 510, and the WordLineSelect signal for bank 510 is set to a value of 2 to access word line 2 (not depicted in FIG. 6C).

The first element of quadrant $b_{q1}$ (not depicted) of the next converted input data matrix 214 (not depicted), i.e., element $b_1$, and the next three elements of quadrant $a_{q4}$ of converted input data matrix 214, i.e., elements $a_{23}$, $a_{23}$ and $a_{20}$, are read at the beginning of processing cycle 17, which corresponds to read cycle 17 depicted in FIG. 6D. For read cycle 17, the ColMuxSelect signals for column multiplexers 440, 441 are set to a value of 0, and the following bytes are selected and read from the memory by column multiplexers 440 and/or column multiplexers 441: b0 of word 0 of word line 2 (i.e., $b_1$) by ColMux 0 of bank 510, b0 of word 1 of word line 2 (i.e., $a_{23}$) by ColMux 1 of bank 510, b0 of word 2 of word line 2 (i.e., $a_{23}$) by ColMux 2 of bank 510, and b0 of word 3 of word line 2 (i.e., $a_{20}$) by ColMux 3 of bank 510.

The next two elements of quadrant $b_{q1}$ of the next converted input data matrix 214, i.e., elements $b_2$ and $b_2$, and the next two elements of quadrant $a_{q4}$ of converted input data matrix 214, i.e., elements $a_{24}$ and $a_{24}$, are read at the beginning of processing cycle 18, which corresponds to read cycle 18 depicted in FIG. 6D. For read cycle 18, the ColMuxSelect signals for column multiplexers 440, 441 are set to a value of 1, and the following bytes are selected and read from the memory by column multiplexers 440 and/or column multiplexers 441: b1 of word 0 of word line 2 (i.e., b2) by ColMux 0 of bank 510, b1 of word 1 of word line 2 (i.e., b2) by ColMux 1 of bank 510, b1 of word 2 of word line 2 (i.e., $a_{24}$) by ColMux 2 of bank 510, and b1 of word 3 of word line 2 (i.e., $a_{24}$) by ColMux 3 of bank 510.

The next three elements of quadrant $b_{q1}$ of the next converted input data matrix 214, i.e., elements $b_6$, $b_3$ and $b_3$, and the last element of quadrant $a_{q4}$ of converted input data matrix 214, i.e., element $a_{25}$, are read at the beginning of processing cycle 19, which corresponds to read cycle 19 depicted in FIG. 6D. For read cycle 19, the ColMuxSelect signals for column multiplexers 440, 441 are set to a value of 2, and the following bytes are selected and read from the memory by column multiplexers 440 and/or column multiplexers 441: b2 of word 0 of word line 2 (i.e., $b_6$) by ColMux 0 of bank 510, b2 of word 1 of word line 2 (i.e., $b_3$) by ColMux 1 of bank 510, b2 of word 2 of word line 2 (i.e., $b_3$) by ColMux 2 of bank 510, and b2 of word 3 of word line 1 (i.e., $a_{25}$) by ColMux 3 of bank 510.

And so on.

Figure 6E:
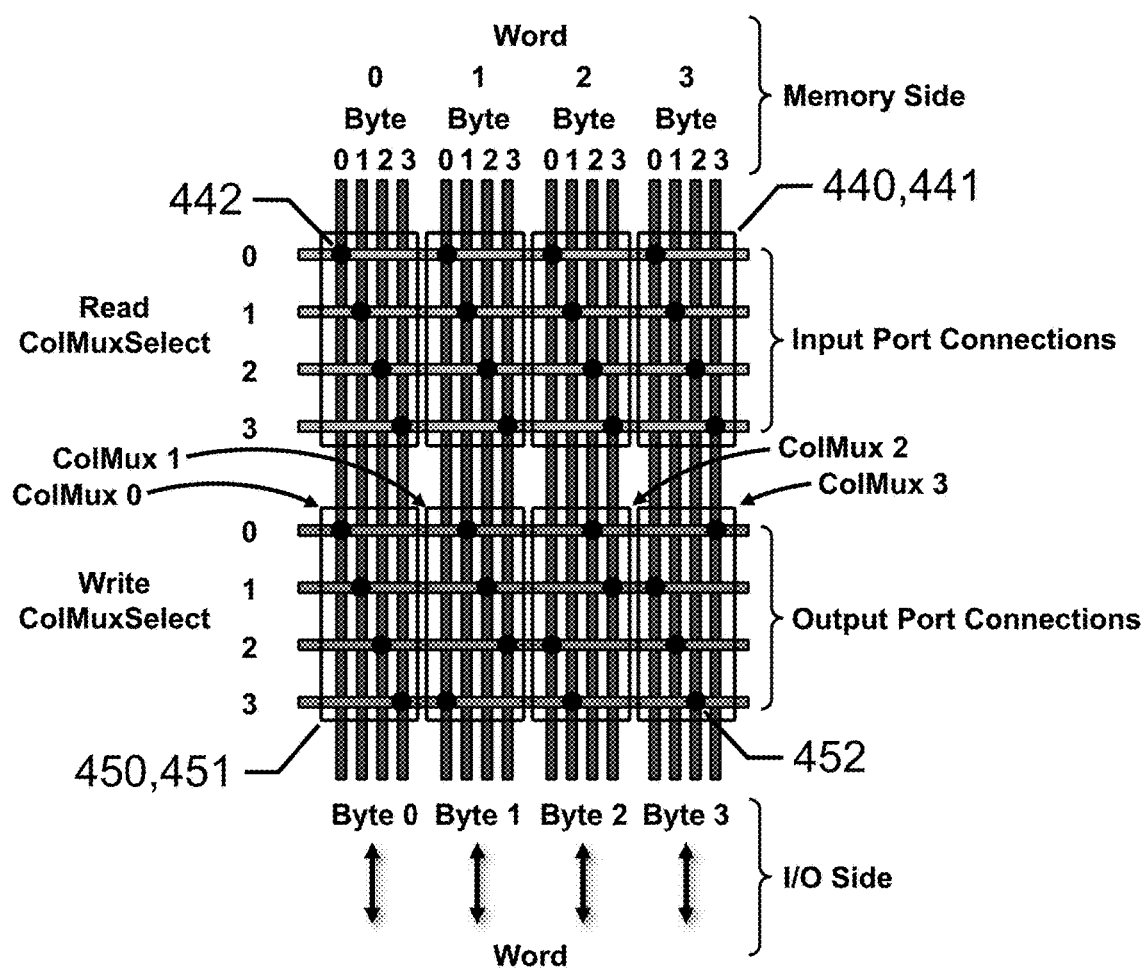
FIG. 6E depicts a multiplexer mapping diagram for a memory for an ANN accelerator, in accordance with an embodiment of the present disclosure.

FIG. 6E depicts a word selector or multiplexer mapping diagram 604 for a memory for an ANN accelerator, in accordance with an embodiment of the present disclosure.

As described above, bank 510 and 511 of the memory may include four column multiplexers 440 and 441 (respectively) associated with read operations, and four column multiplexers 450 and 451 (respectively) associated with write operations. Multiplexer mapping diagram 604 illustrates the mapping between the "read" ColMuxSelect signal values (i.e., 0, 1, 2 and 3) and the bytes 330 of each word 320, as well as the mapping between the "write" ColMuxSelect signal values (i.e., 0, 1, 2 and 3) and the bytes 330 of each word 320.

A "read" ColMuxSelect signal value of 0 selects input port 0 of each column multiplexer 440, 441, and, as illustrated in FIG. 6E, each input port 0 of each column multiplexer 440, 441 is coupled 442 to byte 0 of word 0, 1, 2 or 3. A "read" ColMuxSelect signal value of 1 selects input port 1 of each column multiplexer 440, 441, and each input port 1 of each column multiplexer 440, 441 is coupled 442 to byte 1 of word 0, 1, 2 or 3. A "read" ColMuxSelect signal value of 2 selects input port 2 of each column multiplexer 440, 441, and each input port 2 of each column multiplexer 440, 441 is coupled 442 to byte 2 of word 0, 1, 2 or 3. And, a "read" ColMuxSelect signal value of 3 selects input port 3 of each column multiplexer 440, 441, and each input port 3 of each column multiplexer 440, 441 is coupled 442 to byte 3 of word 0, 1, 2 or 3.

A "write" ColMuxSelect signal value of 0 selects input port 0 of column multiplexers 440, 441. Input port 0 of the first column multiplexer 440, 441 (i.e., ColMux 0) is coupled 442 to byte 0 of word 0, input port 0 of the second column multiplexer 440, 441 (i.e., ColMux 1) is coupled 442 to byte 1 of word 1, input port 0 of the third column multiplexer 440, 441 (i.e., ColMux 2) is coupled 442 to byte 2 of word 2, and input port 0 of the fourth column multiplexer 440, 441 (i.e., ColMux 3) is coupled 442 to byte 3 of word 3.

A "write" ColMuxSelect signal value of 1 selects input port 1 of each column multiplexer 440, 441. Input port 1 of the first column multiplexer 440, 441 (i.e., ColMux 0) is coupled 442 to byte 1 of word 0, input port 1 of the second column multiplexer 440, 441 (i.e., ColMux 1) is coupled 442 to byte 2 of word 1, input port 1 of the third column multiplexer 440, 441 (i.e., ColMux 2) is coupled 442 to byte 3 of word 2, and input port 1 of the fourth column multiplexer 440, 441 (i.e., ColMux 3) is coupled 442 to byte 0 of word 3.

A "write" ColMuxSelect signal value of 2 selects input port 2 of each column multiplexer 440, 441. Input port 2 of the first column multiplexer 440, 441 (i.e., ColMux 0) is coupled 442 to byte 2 of word 0, input port 2 of the second column multiplexer 440, 441 (i.e., ColMux 1) is coupled 442 to byte 3 of word 1, input port 2 of the third column multiplexer 440, 441 (i.e., ColMux 2) is coupled 442 to byte 0 of word 2, and input port 2 of the fourth column multiplexer 440, 441 (i.e., ColMux 3) is coupled 442 to byte 1 of word 3.

A "write" ColMuxSelect signal value of 3 selects input port 3 of each column multiplexer 440, 441. Input port 3 of the first column multiplexer 440, 441 (i.e., ColMux 0) is coupled 442 to byte 3 of word 0, input port 3 of the second column multiplexer 440, 441 (i.e., ColMux 1) is coupled 442 to byte 0 of word 1, input port 3 of the third column multiplexer 440, 441 (i.e., ColMux 2) is coupled 442 to byte 1 of word 2, and input port 3 of the fourth column multiplexer 440, 441 (i.e., ColMux 3) is coupled 442 to byte 2 of word 3.

In many situations, the power associated with skewing the data to be written (as described in this embodiment) may be significantly lower than the power associated with skewing the data to be read (in the embodiments described above) because write operations may be less frequent than read operations. Additionally, while saving extra power in skewed read operations may require additional circuitry to disable the sense amplifiers (as described above), saving extra power in skewed write operations, by blocking unwanted write operations (i.e., writing elements $x_1$, $x_2$, $x_3$, $y_2$, $y_3$, $z_3$), may be straightforward using the bit-mask pin (e.g., the "MASK" or "WEN" pin). And, the power savings due to blocked write operations may save about 50%.

In other embodiments, backward compatibility for "unskewed" read and write operations may be provided by adding a bank of delay registers or flip flop blocks after the output of the read-skewing memory or before the input of the write-skewing memory to "un-skew" the data. While the area savings may be lost, power is still saved during read-skewing or write-skewing operations because the delay registers or flip flop blocks are not activated. For example, a bypass path may be activated in "skewing mode" to bypass the delay registers or flip flop blocks, and deactivated in "backward compatibility mode" to ensure that the data flows through the delay registers or flip flop blocks.

Figure 7:
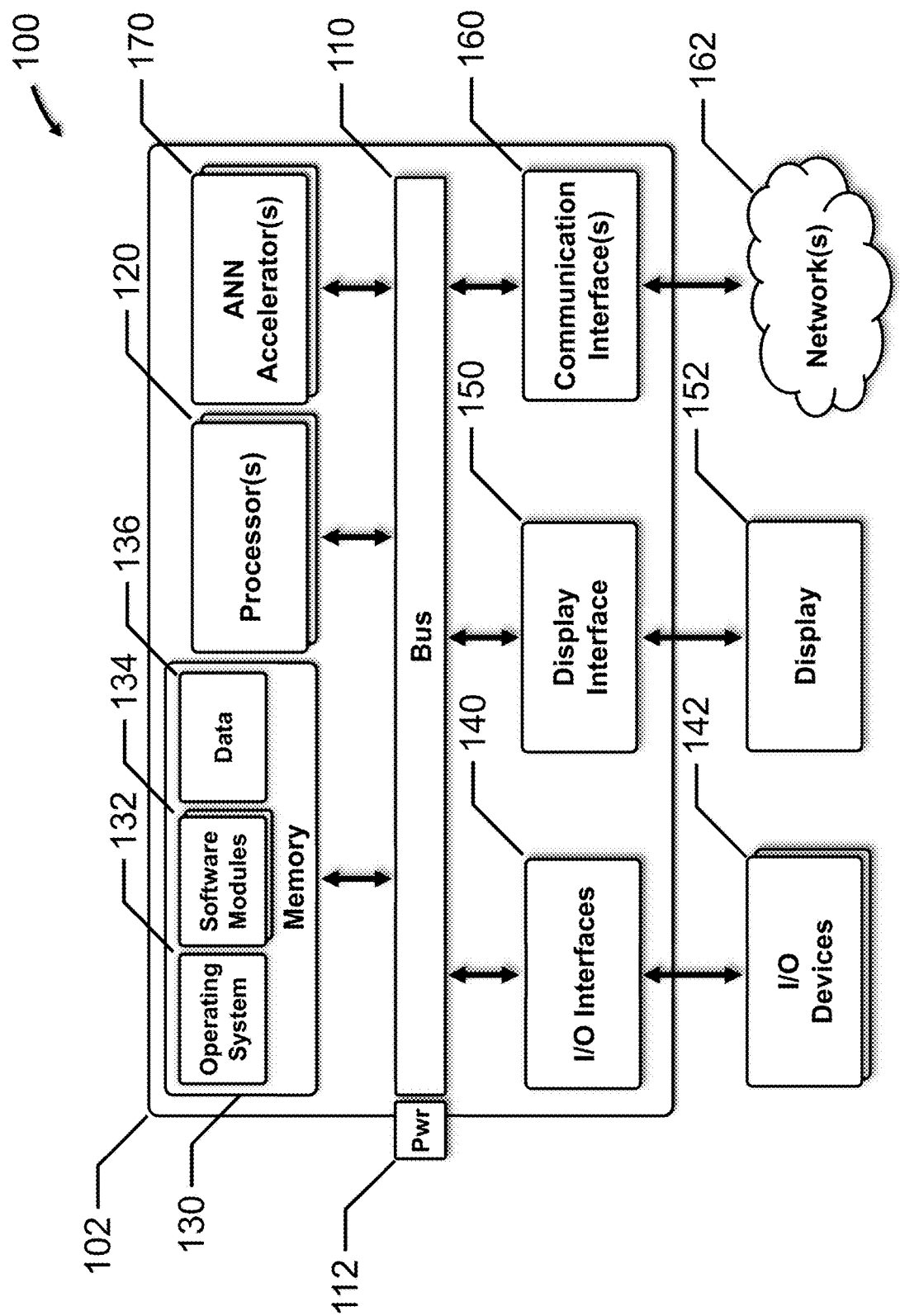
FIG. 7 depicts a block diagram of a system, in accordance with an embodiment of the present disclosure.

FIG. 7 depicts a block diagram of system 100, in accordance with an embodiment of the present disclosure.

Computer 102 includes communication bus 110 coupled to one or more processors 120, memory 130, I/O interfaces 140, display interface 150, one or more communication interfaces 160 and one or more ANN accelerators 170. Generally, I/O interfaces 140 are coupled to I/O devices 142 using a wired or wireless connection, display interface 150 is coupled to display 152, and communication interface 160 is connected to network 162 using a wired or wireless connection.

Communication bus 110 is a communication system that transfers data between processor 120, memory 130, I/O interfaces 140, display interface 150, communication interface 160, ANN accelerator 170, as well as other components not depicted. Power connector 112 is coupled to communication bus 110 and a power supply (not shown).

Processor 120 includes one or more general-purpose or application-specific microprocessors that executes instructions to perform control, computation, input/output, etc. functions for computer 102. Processor 120 may include a single integrated circuit, such as a micro-processing device, or multiple integrated circuit devices and/or circuit boards working in cooperation to accomplish the functions of processor 120. In addition, processor 120 may execute computer programs or modules, such as operating system 132, software modules 134, etc., stored within memory 130. For example, software modules 134 may include an ML application, an ANN application, a CNN application, etc.

Generally, storage element or memory 130 stores instructions for execution by processor 120 and data. Memory 130 may include a variety of non-transitory computer-readable medium that may be accessed by processor 120. In various embodiments, memory 130 may include volatile and non-volatile medium, non-removable medium and/or removable medium. For example, memory 130 may include any combination of random access memory (RAM), dynamic RAM (DRAM), static RAM (SRAM), read only memory (ROM), flash memory, cache memory, and/or any other type of non-transitory computer-readable medium.

Memory 130 contains various components for retrieving, presenting, modifying, and storing data. For example, memory 130 stores software modules that provide functionality when executed by processor 120. The software modules include operating system 132 that provides operating system functionality for computer 102. Software modules 134 provide various functionality, such as image classification using convolutional neural networks, etc. Data 136 may include data associated with operating system 132, software modules 134, etc.

I/O interfaces 140 are configured to transmit and/or receive data from I/O devices 142. I/O interfaces 140 enable connectivity between processor 120 and I/O devices 142 by encoding data to be sent from processor 120 to I/O devices 142, and decoding data received from I/O devices 142 for processor 120. Generally, data may be sent over wired and/or wireless connections. For example, I/O interfaces 140 may include one or more wired communications interfaces, such as USB, Ethernet, etc., and/or one or more wireless communications interfaces, coupled to one or more antennas, such as WiFi, Bluetooth, cellular, etc.

Generally, I/O devices 142 provide input to computer 102 and/or output from computer 102. As discussed above, I/O devices 142 are operably connected to computer 102 using a wired and/or wireless connection. I/O devices 142 may include a local processor coupled to a communication interface that is configured to communicate with computer 102 using the wired and/or wireless connection. For example, I/O devices 142 may include a keyboard, mouse, touch pad, joystick, etc.

Display interface 150 is configured to transmit image data from computer 102 to monitor or display 152.

Communication interface 160 is configured to transmit data to and from network 162 using one or more wired and/or wireless connections. Network 162 may include one or more local area networks, wide area networks, the Internet, etc., which may execute various network protocols, such as, for example, wired and/or wireless Ethernet, Bluetooth, etc. Network 162 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

Figure 8:
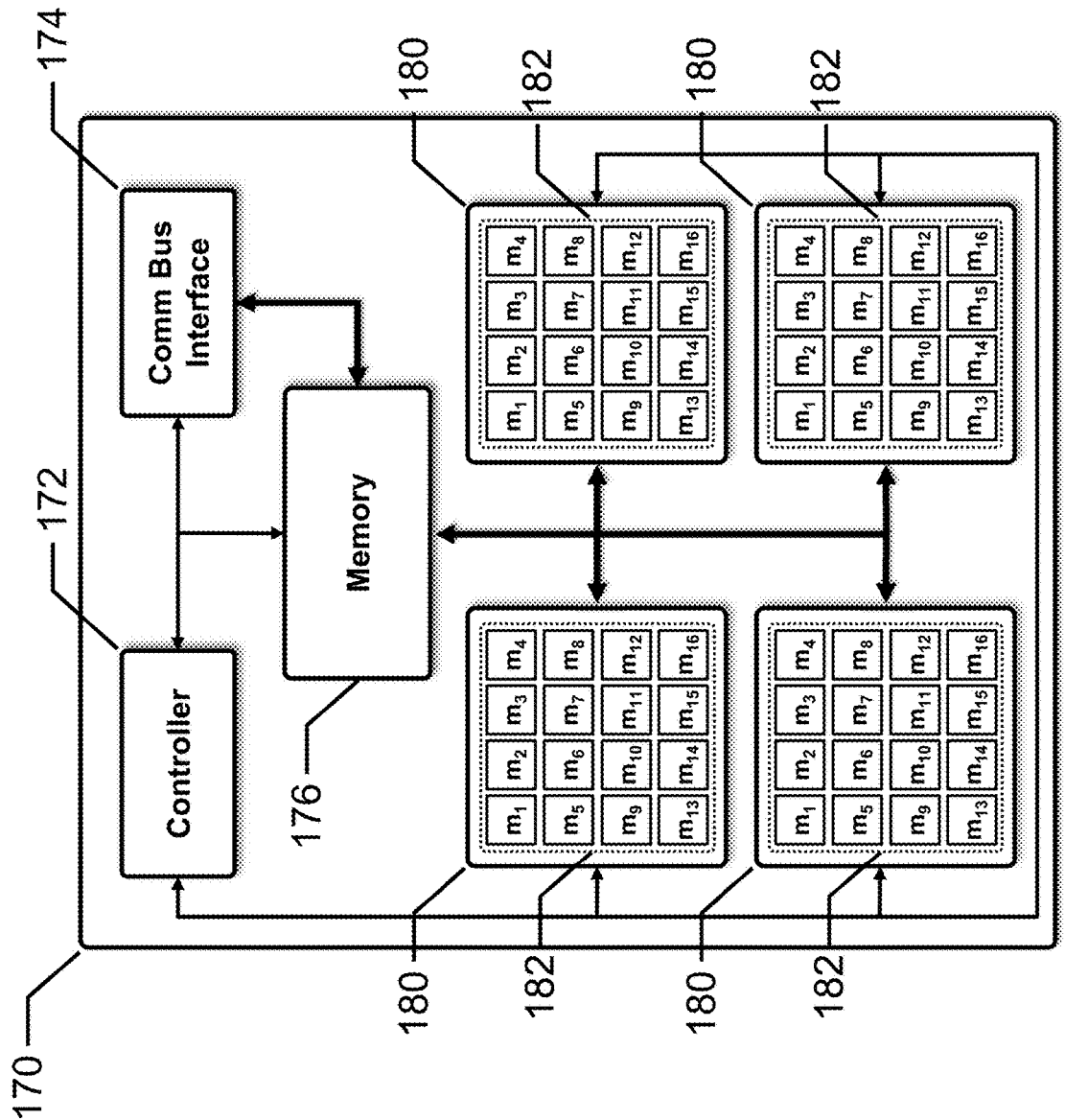
FIG. 8 depicts a block diagram of an ANN accelerator, in accordance with an embodiment of the present disclosure.

FIG. 8 depicts an ANN accelerator 170, in accordance with an embodiment of the present disclosure.

ANN accelerator 170 is configured to execute machine learning models, such as, for example, ANNs, CNNs, RNNs, etc., in support of various applications embodied by software modules 134. Generally, ANN accelerator 170 may include one or more processors, coprocessors, processing engines (PEs), compute engines (CEs), etc., such as, for example, CPUs, MCUs, GPUs, NPUs, such as, for example, the ARM Machine Learning (ML) Processor, DSPs, field programmable gate arrays (FPGAs), application specific integrated circuits (ASICs), controllers, microcontrollers, matrix multiplier circuits, MAC arrays, etc. Generally, ANN accelerator 170 receives input data from memory 130 over communication bus 110, and transmits output data to memory 130 over communication bus 110.

ANN accelerator 170 also includes controller 172, communications bus interface 174, and one or more non-volatile and/or volatile memories 176, such as, for example, ROM, flash memory, SRAM, DRAM, etc. Controller 172 is coupled to communication bus interface 174, memory 176 and one or more compute engines (CEs) 180, and generally controls the functionality, data flow, etc., of ANN accelerator 170. Memory 176 is coupled to communication bus interface 174 and CEs 180, and stores, inter alia, ANN weights and activations. Each CE 180 includes one or more MAC arrays 182, and each MAC array 182 includes a number of MAC units, such as, for example, 4 MAC units, 8 MAC units, 16 MAC units ($m_1$ to $m_{16}$, as depicted in FIG. 8), 32 MAC units, etc.

Embodiments of the present disclosure advantageously eliminate the delay registers or flip flop blocks by changing the way data is read from, or written to, the memory without adding complexity and area to SRAM memories.

The embodiments described herein are combinable.

In one embodiment, a memory for an ANN accelerator includes a first bank, a second bank and a bank selector. The first bank includes at least two word lines and a plurality of write word selectors, each word line stores a plurality of words, each word has a plurality of bytes, each write word selector has an input port and a plurality of output ports, each write word selector is coupled to a corresponding word in each word line, and each write word selector is configured to select a byte of the corresponding word of a selected word line based on a byte select signal. The second bank includes at least two word lines and a plurality of write word selectors, each word line stores a plurality of words, each word has a plurality of bytes, each write word selector has an input port and a plurality of output ports, each write word selector is coupled to a corresponding word in each word line, and each write word selector is configured to select a byte of the corresponding word of a selected word line based on the byte select signal. The bank selector is coupled to the inputs of the write word selectors of the first bank and the inputs of the write word selectors of the second bank, and is configured to select a combination of write word selectors from at least one of the first bank and the second bank based on a bank select signal.

In another embodiment of the memory, the first bank is configured to select a word line based on a first word line select signal, and the second bank is configured to select a word line based on a second word line select signal.

In another embodiment of the memory, the write word selectors are column multiplexers and the byte select signal is a column multiplexer select signal; and the bank selector is a bank multiplexer and the bank select signal is a bank multiplexer select signal.

In another embodiment of the memory, each column multiplexer output port is coupled to a different byte of the corresponding word; and the bank multiplexer includes a plurality of write multiplexers, each write multiplexer includes an input port, a first output port and a second output port, the first output port is coupled to an input port of a column multiplexer in the first bank, and the second output port is coupled to an input port of a corresponding column multiplexer in the second bank.

In another embodiment of the memory, for the first bank, the output ports of each column multiplexer are coupled to a unique sequence of bytes of the corresponding word; and for the second bank, the output ports of each column multiplexer are coupled to the unique sequence of bytes of the corresponding column multiplexer in the first bank.

In another embodiment of the memory, for the first bank, a first output port of a first column multiplexer is coupled to a first byte of the corresponding word, and the first output ports of the remaining column multiplexers are not coupled to a first byte of the corresponding words; and for the second bank, a first output port of a first column multiplexer is coupled to a first byte of the corresponding word, and the first output ports of the remaining column multiplexers are not coupled to a first byte of the corresponding words.

In another embodiment of the memory, each word includes four bytes, and each byte includes eight bits; the first bank includes four column multiplexers, the second bank includes four column multiplexers, and each column multiplexer includes one 8-bit input port and four 8-bit output ports; and the bank multiplexer includes four write multiplexers, and each write multiplexer includes one 8-bit input port and two 8-bit output ports.

In another embodiment of the memory, the column multiplexer select signal has four values; and the bank multiplexer select signal has four bits.

In another embodiment of the memory, the bank selector is further configured to receive a word including a sequence of bytes at the bank selector; and write the sequence of bytes by the combination of write word selectors.

In another embodiment of the memory, the word is received from a systolic MAC array.

In one embodiment, a method for writing to a memory of an ANN accelerator is provided. In response to receiving a first word line select signal at a first bank, a word line is selected based on the first word line select signal, the first bank having at least two word lines and a plurality of write word selectors, each word line storing a plurality of words, each word having a plurality of bytes, each write word selector having an input port and a plurality of output ports, and each write word selector coupled to a corresponding word in each word line. In response to receiving a second word line select signal at a second bank, a word line is selected based on the second word line select signal, the second bank having at least two word lines and a plurality of write word selectors, each word line storing a plurality of words, each word having a plurality of bytes, each write word selector having an input port and a plurality of output ports, and each write word selector coupled to a corresponding word in each word line. In response to receiving a byte select signal at each write word selector, a byte of the corresponding word of a selected word line is selected based on the byte select signal. In response to receiving a bank select signal at a bank selector coupled to the first bank and the second bank, a combination of write word selectors from at least one of the first bank and the second bank is selected based on the bank select signal. An input word including a sequence of bytes is received at the bank selector, and the sequence of bytes is written by the combination of write word selectors.

In another embodiment of the method, the input word is received from a systolic MAC array.

In another embodiment of the method, the first bank is configured to select a word line based on a first word line select signal, and the second bank is configured to select a word line based on a second word line select signal.

In another embodiment of the method, the write word selectors are column multiplexers and the byte select signal is a column multiplexer select signal; and the bank selector is a bank multiplexer and the bank select signal is a bank multiplexer select signal.

In another embodiment of the method, each column multiplexer output port is coupled to a different byte of the corresponding word; and the bank multiplexer includes a plurality of write multiplexers, each write multiplexer includes an input port, a first output port and a second output port, the first output port is coupled to an input port of a column multiplexer in the first bank, and the second output port is coupled to an input port of a corresponding column multiplexer in the second bank.

In another embodiment of the method, for the first bank, the output ports of each column multiplexer are coupled to a unique sequence of bytes of the corresponding word; and for the second bank, the output ports of each column multiplexer are coupled to the unique sequence of bytes of the corresponding column multiplexer in the first bank.

In another embodiment of the method, for the first bank, a first output port of a first column multiplexer is coupled to a first byte of the corresponding word, and the first output ports of the remaining column multiplexers are not coupled to a first byte of the corresponding words; and for the second bank, a first output port of a first column multiplexer is coupled to a first byte of the corresponding word, and the first output ports of the remaining column multiplexers are not coupled to a first byte of the corresponding words.

In another embodiment of the method, each word includes four bytes, and each byte includes eight bits; the first bank includes four column multiplexers, the second bank includes four column multiplexers, and each column multiplexer includes one 8-bit input port and four 8-bit output ports; and the bank multiplexer includes four write multiplexers, and each write multiplexer includes one 8-bit input port and two 8-bit output ports.

In another embodiment of the method, the column multiplexer select signal has four values; and the bank multiplexer select signal has four bits.

In another embodiment of the method, a first output port of a second column multiplexer is coupled to a second byte of the corresponding word; a first input port of a third column multiplexer is coupled to a third byte of the corresponding word; and a first input port of a fourth column multiplexer is coupled to a fourth byte of the corresponding word.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A memory for an artificial neural network (ANN) accelerator, comprising:
    a first bank including at least two word lines and a plurality of write word selectors, each word line storing a plurality of words, each word having a plurality of bytes, each write word selector having an input port and a plurality of output ports, each write word selector coupled to a corresponding word in each word line, and each write word selector configured to select a byte of the corresponding word of a selected word line based on a byte select signal;
    a second bank including at least two word lines and a plurality of write word selectors, each word line storing a plurality of words, each word having a plurality of bytes, each write word selector having an input port and a plurality of output ports, each write word selector coupled to a corresponding word in each word line, and each write word selector configured to select a byte of the corresponding word of a selected word line based on the byte select signal; and
    a bank selector, coupled to the inputs of the write word selectors of the first bank and the inputs of the write word selectors of the second bank, configured to select a combination of write word selectors from at least one of the first bank and the second bank based on a bank select signal,
    where:
        the write word selectors are column multiplexers and the byte select signal is a column multiplexer select signal; and
        the bank selector is a bank multiplexer and the bank select signal is a bank multiplexer select signal.

2. The memory of claim 1, where the first bank is configured to select a word line based on a first word line select signal, and the second bank is configured to select a word line based on a second word line select signal.

3. The memory of claim 1, where:
    each column multiplexer output port is coupled to a different byte of the corresponding word; and
    the bank multiplexer includes a plurality of write multiplexers, each write multiplexer includes an input port, a first output port and a second output port, the first output port is coupled to an input port of a column multiplexer in the first bank, and the second output port is coupled to an input port of a corresponding column multiplexer in the second bank.

4. The memory of claim 3, where:
    for the first bank, the output ports of each column multiplexer are coupled to a unique sequence of bytes of the corresponding word; and for the second bank, the output ports of each column multiplexer are coupled to the unique sequence of bytes of the corresponding column multiplexer in the first bank.

5. The memory of claim 4, where:
for the first bank, a first output port of a first column multiplexer is coupled to a first byte of the corresponding word, and the first output ports of the remaining column multiplexers are not coupled to a first byte of the corresponding words; and
for the second bank, a first output port of a first column multiplexer is coupled to a first byte of the corresponding word, and the first output ports of the remaining column multiplexers are not coupled to a first byte of the corresponding words.

6. The memory of claim 3, where:
each word includes four bytes, and each byte includes eight bits;
the first bank includes four column multiplexers, the second bank includes four column multiplexers, and each column multiplexer includes one 8-bit input port and four 8-bit output ports; and
the bank multiplexer includes four write multiplexers, and each write multiplexer includes one 8-bit input port and two 8-bit output ports.

7. The memory of claim 6, where:
the column multiplexer select signal has four values; and
the bank multiplexer select signal has four bits.

8. A memory for an artificial neural network (ANN) accelerator, comprising:
a first bank including at least two word lines and a plurality of write word selectors, each word line storing a plurality of words, each word having a plurality of bytes, each write word selector having an input port and a plurality of output ports, each write word selector coupled to a corresponding word in each word line, and each write word selector configured to select a byte of the corresponding word of a selected word line based on a byte select signal;
a second bank including at least two word lines and a plurality of write word selectors, each word line storing a plurality of words, each word having a plurality of bytes, each write word selector having an input port and a plurality of output ports, each write word selector coupled to a corresponding word in each word line, and each write word selector configured to select a byte of the corresponding word of a selected word line based on the byte select signal; and
a bank selector, coupled to the inputs of the write word selectors of the first bank and the inputs of the write word selectors of the second bank, configured to select a combination of write word selectors from at least one of the first bank and the second bank based on a bank select signal, where the bank selector is further configured to:
receive a word including a sequence of bytes at the bank selector; and
write the sequence of bytes by the combination of write word selectors.

9. The memory of claim 8, where the word is received from a systolic multiply-and-accumulate (MAC) array.

10. A method for writing to a memory of an artificial neural network (ANN) accelerator, comprising:
in response to receiving a first word line select signal at a first bank, selecting a word line based on the first word line select signal, the first bank having at least two word lines and a plurality of write word selectors, each word line storing a plurality of words, each word having a plurality of bytes, each write word selector having an input port and a plurality of output ports, and each write word selector coupled to a corresponding word in each word line;
in response to receiving a second word line select signal at a second bank, selecting a word line based on the second word line select signal, the second bank having at least two word lines and a plurality of write word selectors, each word line storing a plurality of words, each word having a plurality of bytes, each write word selector having an input port and a plurality of output ports, and each write word selector coupled to a corresponding word in each word line;
in response to receiving a byte select signal at each write word selector, selecting a byte of the corresponding word of a selected word line based on the byte select signal;
in response to receiving a bank select signal at a bank selector coupled to the first bank and the second bank, selecting a combination of write word selectors from at least one of the first bank and the second bank based on the bank select signal;
receiving an input word including a sequence of bytes at the bank selector; and
writing the sequence of bytes by the combination of write word selectors.

11. The method of claim 10, where the input word is received from a systolic multiply-and-accumulate (MAC) array.

12. The method of claim 10, where the first bank is configured to select a word line based on a first word line select signal, and the second bank is configured to select a word line based on a second word line select signal.

13. The method of claim 12, where:
the write word selectors are column multiplexers and the byte select signal is a column multiplexer select signal; and
the bank selector is a bank multiplexer and the bank select signal is a bank multiplexer select signal.

14. The method of claim 13, where:
each column multiplexer output port is coupled to a different byte of the corresponding word; and
the bank multiplexer includes a plurality of write multiplexers, each write multiplexer includes an input port, a first output port and a second output port, the first output port is coupled to an input port of a column multiplexer in the first bank, and the second output port is coupled to an input port of a corresponding column multiplexer in the second bank.

15. The method of claim 14, where:
for the first bank, the output ports of each column multiplexer are coupled to a unique sequence of bytes of the corresponding word; and
for the second bank, the output ports of each column multiplexer are coupled to the unique sequence of bytes of the corresponding column multiplexer in the first bank.

16. The method of claim 15, where:
for the first bank, a first output port of a first column multiplexer is coupled to a first byte of the corresponding word, and the first output ports of the remaining column multiplexers are not coupled to a first byte of the corresponding words; and
for the second bank, a first output port of a first column multiplexer is coupled to a first byte of the corresponding word, and the first output ports of the remaining column multiplexers are not coupled to a first byte of the corresponding words.

17. The method of claim 16, where:

each word includes four bytes, and each byte includes eight bits;

the first bank includes four column multiplexers, the second bank includes four column multiplexers, and each column multiplexer includes one 8-bit input port and four 8-bit output ports; and the bank multiplexer includes four write multiplexers, and each write multiplexer includes one 8-bit input port and two 8-bit output ports.

18. The method of claim 17, where:

the column multiplexer select signal has four values; and
the bank multiplexer select signal has four bits.

19. The method of claim 17, where:

a first output port of a second column multiplexer is coupled to a second byte of the corresponding word;

a first input port of a third column multiplexer is coupled to a third byte of the corresponding word; and a first input port of a fourth column multiplexer is coupled to a fourth byte of the corresponding word.

\* \* \* \* \*